United States Patent
Arai

(10) Patent No.: US 9,929,169 B2
(45) Date of Patent: Mar. 27, 2018

(54) SEMICONDUCTOR DEVICE AND METHOD FOR MANUFACTURING THE SAME

(71) Applicant: Toshiba Memory Corporation, Minato-ku (JP)

(72) Inventor: Shinya Arai, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/008,554

(22) Filed: Jan. 28, 2016

(65) Prior Publication Data

US 2017/0069652 A1    Mar. 9, 2017

Related U.S. Application Data

(60) Provisional application No. 62/216,110, filed on Sep. 9, 2015.

(51) Int. Cl.
| | | |
|---|---|---|
| *H01L 27/115* | (2017.01) | |
| *H01L 27/11582* | (2017.01) | |
| *H01L 27/1158* | (2017.01) | |
| *H01L 29/788* | (2006.01) | |

(52) U.S. Cl.
CPC ..... *H01L 27/11582* (2013.01); *H01L 27/1158* (2013.01); *H01L 29/788* (2013.01)

(58) Field of Classification Search
CPC .......... H01L 27/11582; H01L 27/1158; H01L 27/11568; H01L 29/788
See application file for complete search history.

(56) References Cited

U.S. PATENT DOCUMENTS

| | | | |
|---|---|---|---|
| 7,847,334 B2 | 12/2010 | Katsumata et al. | |
| 8,581,330 B2 | 11/2013 | Kiyotoshi | |
| 8,779,499 B2 | 7/2014 | Kiyotoshi | |
| 9,691,785 B2 * | 6/2017 | Lee | H01L 27/11582 |
| 2011/0057249 A1 * | 3/2011 | Nakao | H01L 27/11578 257/324 |
| 2011/0291177 A1 * | 12/2011 | Lee | H01L 21/28282 257/324 |
| 2012/0205722 A1 * | 8/2012 | Lee | H01L 27/1157 257/211 |
| 2013/0107629 A1 * | 5/2013 | Shim | G11C 16/30 365/185.17 |
| 2013/0198440 A1 * | 8/2013 | Oh | G11C 11/5628 711/103 |
| 2014/0126290 A1 * | 5/2014 | Sakui | H01L 29/7889 365/185.05 |
| 2014/0131785 A1 | 5/2014 | Seo et al. | |
| 2016/0155750 A1 * | 6/2016 | Yasuda | H01L 27/11582 257/324 |

* cited by examiner

*Primary Examiner* — Nathan W Ha
(74) *Attorney, Agent, or Firm* — Oblon, McClelland, Maier & Neustadt, L.L.P.

(57) ABSTRACT

According to one embodiment, the stacked body includes a plurality of electrode films stacked with an insulating body. The insulating body includes a first insulating film provided between the electrode films in a region surrounding the columnar portions. A gap is provided between the electrode films in a region on a lateral side in the first direction of the interconnect portion.

17 Claims, 45 Drawing Sheets

SEMICONDUCTOR DEVICE AND METHOD FOR MANUFACTURING THE SAME

CROSS-REFERENCE TO RELATED APPLICATION

This application is based upon and claims the benefit of priority from U.S. Provisional Patent Application 62/216,110, filed on Sep. 9, 2015; the entire contents of which are incorporated herein by reference.

FIELD

Embodiments described herein relate generally to a semiconductor device and a method for manufacturing the same.

BACKGROUND

In a three-dimensional memory device having a plurality of electrode films stacked on a substrate, a structure in which a gap is provided between electrode films vertically adjacent to each other has been proposed. In such a structure, the mechanical strength may decrease.

DETAILED DESCRIPTION

Figure 1:
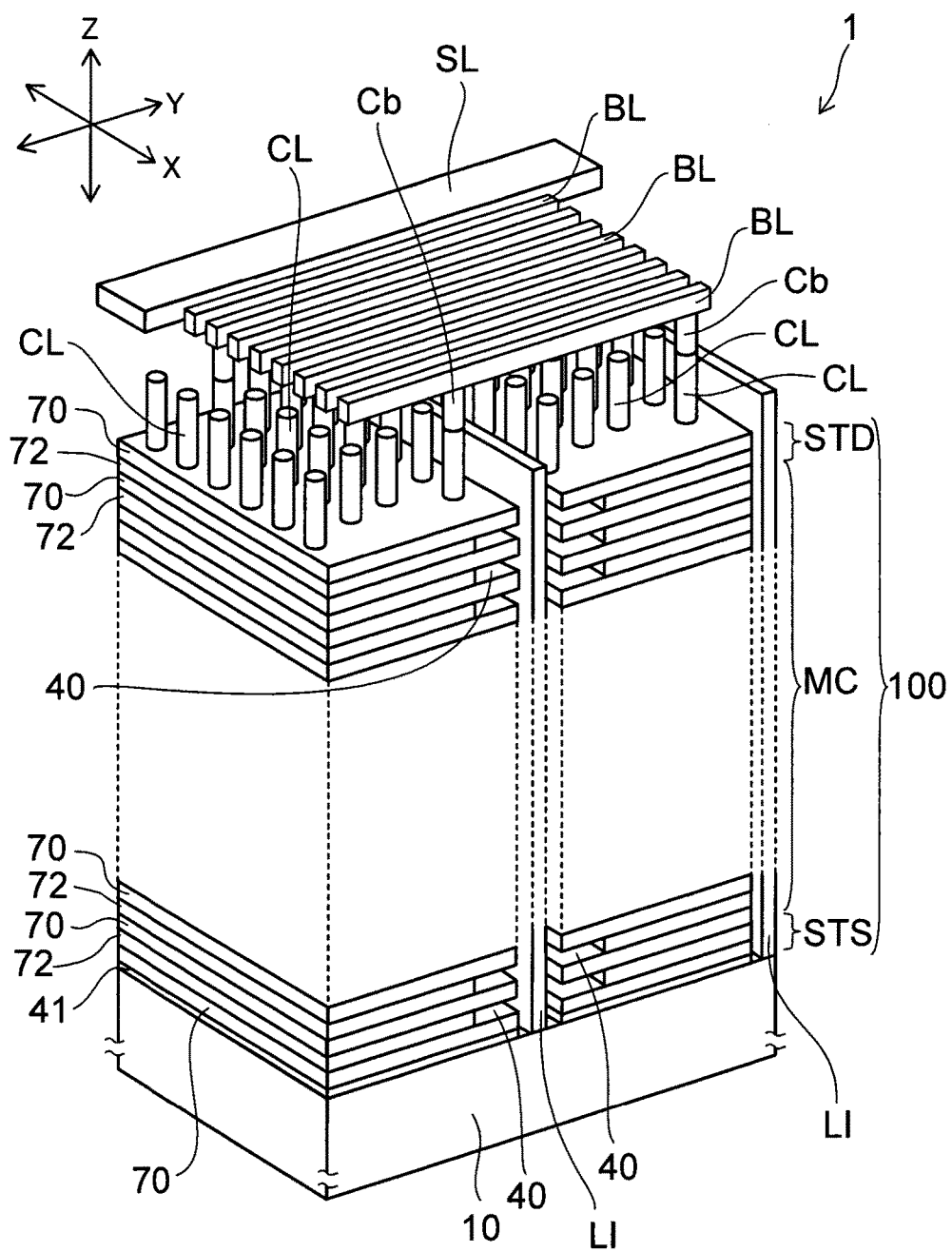
FIG. 1 is a schematic perspective view of a memory cell array of a semiconductor device of an embodiment.

According to one embodiment, a semiconductor device including a substrate, a stacked body, a plurality of interconnect portions, and a plurality of columnar portions. The stacked body is provided on the substrate. The stacked body includes a plurality of electrode films stacked with an insulating body interposed between the electrode films. The plurality of interconnect portions extend in a stacking direction of the stacked body. The plurality of interconnect portions divide the stacked body in a first direction crossing the stacking direction. The plurality of interconnect portions are separated from each other in the first direction. The plurality of columnar portions include a semiconductor film extending in the stacking direction in the stacked body, and a charge storage film provided between the semiconductor film and the electrode film. The plurality of columnar portions are disposed between the plurality of interconnect portions. The insulating body includes a first insulating film provided between the electrode films in a region surrounding the columnar portions. A gap is provided between the electrode films in a region on a lateral side in the first direction of the interconnect portion.

Embodiments will now be described with reference to the drawings. The same components are marked with the same reference numerals in the drawings.

In the embodiment, for example, a semiconductor memory device including a memory cell array having a three-dimensional structure will be described as a semiconductor device.

FIG. 1 is a schematic perspective view of a memory cell array 1 of a semiconductor device of an embodiment.

In FIG. 1, two directions parallel to a major surface of the substrate 10 and orthogonal to each other are defined as an X-direction and a Y-direction, and a direction orthogonal to both the X-direction and the Y-direction is defined as a Z-direction (stacking direction).

As shown in FIG. 1, the memory cell array 1 includes the substrate 10, a stacked body 100 provided on the major surface of the substrate 10, a plurality of columnar portions CL, a plurality of interconnect portions LI, and an upper layer interconnect provided on the stacked body 100. In FIG. 1, for example, bit lines BL and a source layer SL are shown as the upper layer interconnect.

The columnar portion CL is formed in a circular columnar shape or an elliptic columnar shape extending in the stacking direction (the Z-direction) in the stacked body 100.

The interconnect portion LI spreads, between the upper layer interconnect and the substrate 10, in the stacking direction (the Z-direction) of the stacked body 100 and the X-direction, and divides the stacked body 100 in the Y-direction. The plurality of interconnect portions LI is disposed separately from each other in the Y-direction. Between the plurality of interconnect portions LI, the columnar portions CL are disposed.

The plurality of columnar portions CL has, for example, a staggered arrangement. Alternatively, the plurality of columnar portions CL may have a square grid pattern along the X-direction and the Y-direction.

The plurality of bit lines (for example, a metal film) BL is provided on the stacked body 100. The plurality of bit lines BL is separated from each other in the X-direction, and each of the bit lines BL extends in the Y-direction.

An upper end of the columnar portion CL is connected to the bit line BL through a contact portion Cb. A plurality of the columnar portions CL, each of which is selected from each of areas (blocks) separated in the Y-direction by the interconnect portion LI is connected to one common bit line BL.

Figure 2:
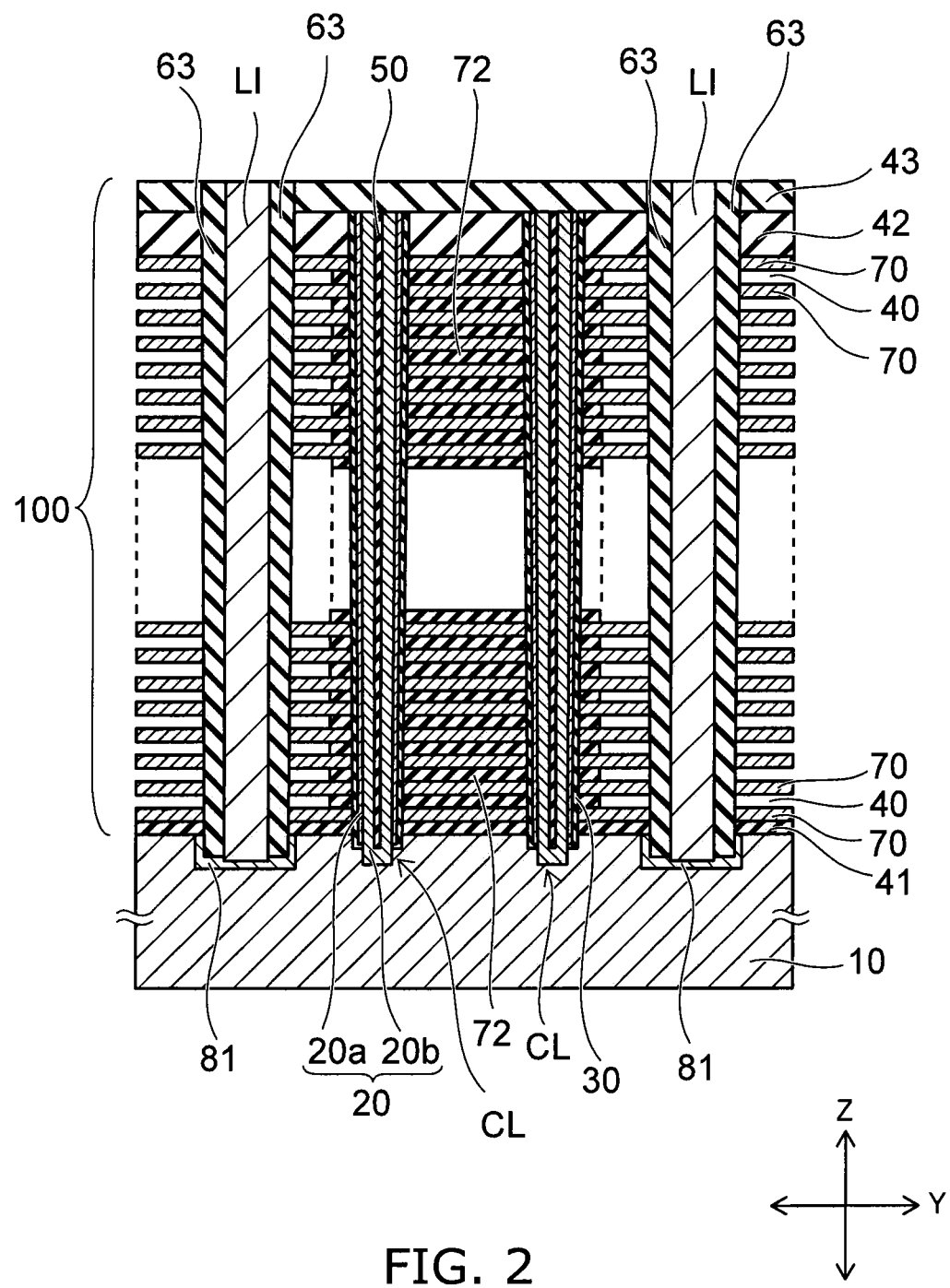
FIG. 2 is a schematic sectional view of the memory cell array of the semiconductor device of the embodiment.

FIG. 2 is a schematic sectional view of the stacked body 100, the columnar portion CL, and the interconnect portion LI. The Y-direction and the Z-direction shown in FIG. 2 correspond to the Y-direction and the Z-direction shown in FIG. 1.

The stacked body 100 includes a plurality of electrode films 70 that is stacked on the major surface of the substrate 10. The plurality of electrode films 70 is stacked in a direction (the Z-direction) vertical to the major surface of the substrate 10 at a predetermined period with insulating bodies including gaps 40 and insulating films 72 interposed between the electrode films 70.

The electrode film 70 is a metal film, and is a tungsten film containing, for example, tungsten as a main component.

An insulating film 41 is provided between the major surface of the substrate 10 and the lowermost electrode film 70. The insulating film 41 is in contact with the major surface (surface) of the substrate 10 and the lowermost electrode film 70.

An insulating film 42 is provided on the uppermost electrode film 70, and an insulating film 43 is provided on the insulating film 42. The uppermost electrode film 70 is in contact with the insulating film 42.

The insulating films 41, 42, and 43 are provided throughout the entire region of the memory cell array.

An insulating film 72 is provided between the electrode films 70 in a region surrounding the columnar portion CL. The insulating film 72 is, for example, a silicon oxide film. The insulating film 72 is provided between the electrode films 70 in a region between the columnar portion CL and the columnar portion CL. The insulating film 72 covers a side surface of the columnar portion CL.

An insulating film 63 is provided on a side surface of the interconnect portion LI, and a gap 40 is made between the electrode films 70 in a region on a lateral side in the Y-direction of the insulating film 63. The gap 40 and the interelectrode insulating film 72 are formed in a region between the insulating film 63 on a side surface of the interconnect portion LI and the columnar portion CL. The insulating film 72 is provided in contact with the side surface of the columnar portion CL, and the gap 40 is made adjacent to the insulating film 72. The gap 40 is made between the insulating film 63 on the side surface of the interconnect portion LI and the interelectrode insulating film 72. The entire region between the insulating film 63 on the side surface of the interconnect portion LI and the interelectrode insulating film 72 may be the gap 40.

Figure 3:
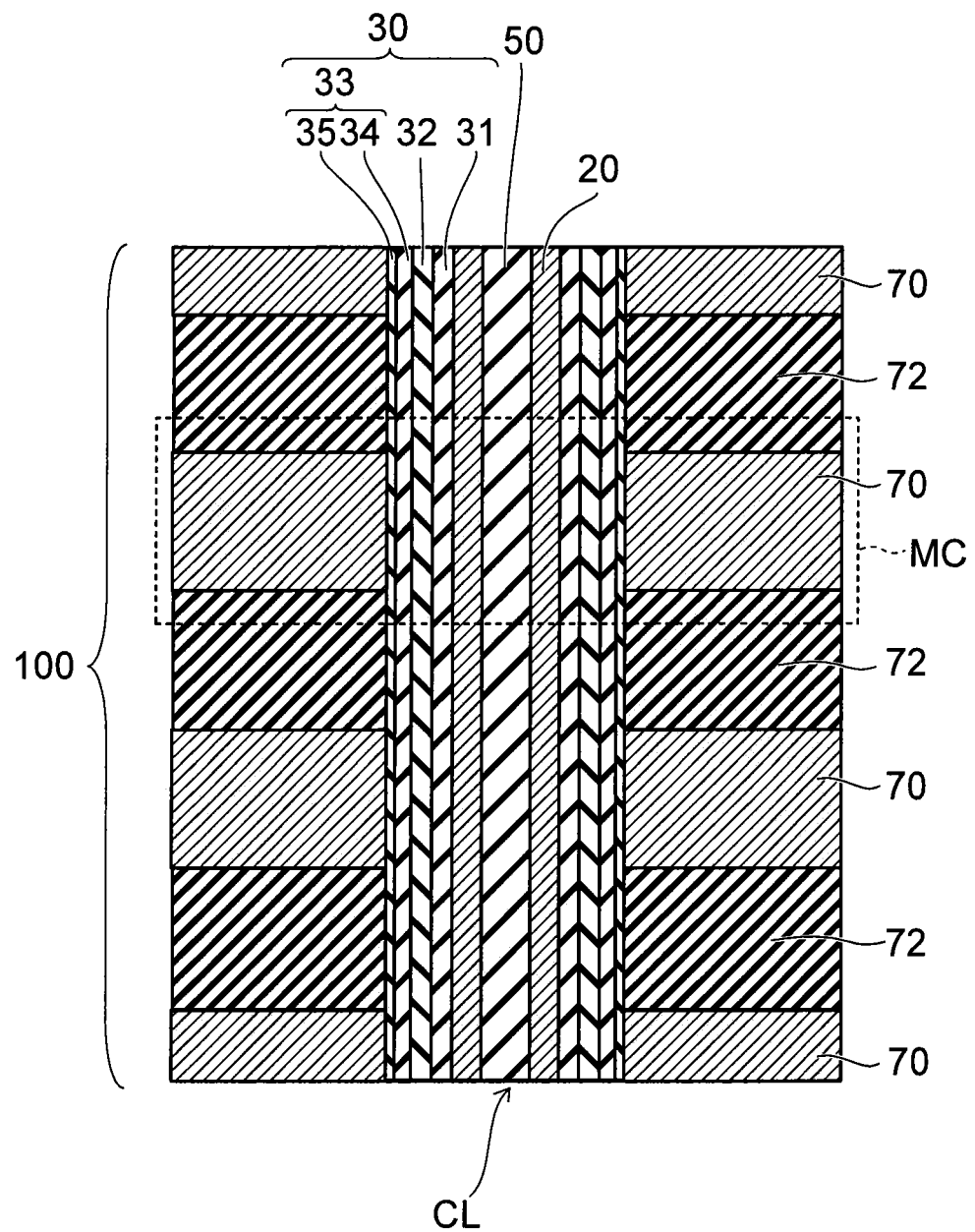
FIG. 3 is an enlarged sectional view of a portion of around a columnar portion shown in FIG. 2

FIG. 3 is an enlarged sectional view of some components shown in FIG. 2.

The columnar portion CL is a stacked film including a memory film 30, a semiconductor film 20, and an insulating core film 50. The semiconductor film 20 extends in a pipe-like configuration in the stacking direction (the Z-direction) in the stacked body 100. The memory film 30 is provided between the electrode films 70 and the semiconductor film 20, and is provided around the semiconductor film 20 from the outer circumferential side. The core film 50 is provided inside the semiconductor film 20 having the pipe-like configuration.

An upper end of the semiconductor film 20 is electrically connected to the bit line BL through the contact portion Cb shown in FIG. 1.

The memory film 30 includes a tunnel insulating film 31, a charge storage film 32, and a block insulating film 33. The block insulating film 33, the charge storage film 32, the tunnel insulating film 31, and the semiconductor film 20 extend to be continuous in the stacking direction of the stacked body 100. The block insulating film 33, the charge storage film 32, and the tunnel insulating film 31 are provided between the electrode films 70 and the semiconductor film 20 in order from the electrode film 70 side.

The tunnel insulating film 31 is in contact with the semiconductor film 20. The block insulating film 33 is in contact with the electrode film 70. The charge storage film 32 is provided between the block insulating film 33 and the tunnel insulating film 31.

Figure 4:
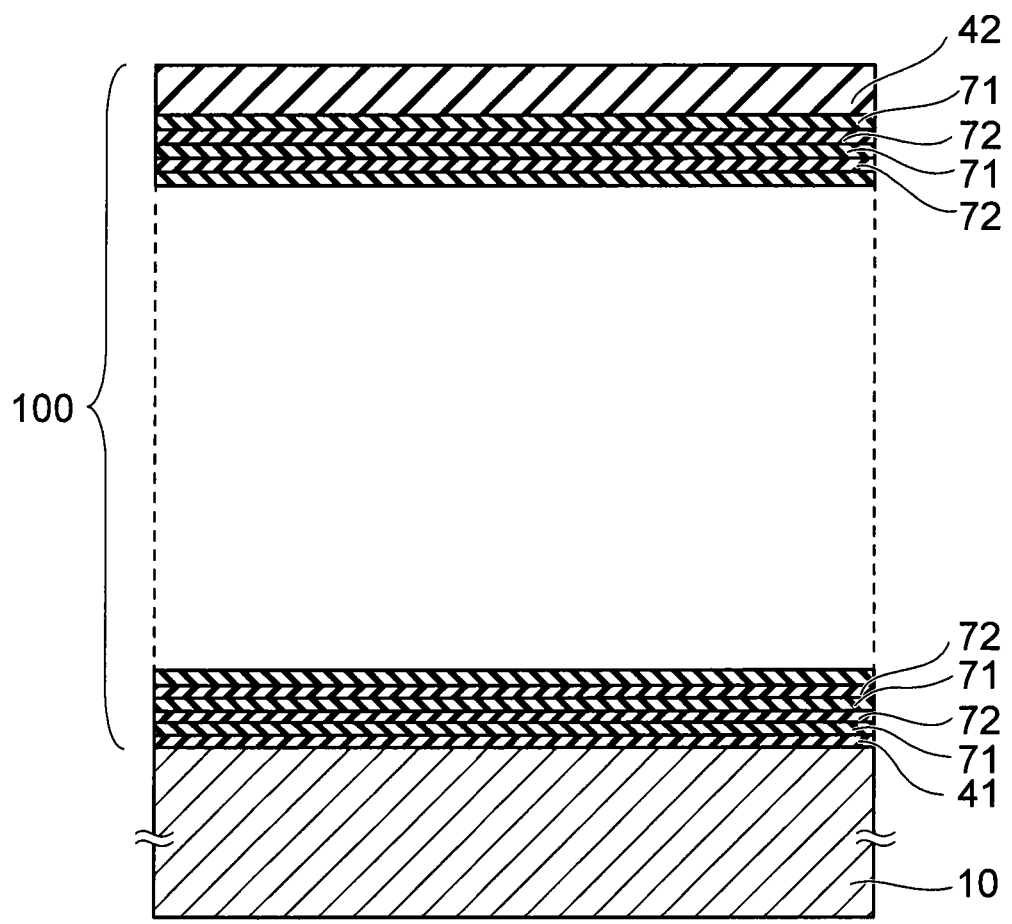
FIGS. 4 to 17 are schematic sectional views showing a method for manufacturing the semiconductor device of the embodiment.

The semiconductor film 20, the memory film 30, and the electrode film 70 are included in a memory cell MC. In FIG. 4, one memory cell MC is illustrated schematically by a broken line. The memory cell MC has a vertical transistor structure in which the electrode film 70 is provided around the semiconductor film 20 with the memory film 30 interposed.

In the memory cell MC having the vertical transistor structure, the semiconductor film 20 functions as a channel, and the electrode film 70 functions as a control gate. The charge storage film 32 functions as a data memory layer that stores electrical charges injected from the semiconductor film 20.

The semiconductor memory device of the embodiment is a non-volatile semiconductor memory device that can freely and electrically erase or write data and retain the memory content even when the power supply is off.

The memory cell MC is, for example, a charge trap type memory cell. The charge storage film 32 has many trap sites that trap electrical charges inside the insulating film, and includes, for example, a silicon nitride film. Alternatively, the charge storage film 32 may be a floating electrode that an insulator is provided around the floating electrode.

The tunnel insulating film 31 serves as a potential barrier when electrical charges are injected from the semiconductor film 20 into the charge storage film 32 or when electrical charges stored in the charge storage film 32 releases into the semiconductor film 20. The tunnel insulating film 31 includes, for example, a silicon oxide film.

The block insulating film 33 prevents the electrical charges stored in the charge storage film 32 from releasing into the electrode film 70. Moreover, the block insulating film 33 suppresses back tunneling of electrons from the electrode film 70 in erasing operation.

The block insulating film 33 includes a first block film 34 and a second block film 35. The first block film 34 is, for example, a silicon oxide film, and in contact with the charge storage film 32. The second block film 35 is provided between the first block film 34 and the electrode film 70, and in contact with the electrode film 70.

The second block film 35 is a film having a dielectric constant higher than a silicon oxide film, and is, for example, a metal oxide film. For example, the second block film 35 is a zirconium oxide film, a hafnium oxide film, or an aluminum oxide film. In the specification, the metal oxide film is a film containing a metal oxide as a main component, and the inclusion of other elements due to, for example, a deposition method or the like into the metal oxide film is not excluded.

As shown in FIG. 1, a drain-side select transistor STD is provided at an upper end portion of the columnar portion CL, and a source-side select transistor STS is provided at a lower end portion. For example, the lowermost electrode film 70 functions as a control gate of the source-side select transistor STS. For example, the uppermost electrode film 70 functions as a control gate of the drain-side select transistor STD.

As shown in FIG. 1, a plurality of the memory cells MC is provided between the drain-side select transistor STD and the source-side select transistor STS. The plurality of memory cells MC, the drain-side select transistor STD, and the source-side select transistor STS are connected in series through the semiconductor film 20 and are included in one memory string. The plurality of memory cells MC is three-dimensionally provided in the X-direction, the Y-direction, and the Z-direction by the memory string having, for example, a staggered arrangement in a surface direction parallel to the X-Y plane.

As shown in FIG. 2, an insulating film 63 is provided on the two side surfaces in the Y-direction of the interconnect portion LI dividing the stacked body 100 in the Y-direction. The insulating film 63 is provided between the stacked body 100 and the interconnect portion LI.

The interconnect portion LI is a metal film containing, for example, tungsten as a main component. An upper end of the interconnect portion LI is connected to the source layer SL, shown in FIG. 2, provided above the stacked body 100. A lower end of the interconnect portion LI is in contact with the substrate 10 as shown in FIG. 3. Moreover, a lower end of the semiconductor film 20 is in contact with the substrate 10. The substrate 10 is, for example, a silicon substrate doped with an impurity. Hence, the lower end of the semiconductor film 20 is electrically connectable to the source layer SL through the substrate 10 and the interconnect portion LI.

As shown in FIG. 2, semiconductor areas 81 are formed in the surface of the substrate 10 that contacts the lower end of the interconnect portion LI. The plurality of semiconductor areas 81 is provided to correspond to the plurality of interconnect portions LI. The plurality of semiconductor areas 81 includes a p-type semiconductor area 81 and an n-type semiconductor area 81. The p-type semiconductor area 81 supplies holes to the semiconductor film 20 through the substrate 10 in erasing operation. In reading operation, electrons are supplied to the semiconductor film 20 from the interconnect portion LI through the n-type semiconductor area 81 and the substrate 10.

By controlling a potential applied to the lowermost electrode film 70 provided on the surface (major surface) of the substrate 10 with the insulating film 41 interposed between the surface of the substrate 10 and the lowermost electrode film 70, a channel is induced at the surface of the substrate 10 between the semiconductor area 81 and the lower end of the semiconductor film 20, and a current can be caused to flow between the semiconductor area 81 and the lower end of the semiconductor film 20.

The lowermost electrode film 70 functions as a control gate for inducing a channel at the surface of the substrate 10, and the insulating film 41 functions as a gate insulating film. Since not a gap but the insulating film 41 having a dielectric constant higher than the air is provided between the surface of the substrate 10 and the lowermost electrode film 70, high-speed driving due to capacitive coupling between the lowermost electrode film 70 and the surface of the substrate 10 is possible.

For example, the insulating film 41 is a metal oxide film, a silicon carbide film (SiC film), or a silicon carbonitride film (SiCN film). The metal oxide film used as the insulating film 41 contains, for example, at least any of tantalum oxide (TaO), zirconium oxide (ZrO), and hafnium oxide (HfO).

On the other hand, by making the gap 40 between control gates (the electrode films 70) of the memory cells adjacent to each other in the stacking direction (the Z-direction), it is possible to suppress interference between the adjacent cells, such as a threshold fluctuation due to capacitive coupling between the electrode films 70 adjacent to each other in the stacking direction.

The gap 40 is made as described below by etching the insulating film 72 formed between the electrode films 70 with an etchant supplied through a slit ST made at a position where the interconnect portion LI is formed. At this time, by leaving the insulating film 72 in a portion of area between the electrode films 70 instead of making a gap in the entire area therebetween, a decrease in the mechanical strength of the stacked body 100 can be suppressed. The insulating film 72 left between the electrode films 70 provides resistance to, for example, chemical mechanical polishing (CMP) performed in a process of forming the upper layer interconnect on the stacked body 100.

Further, by leaving the insulating film 72 so as to cover the side surface of the columnar portion CL, the second block film 35 at the outermost circumference of the columnar portion CL is not exposed to the etchant. Due to this, the degree of freedom of selection regarding the material of the second block film 35 increases. A material giving priority to a blocking characteristic against transfer and diffusion of electrons or atoms can be selected as a material of the second block film 35.

Next, a method for forming the memory cell array 1 of the embodiment will be described with reference to FIGS. 4 to 17.

As shown in FIG. 4, a stacked body 100 is formed on a substrate 10. The substrate 10 is, for example, a semiconductor substrate and is a silicon substrate.

The insulating film 41 is formed on the major surface (surface) of the substrate 10, and a sacrifice film 71 as a first layer and the insulating film 72 as a second layer are alternately stacked on the insulating film 41. The process of alternately stacking the sacrifice film 71 and the insulating film 72 is repeated, so that a plurality of the sacrifice films 71 and a plurality of the insulating films 72 are formed on the substrate 10. For example, the sacrifice film 71 is a silicon nitride film, and the insulating film 72 is a silicon oxide film.

The lowermost sacrifice film 71 is formed on the insulating film 41, and the lowermost insulating film 72 is formed on the lowermost first sacrifice film 71.

The insulating film 42 is formed on the uppermost sacrifice film 71. The uppermost sacrifice film 71 is formed between the uppermost insulating film 72 and the insulating film 42.

The insulating film 41 and the insulating film 42 are made of the material described above.

Figure 5:
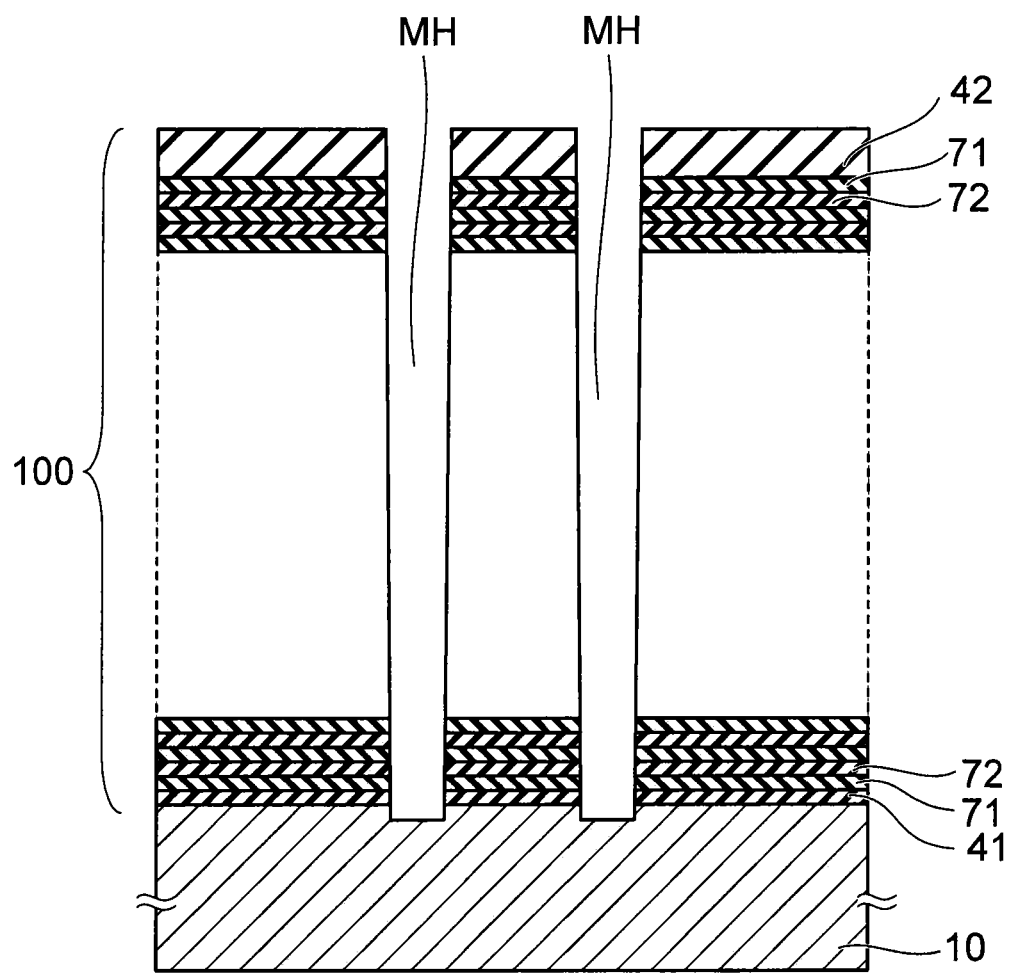

Next, as shown in FIG. 5, a plurality of memory holes MH is made in the stacked body 100. The memory hole MH is made by a RIE method using a mask (not shown). The memory hole MH pierces the stacked body 100 to reach the substrate 10. The plurality of sacrifice films (silicon nitride films) 71 and the plurality of insulating films (silicon oxide films) 72 are successively etched by, for example, a RIE method using a gas containing fluorine without switching the gas. This enables high-throughput processing.

Figure 6:
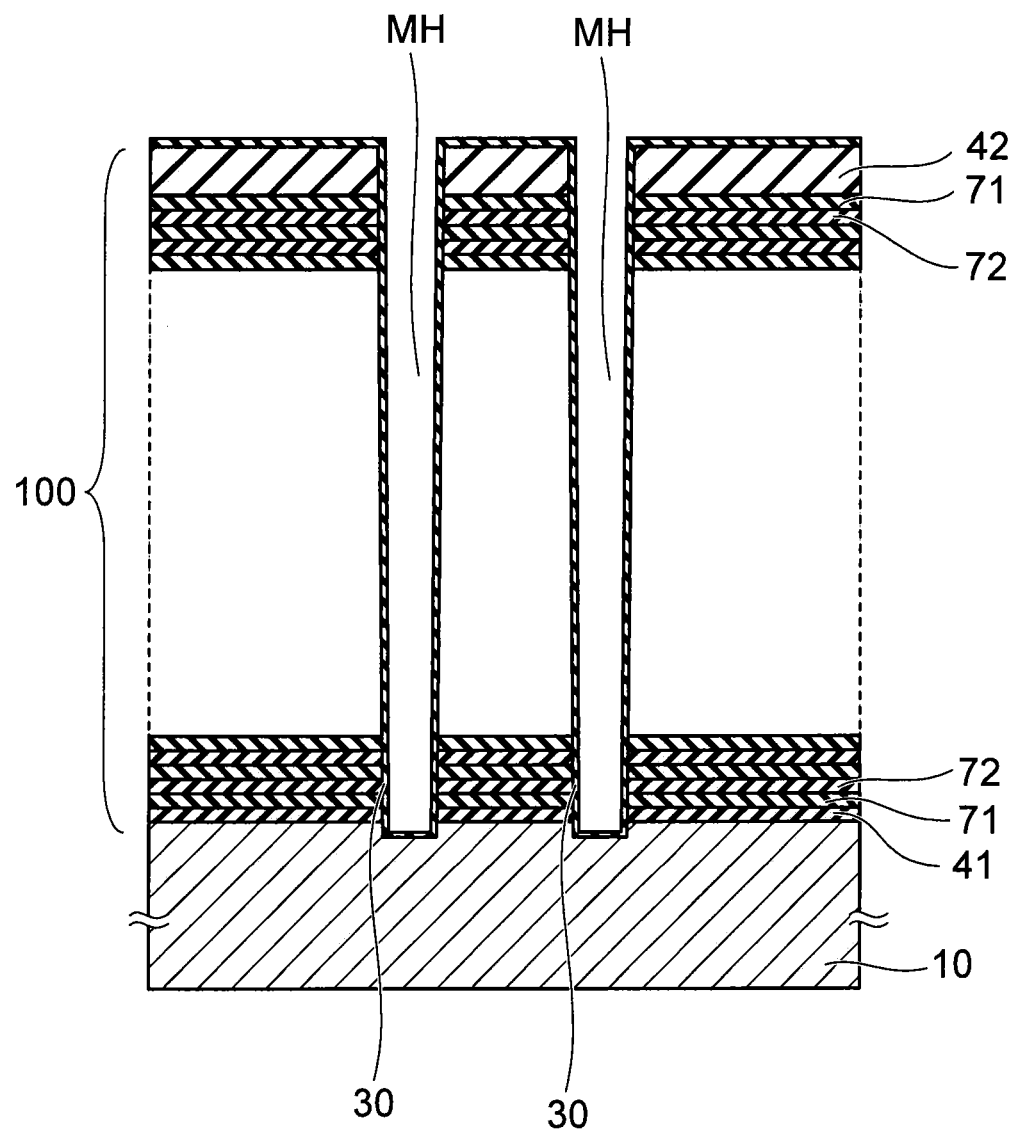
Figure 7:
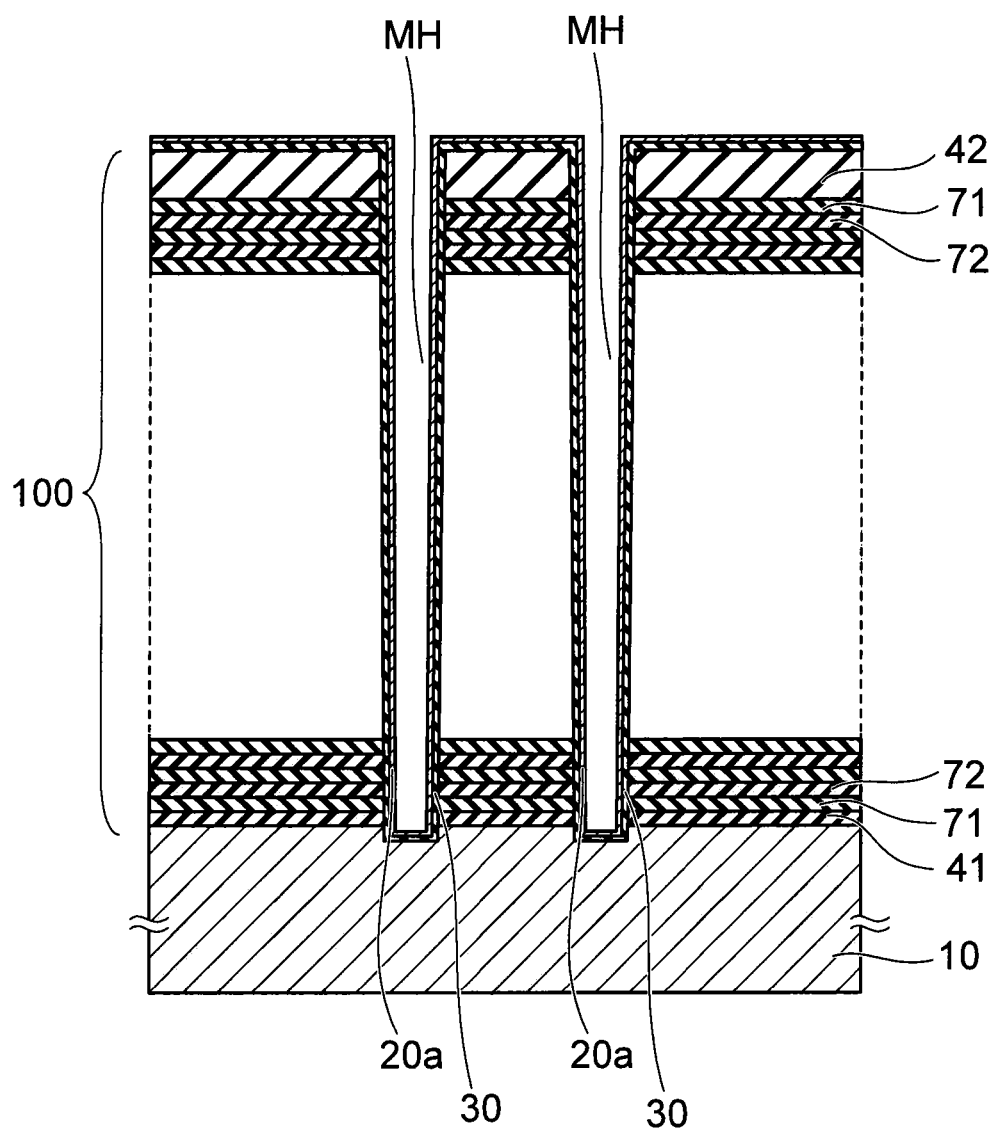

As shown in FIG. 6, the memory film 30 is formed on a side surface and a bottom of the memory hole MH, and as shown in FIG. 7, a cover film 20a is formed inside the memory film 30.

Figure 8:
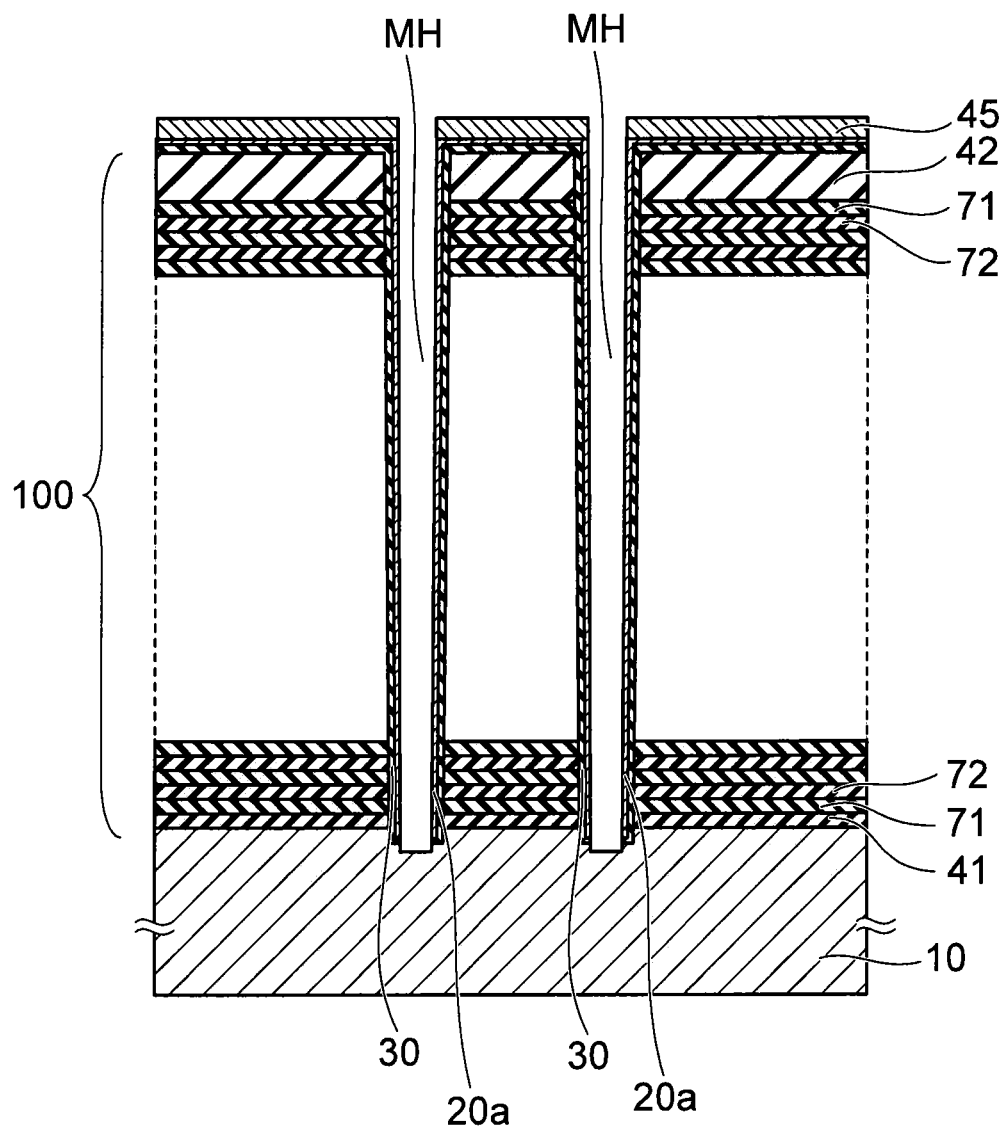

As shown in FIG. 8, a mask layer 45 is formed on an upper surface of the stacked body 100, and the cover film 20a and the memory film 30 formed on the bottom of the memory hole MH are removed by a RIE method. In this RIE, the memory film 30 formed on the side surface of the memory hole MH is covered with the cover film 20a and protected thereby. Hence, the memory film 30 formed on the side surface of the memory hole MH is not damaged by RIE.

Figure 9:
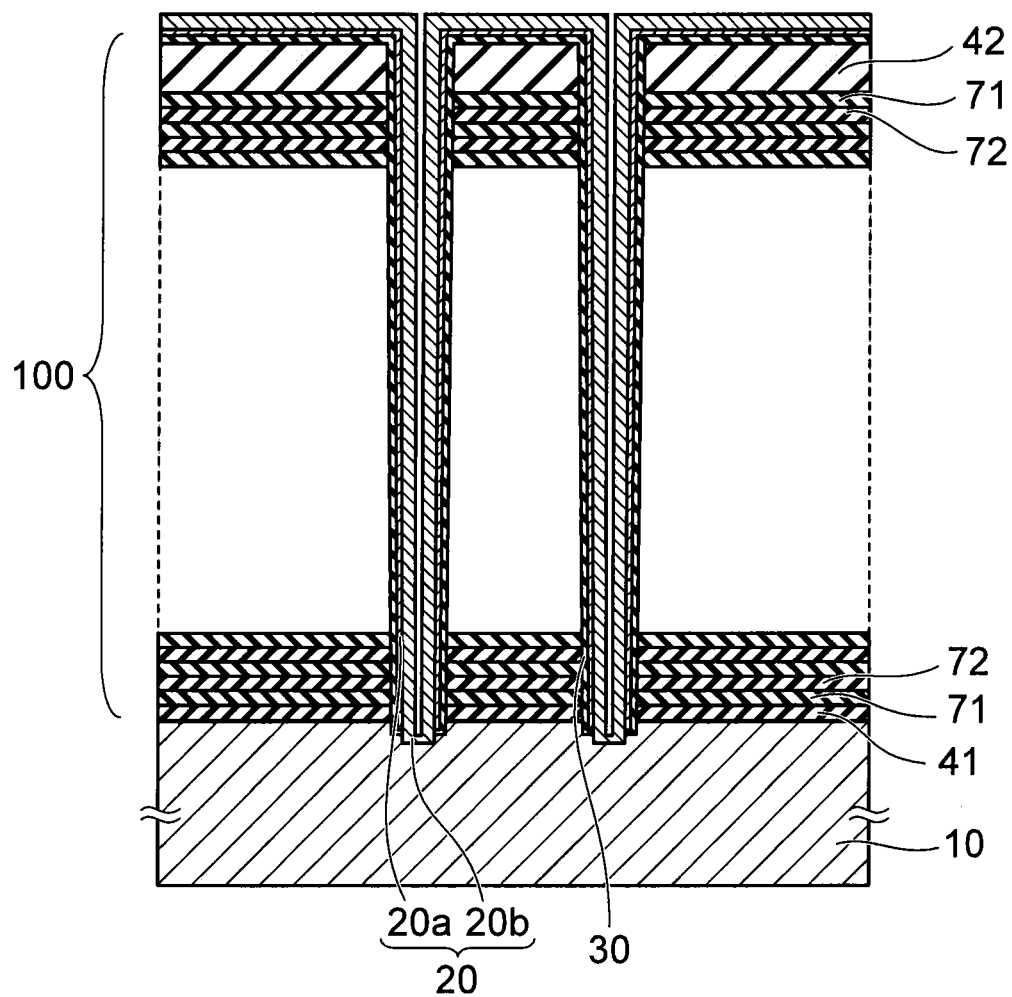

After the mask layer 45 is removed, a semiconductor film 20b is formed in the memory hole MH as shown in FIG. 9. The semiconductor film 20b is formed on a side surface of the cover film 20a and the bottom of the memory hole MH at which the substrate 10 is exposed.

The cover film 20a and the semiconductor film 20b are formed as, for example, amorphous silicon films, and then crystallized into a polycrystalline silicon film by thermal annealing. The cover film 20a and the semiconductor film 20b are included in a portion of the semiconductor film 20 described above.

Figure 10:
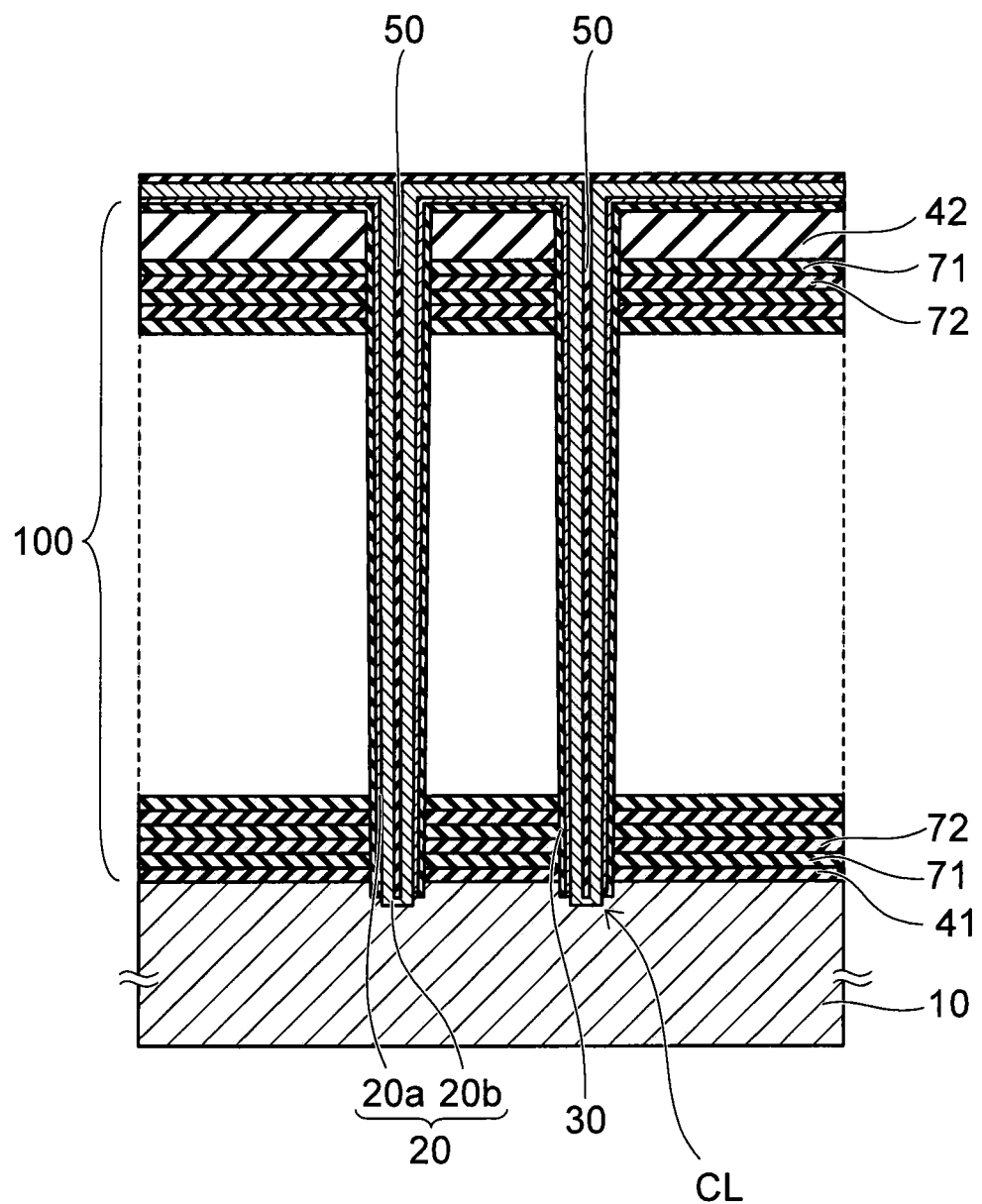

As shown in FIG. 10, the core film 50 is formed inside the semiconductor film 20b, whereby the columnar portion CL is formed.

Figure 11:
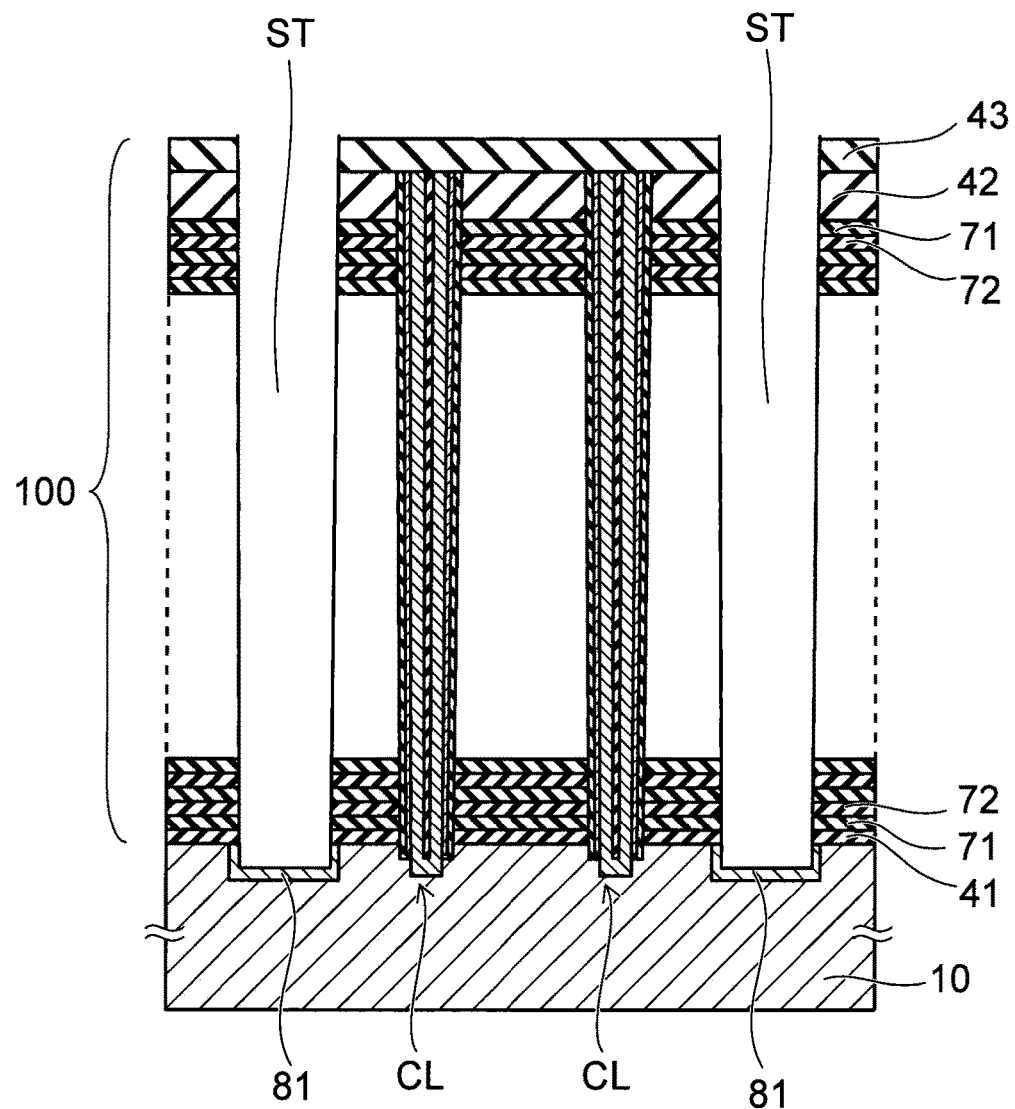

The films deposited on the insulating film 42 shown in FIG. 10 are removed by CMP or etch-back. Subsequently, as shown in FIG. 11, the insulating film 43 is formed on the insulating film 42. The insulating film 43 covers an upper end of the stacked film configuring the columnar portion CL. The insulating film 43 is made of the material described above.

Figure 13:
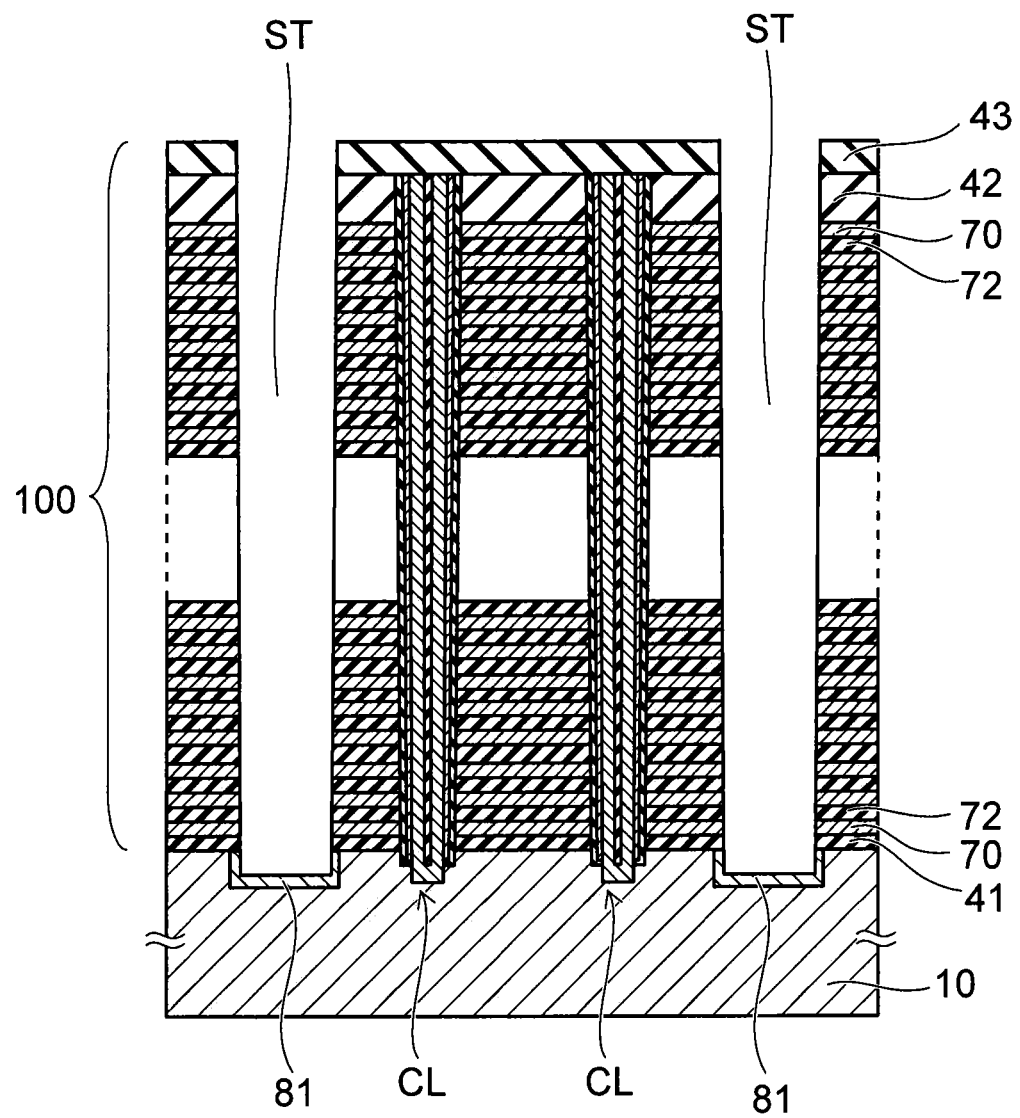

Then, a plurality of slits ST is made, by a RIE method using a mask (not shown), in the stacked body 100 including the insulating films 43 and 42, the sacrifice film 71, the insulating films 72, and the insulating film 41. As shown in FIG. 13, the slit ST pierces the stacked body 100 to reach the substrate 10. In the same manner as making the memory hole MH, the plurality of sacrifice films (silicon nitride films) 71 and the plurality of insulating films (silicon oxide films) 72 are successively etched by, for example, a RIE method using a gas containing fluorine.

An impurity is implanted by an ion implantation method into the substrate 10 exposed at a bottom of the slit ST, so that the p-type or n-type semiconductor area 81 is formed in the surface of the substrate 10 at the bottom of the slit ST.

Figure 12:
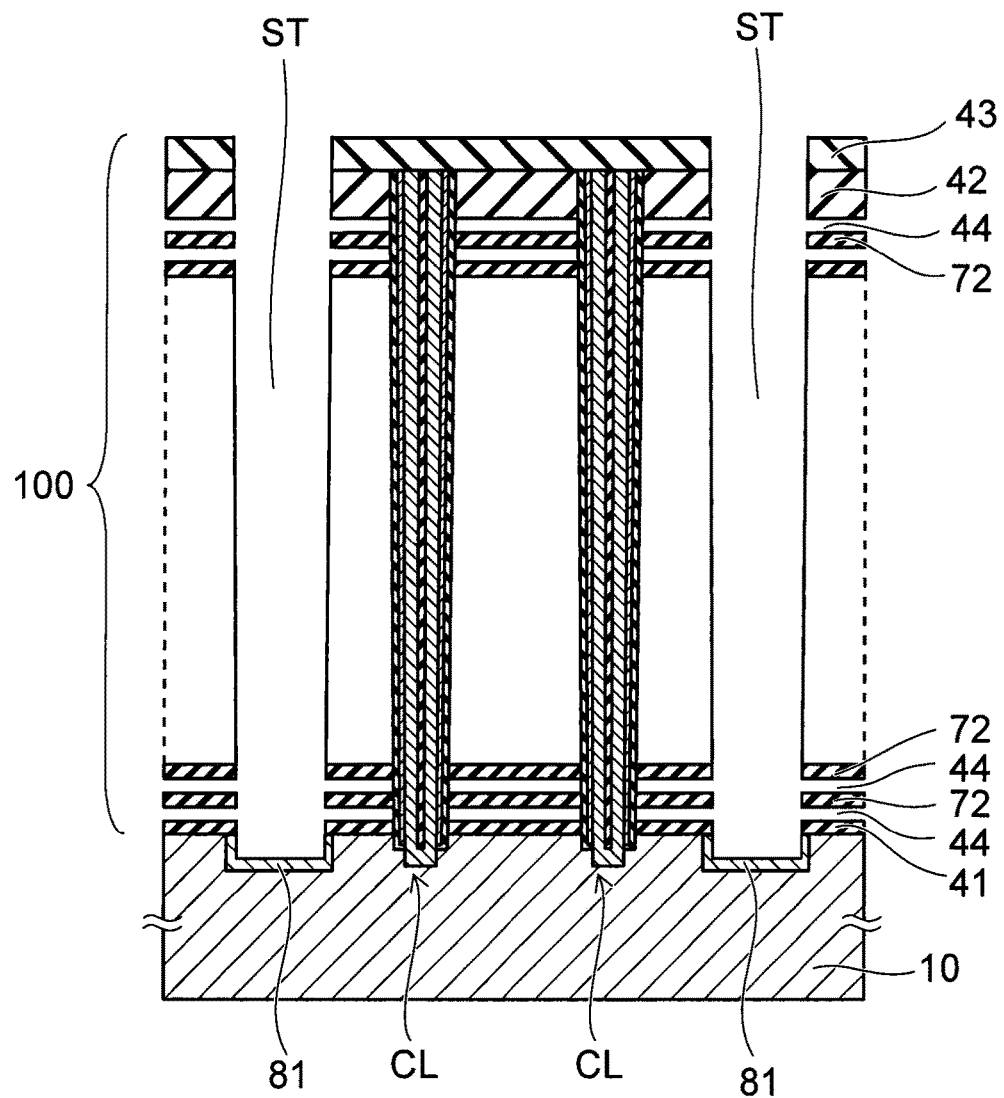

Next, the first sacrifice films 71 are removed with an etchant supplied through the slits ST. With the removal of the first sacrifice films 71 as shown in FIG. 12, gaps 44 are made between the insulating films 72 vertically adjacent to each other.

For example, the sacrifice film 71 which is a silicon nitride film is removed with an etchant containing phosphoric acid.

The etching selectivity of the first sacrifice film (silicon nitride film) 71 with respect to the insulating film (silicon oxide film) 72, the insulating films (metal oxide films, SiC films, or SiCN films) 41, 42, and 43, and the substrate (silicon substrate) 10 is sufficiently high. That is, the insulating film 72, the insulating films 41, 42, and 43, and the substrate 10 have high etching resistance to phosphoric acid, and are left without being etched.

For example, when the etching rate of SiN formed by a plasma CVD method with phosphoric acid is 1, the etching rate of each of SiC, SiCN, TaO, ZrO, and HfO with phosphoric acid is 1/30 or less.

Moreover, because the block film 35 provided at the outermost circumference of the columnar portion CL is a metal oxide film, etching of a side surface of the columnar portion CL due to phosphoric acid entering through the gap 44 is suppressed.

Further, because an upper end of the columnar portion CL is covered with the insulating film 43, etching from the upper end side of the columnar portion CL can also be suppressed.

The plurality of insulating films 72 stacked with the gaps 44 therebetween is supported by the columnar portion CL. Moreover, a lower end of the columnar portion CL is supported by the substrate 10, and the upper end is supported by the insulating films 42 and 43.

After the first sacrifice films 71 are removed, the electrode films 70 are formed in the gaps 44. The electrode films 70 are formed by, for example, a Chemical Vapor Deposition (CVD) method. A source gas enters the gaps 44 through the slits ST, and the electrode films 70 are deposited in the gaps 44.

As shown in FIG. 13, the electrode film 70 is formed between the insulating films 72. The insulating films 72 and the electrode films 70 are alternately stacked, so that the stacked body 100 including the plurality of electrode films 70 and the plurality of insulating films 72 is formed.

Figure 14:
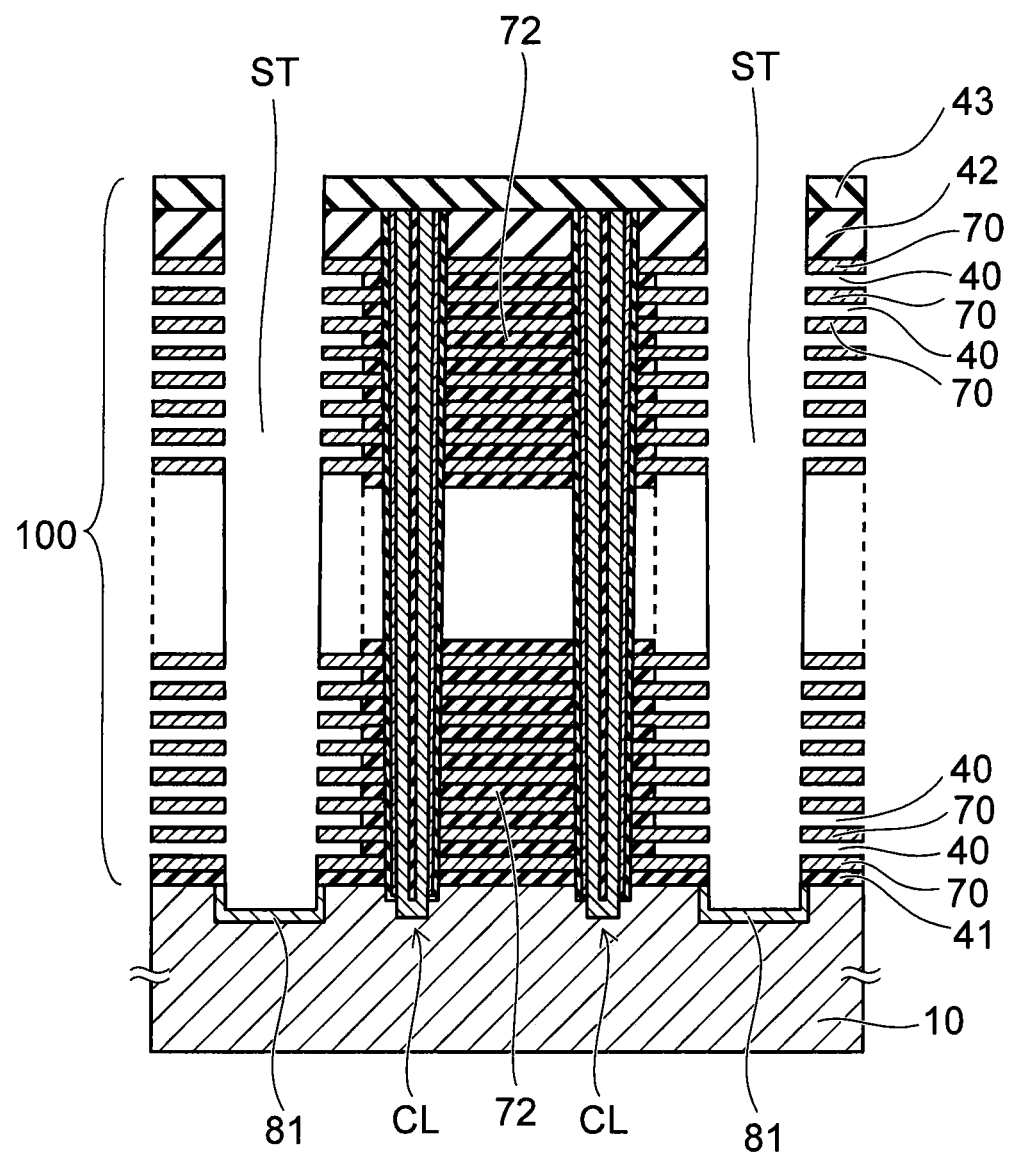

Subsequently, the insulating film 72 is etched with an etchant supplied through the slit ST while leaving a portion of the insulating film 72. The etching of the insulating film 72 proceeds from the slit ST, and as shown in FIG. 14, between the electrode films 70 in a region in the vicinity (lateral side) of the slit ST, the gap 40 communicating with the slit ST is made.

By controlling the etching time, a portion of the insulating film 72 is left between the electrode films 70 in, for example, a region surrounding the columnar portion CL.

For example, the insulating film 72 which is a silicon oxide film is removed with an etchant containing hydrofluoric acid.

The etching selectivity of the insulating film 72 with respect to the electrode film 70, the insulating films 41, 42, and 43, and the substrate 10 is sufficiently high. That is, the electrode film 70, the insulating films 41, 42, and 43, and the substrate 10 have high etching resistance to hydrofluoric acid, and are left without being etched. For example, when the etching rate of $SiO_2$, formed by a plasma CVD method, with hydrofluoric acid is 1, the etching rate of SiC, SiCN, TaO, ZrO, and HfO with hydrofluoric acid is 1/30 or less.

Further, the block film 35 provided at the outermost circumference of the columnar portion CL is covered with the left insulating film 72, and therefore is protected from hydrofluoric acid.

Because the upper end of the columnar portion CL is covered with the insulating film 43, etching from the upper end side of the columnar portion CL can also be suppressed.

The plurality of electrode films 70 stacked with the gap 40 therebetween is supported by the columnar portion CL and the insulating films 72 left therearound.

Figure 15:
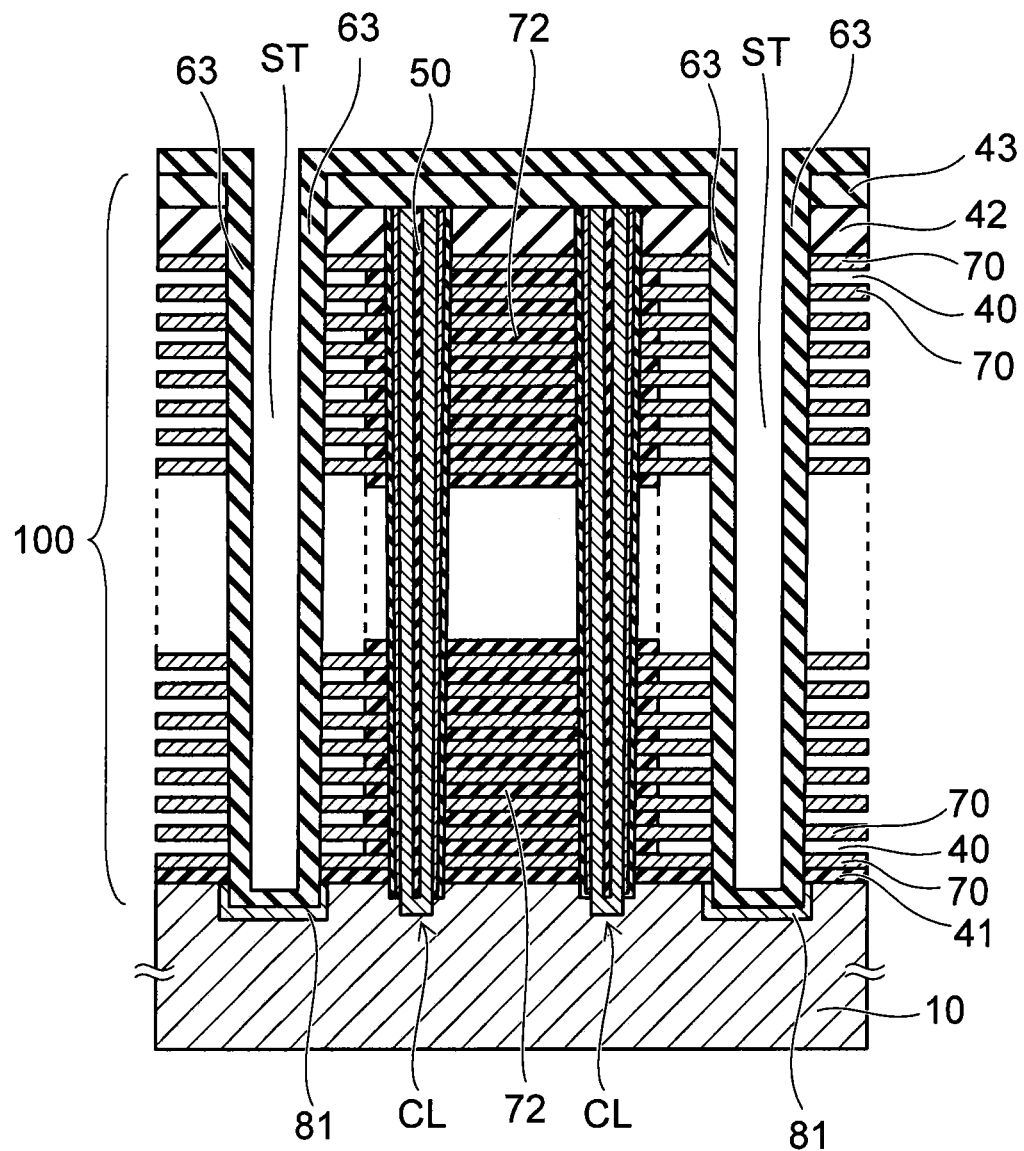

After the gaps 40 are made, the insulating film 63 is formed on a side surface and a bottom of the slit ST as shown in FIG. 15.

The insulating film 63 with low coverage closes openings of the gaps 40 on the slit ST side. The gaps 40 are not filled with the insulating film 63.

After the insulating film 63 formed on the bottom of the slit ST is removed by a RIE method, the interconnect portion LI is buried in the slit ST as shown in FIG. 1. The lower end of the interconnect portion LI is connected to the substrate 10 through the semiconductor area 81.

Thereafter, the bit lines BL, the source layer SL, and the like shown in FIG. 1 are formed. Even if CMP is performed at this time, the mechanical strength of the stacked body 100 is ensured by the insulating film 72 partially left between the electrode films 70.

The electrode films 70 is not limited to being formed by replacing the sacrifice films, and may be stacked on the substrate 10 prior to making the memory hole MH.

Figure 16:
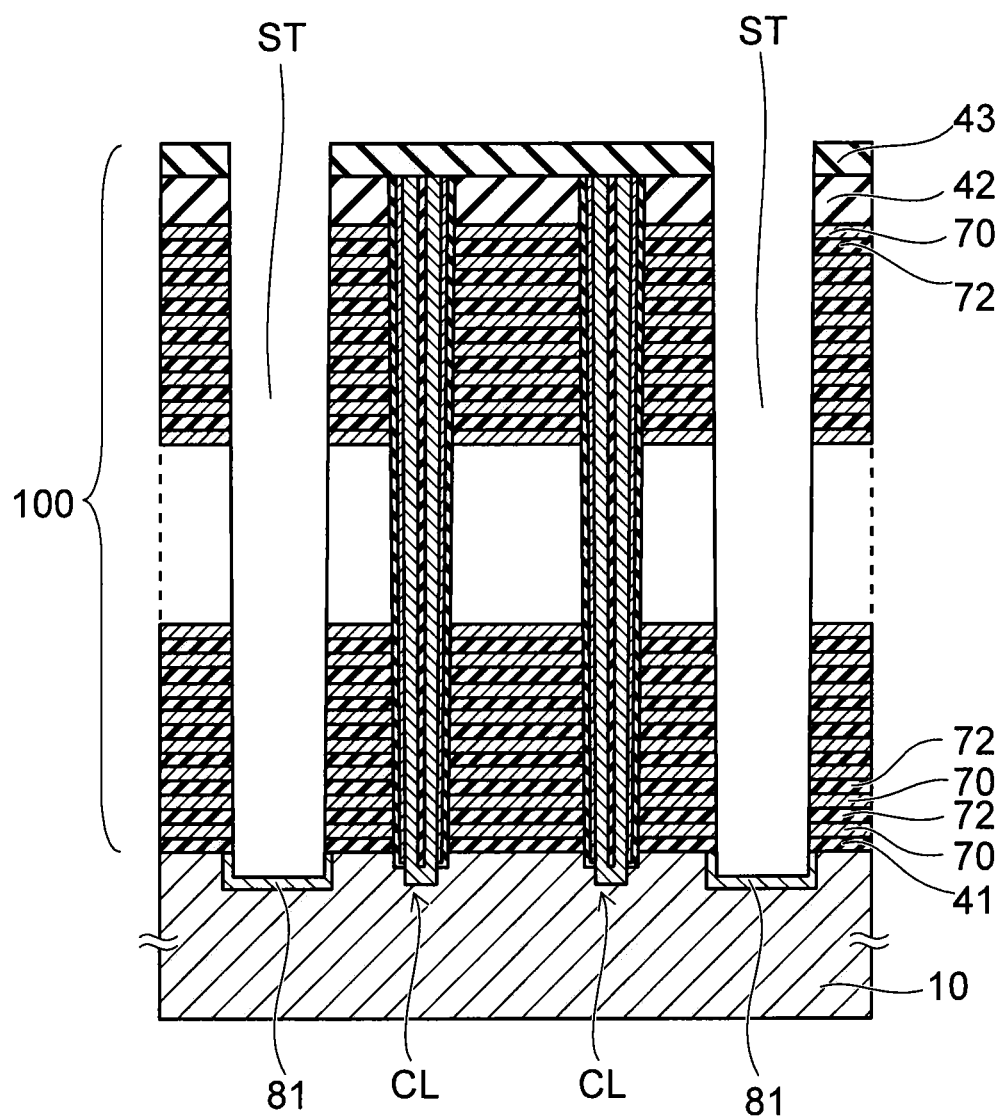

That is, the electrode films 70 and the insulating films 72 are alternately stacked as the stacked body 100 on the substrate 10. As shown in FIG. 16, the insulating film 41 is formed on the major surface of the substrate 10, and the lowermost electrode film 70 is formed on the insulating film 41. The insulating films 72 and the electrode films 70 are alternately stacked on the lowermost electrode film 70. The insulating film 42 is formed on the uppermost electrode film 70, and the insulating film 43 is formed on the insulating film 42.

The memory holes MH and the columnar portions CL are formed in the stacked body 100, and further, as shown in FIG. 16, the slits ST are formed.

Figure 17:
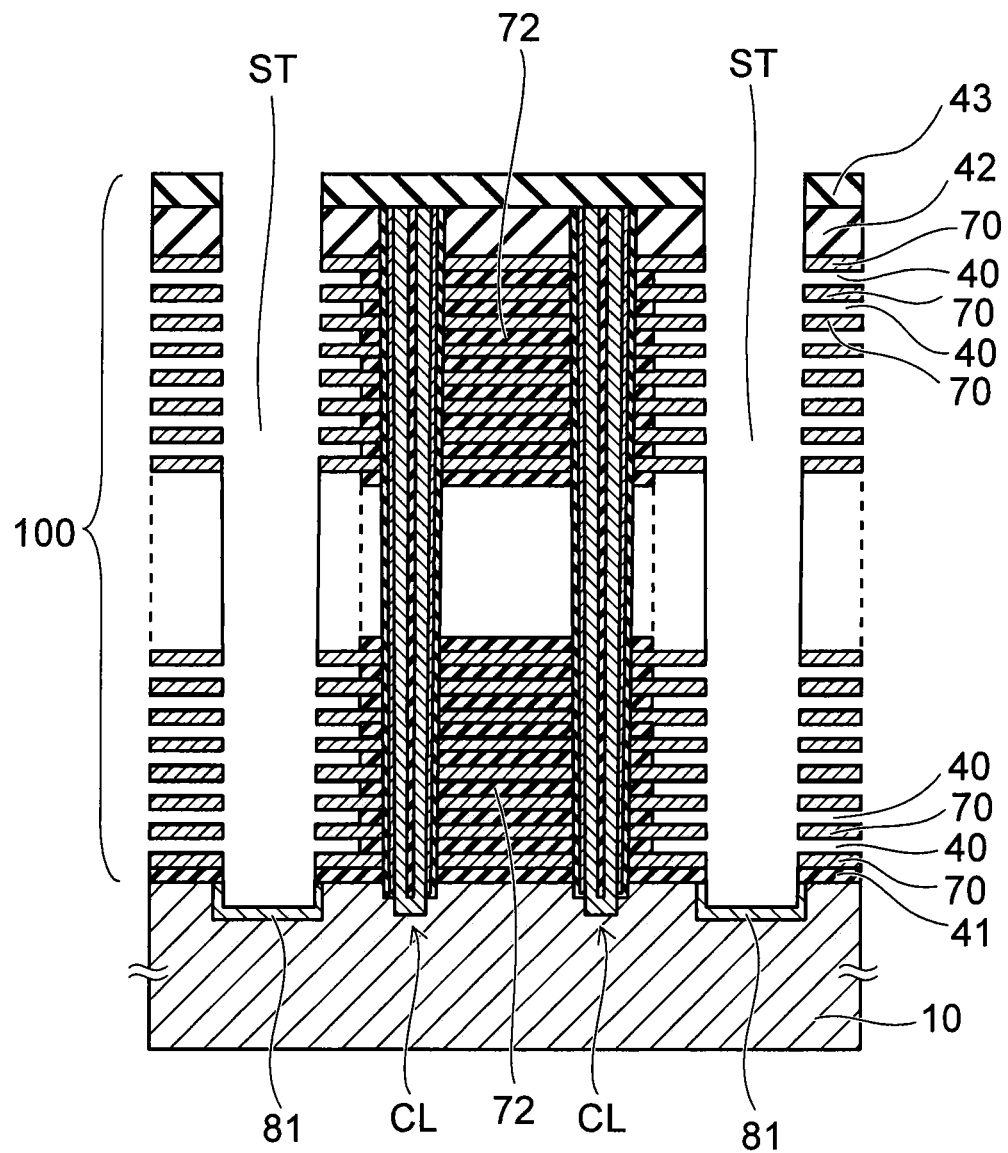

Then, the insulating film 72 is etched with an etchant supplied through the ST. As shown in FIG. 17, for example, the gap 40 is made between the electrode films 70 in a region in the vicinity of the slit ST while leaving the insulating film 72 between the electrode films 70 in a region surrounding the columnar portion CL.

For example, the insulating film 72, which is a silicon oxide film, is removed with a hydrofluoric acid-containing etchant. The electrode film 70, the insulating films (metal oxide films, SiC films, or SiCN films) 41, 42, and 43, and the substrate 10 are left without being etched.

Thereafter, the insulating film 63 and the interconnect portion LI are formed in the slit ST.

Hereinafter, another example of the memory cell array of the semiconductor device of the embodiment will be described.

Figure 18:
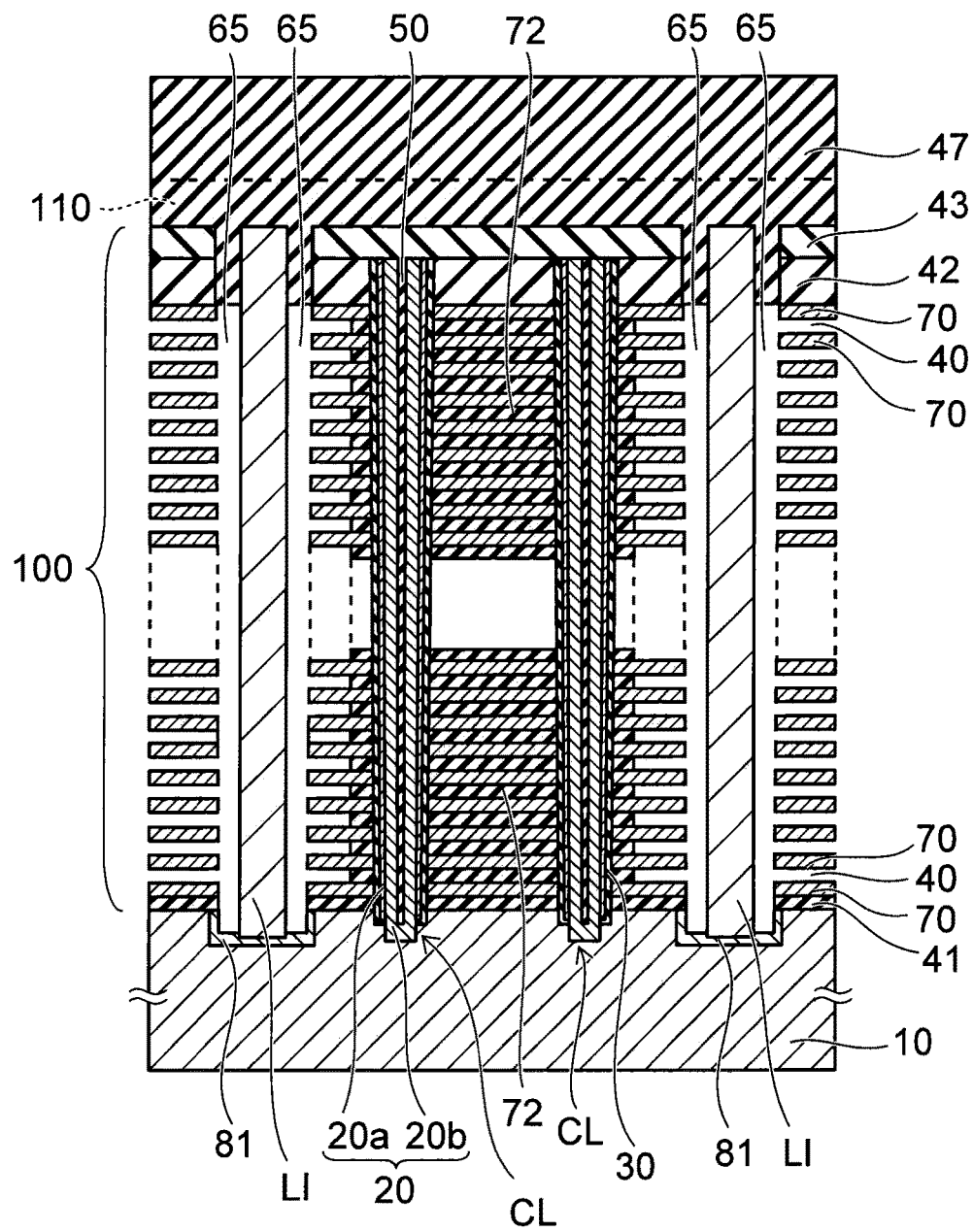
FIG. 18 is a schematic sectional view of a memory cell array of a semiconductor device of another embodiment.

FIG. 18 is a schematic sectional view similar to FIG. 2.

In the example shown in FIG. 18, gaps are each provided also between the side surface of the interconnect portion LI and the stacked body 100. Slits 65 extending in the stacking direction and in a depth direction of this paper (the X-direction in FIG. 2) are each made between the side surface of the interconnect portion LI and the stacked body 100. The slit 65 is in communication with the gaps 40.

An insulating film 47 is provided on the insulating film 43, and a portion of the insulating film 47 closes an upper end of the slit 65. By forming, for example, a silicon oxide film with low coverage as the insulating film 47, the slits 65 are prevented from being filled with the insulating film 47.

Edge portions of the electrode films 70 vertically adjacent to each other on the interconnect portion LI side are not connected to each other through a surface of the insulating film. Therefore, it is possible to prevent a short circuit between the electrode films 70 due to migration occurring on the surface of the insulating film.

Further, also in this memory cell array, by leaving the insulating film 72 in a portion of area between the electrode films 70 instead of making a gap in the entire area therebetween, mechanical strength can be imparted to the stacked body 100.

Next, a method for forming the memory cell array shown in FIG. 18 will be described with reference to FIGS. 19 to 25B.

Figure 19:
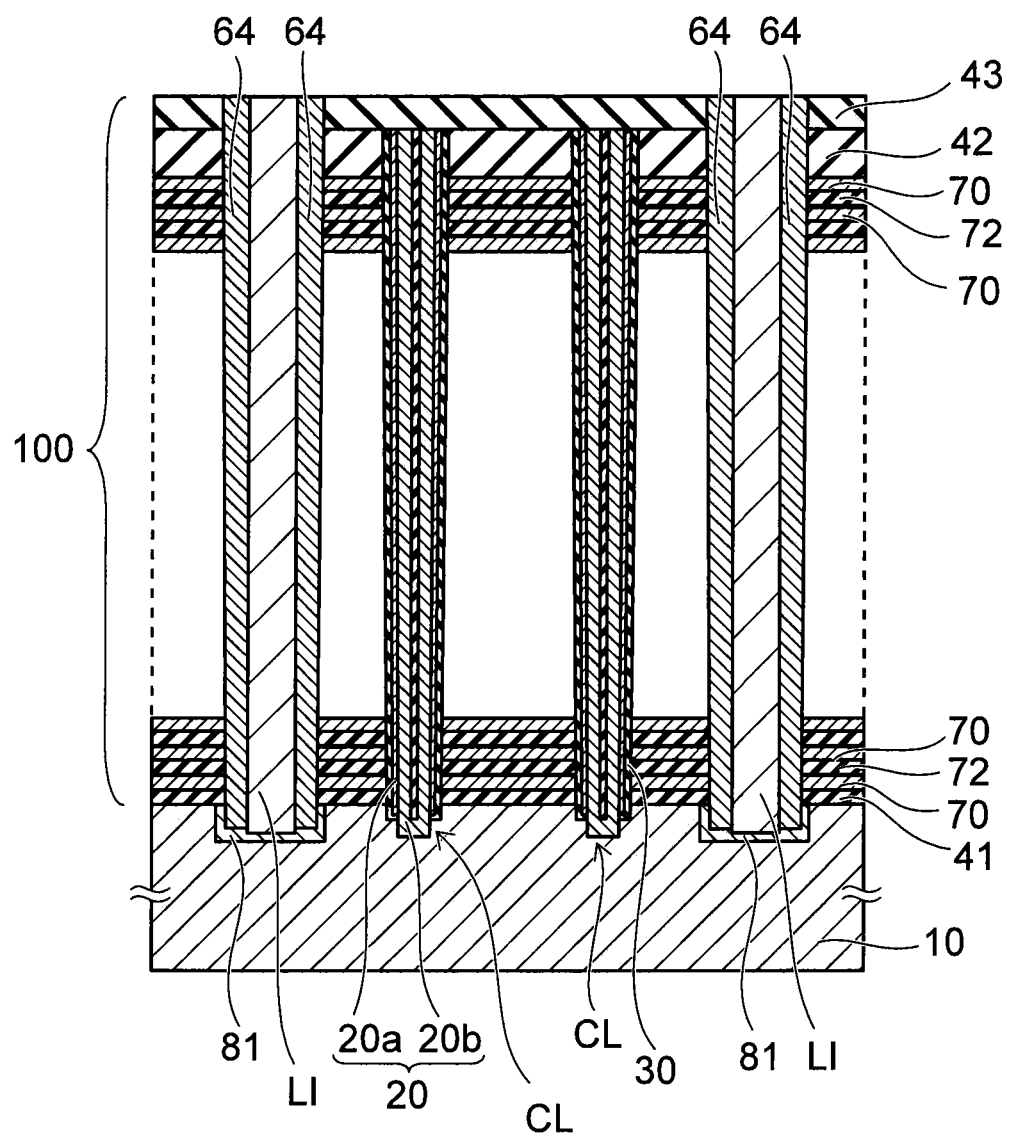
FIGS. 19 to 25B are schematic sectional views showing a method for manufacturing the semiconductor device of the another embodiment.

The electrode films 70 and the insulating films 72 are alternately stacked as the stacked body 100 on the substrate 10. As shown in FIG. 19, the insulating film 41 is formed on the major surface of the substrate 10, and the lowermost electrode film 70 is formed on the insulating film 41. The insulating films 72 and the electrode films 70 are alternately stacked on the lowermost electrode film 70. The insulating film 42 is formed on the uppermost electrode film 70, and the insulating film 43 is formed on the insulating film 42.

The memory holes MH and the columnar portions CL are made in the stacked body 100, slits are further made therein, and a sacrifice film 64 and the interconnect portion LI are formed in the slits.

The sacrifice film 64 is formed on a side surface and a bottom of the slit, and the interconnect portion LI is buried in the slit after the sacrifice film 64 on the bottom is removed. The sacrifice film 64 is formed on the side surface of the interconnect portion LI.

The sacrifice film 64 is, for example, a Boron-Silicate Glass (BSG) film or a silicon nitride film. Alternatively, the sacrifice film 64 is a stacked film of a silicon oxide film formed on the side surface of the interconnect portion LI and a silicon nitride film formed on a side surface of the silicon oxide film.

Figure 20A:
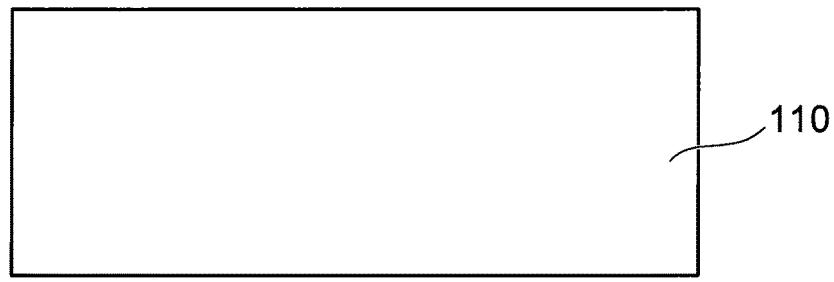
Figure 20B:
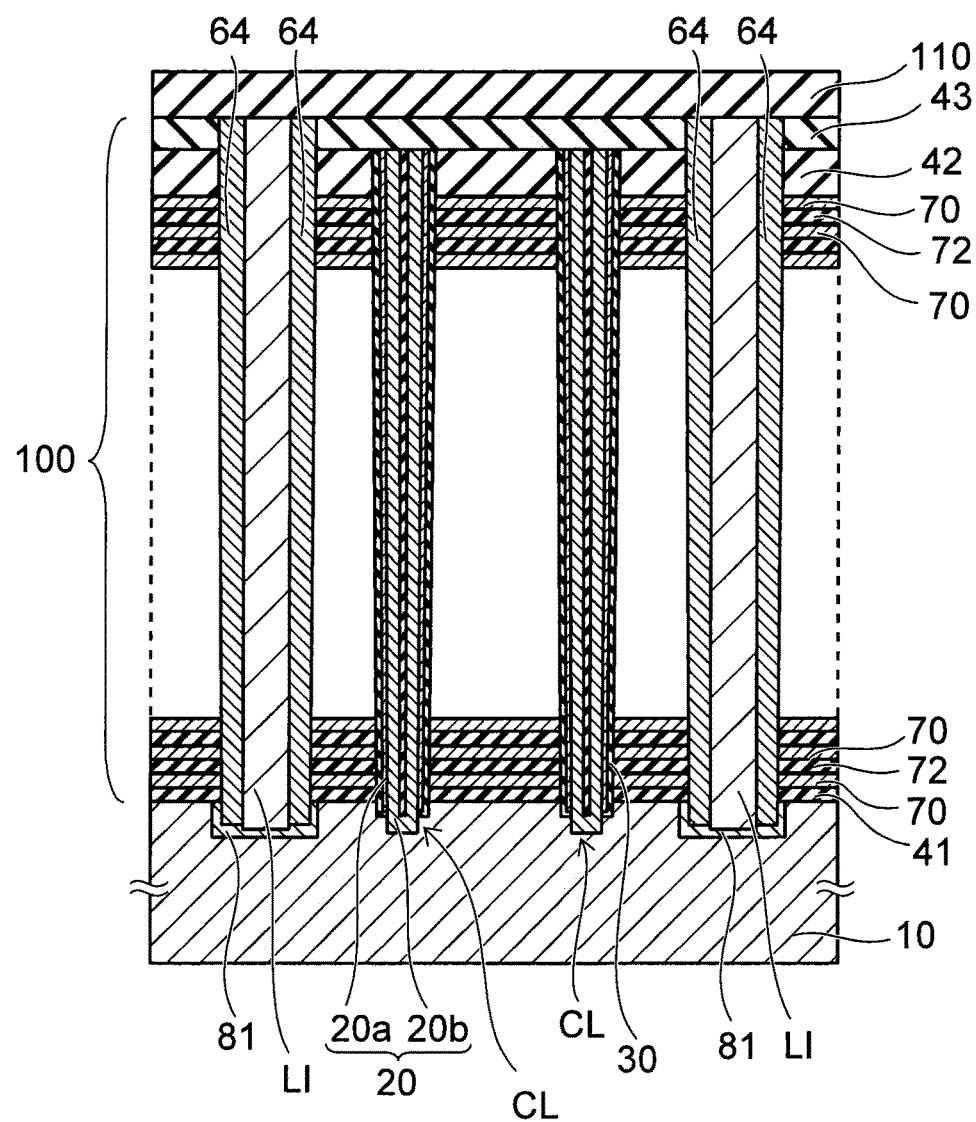

As shown in FIG. 20B, a cover film 110 is formed on an upper surface of the stacked body 100. FIG. 20A is a top view of FIG. 20B. The cover film 110 covers the upper ends of the interconnect portions LI and upper ends of the sacrifice films 64. The upper ends of the interconnect portions LI and the upper ends of the sacrifice films 64 are in contact with the cover film 110.

The cover film 110 is a metal oxide film, a silicon carbide film (SiC film), or a silicon carbonitride film (SiCN film). The metal oxide film used for the cover film 110 contains, for example, at least any of tantalum oxide (TaO), zirconium oxide (ZrO), and hafnium oxide (HfO).

Figure 21A:
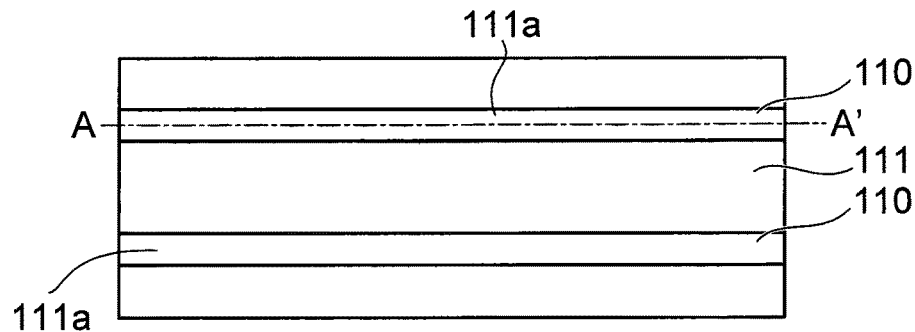

As shown in FIG. 21A, a resist film 111 is formed on the cover film 110. Slits 111a are selectively made in the resist film 111, and a portion of the cover film 110 is exposed at a bottom of the slit 111a.

Figure 21B:
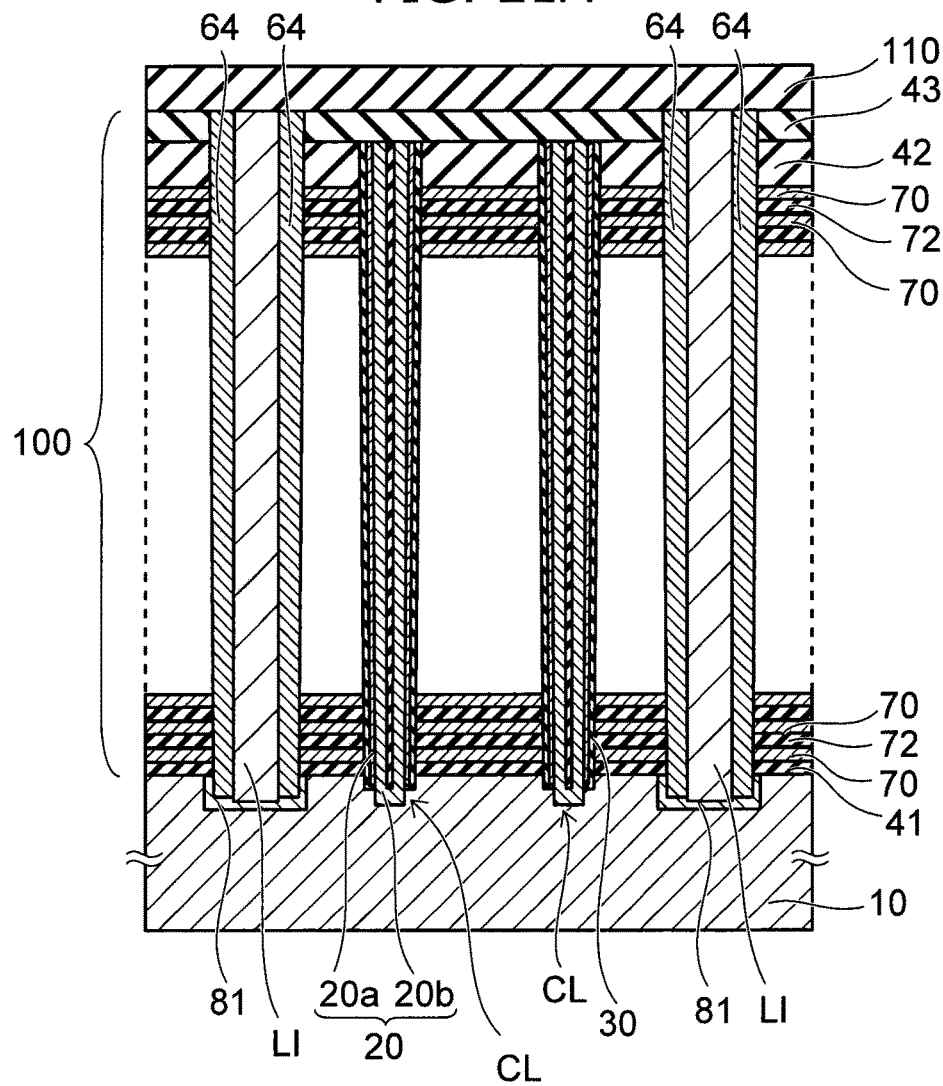

FIG. 21B is a sectional view taken along the line A-A' in FIG. 21A.

The slit 111a extends in a direction (the Y-direction in FIG. 1) crossing an extending direction (the X-direction in FIG. 1) of the interconnect portion LI.

Figure 22A:
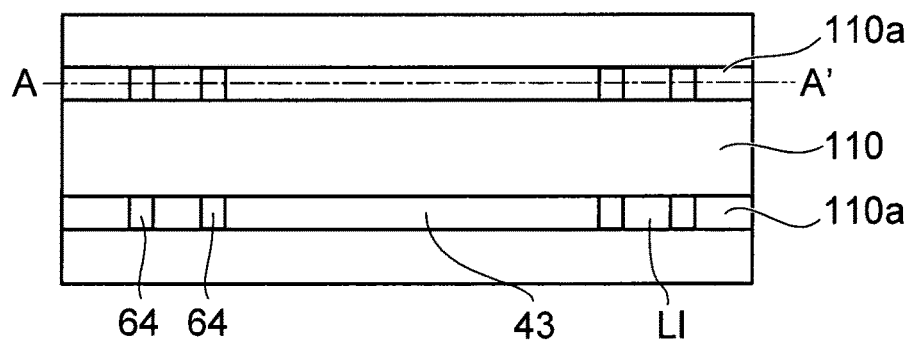

As shown in FIG. 22A, slits 110a are made in the cover film 110 by etching using the resist film 111 as a mask.

Figure 22B:
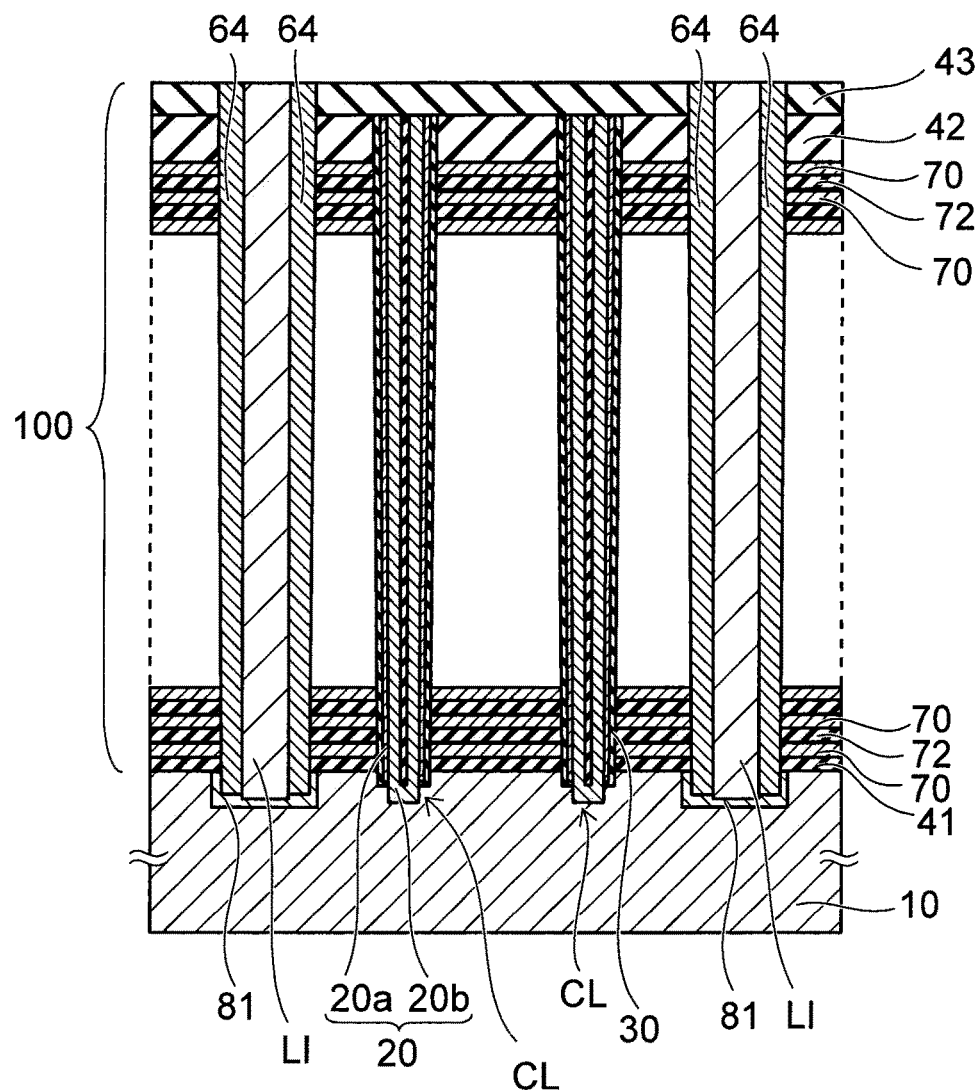

FIG. 22B is a sectional view taken along the line A-A' in FIG. 22A.

The slit 110a extends in the direction (the Y-direction in FIG. 1) crossing the extending direction (the X-direction in FIG. 1) of the interconnect portion LI. The plurality of slits 110a is aligned separately from each other in the extending direction of the interconnect portion LI. Portions of the interconnect portions LI and portions of the sacrifice films 64 are exposed at a bottom of the slit 110a.

Then, the sacrifice film 64 is removed by etching. Etching with an etchant proceeds from the upper end of the sacrifice film 64 exposed in the slit 110a.

When the sacrifice film 64 is a silicon nitride film, the silicon nitride film can be removed with an etchant containing phosphoric acid. When the sacrifice film 64 is a silicon oxide film or a BSG film, the film can be removed with an etchant containing hydrofluoric acid.

The etching selectivity of the sacrifice film 64 with respect to the interconnect portion LI, the electrode film 70, the insulating films 41, 42, and 43, the cover film 110, and the substrate 10 is sufficiently high. That is, the interconnect portion LI, the electrode film 70, the insulating films 41, 42, and 43, the cover film 110, and the substrate 10 have high etching resistance to phosphoric acid and hydrofluoric acid, and are left without being etched.

Figure 23A:
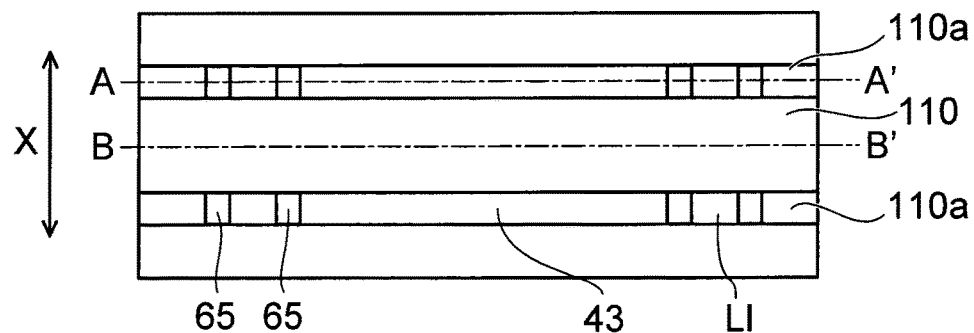
Figure 23B:
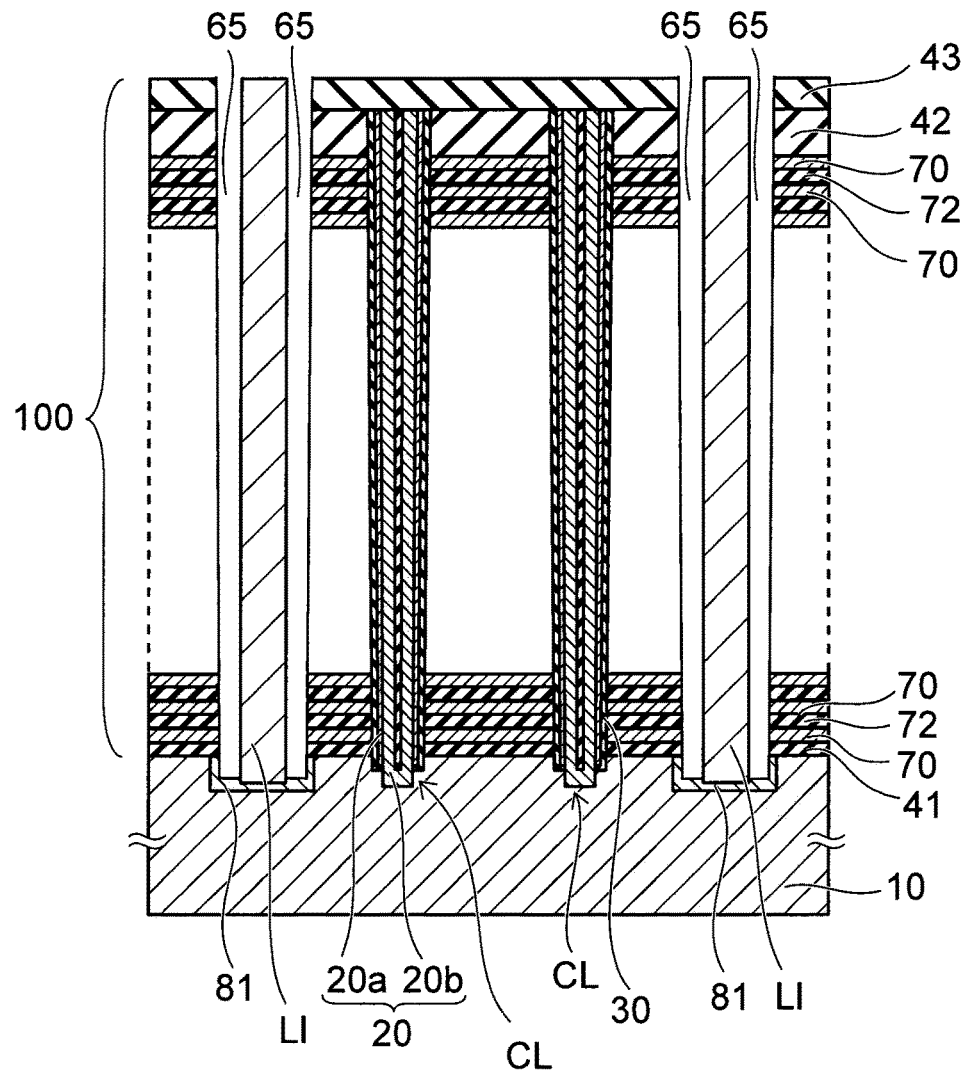

The sacrifice film 64 is removed, so that the slits 65 are made between the side surface of the interconnect portion LI and the stacked body 100 as shown in FIG. 23B.

FIG. 23B is a sectional view taken along the line A-A' in FIG. 23A, showing a cross-section of the stacked body 100 below the slit 110a where the cover film 110 is absent.

Figure 24:
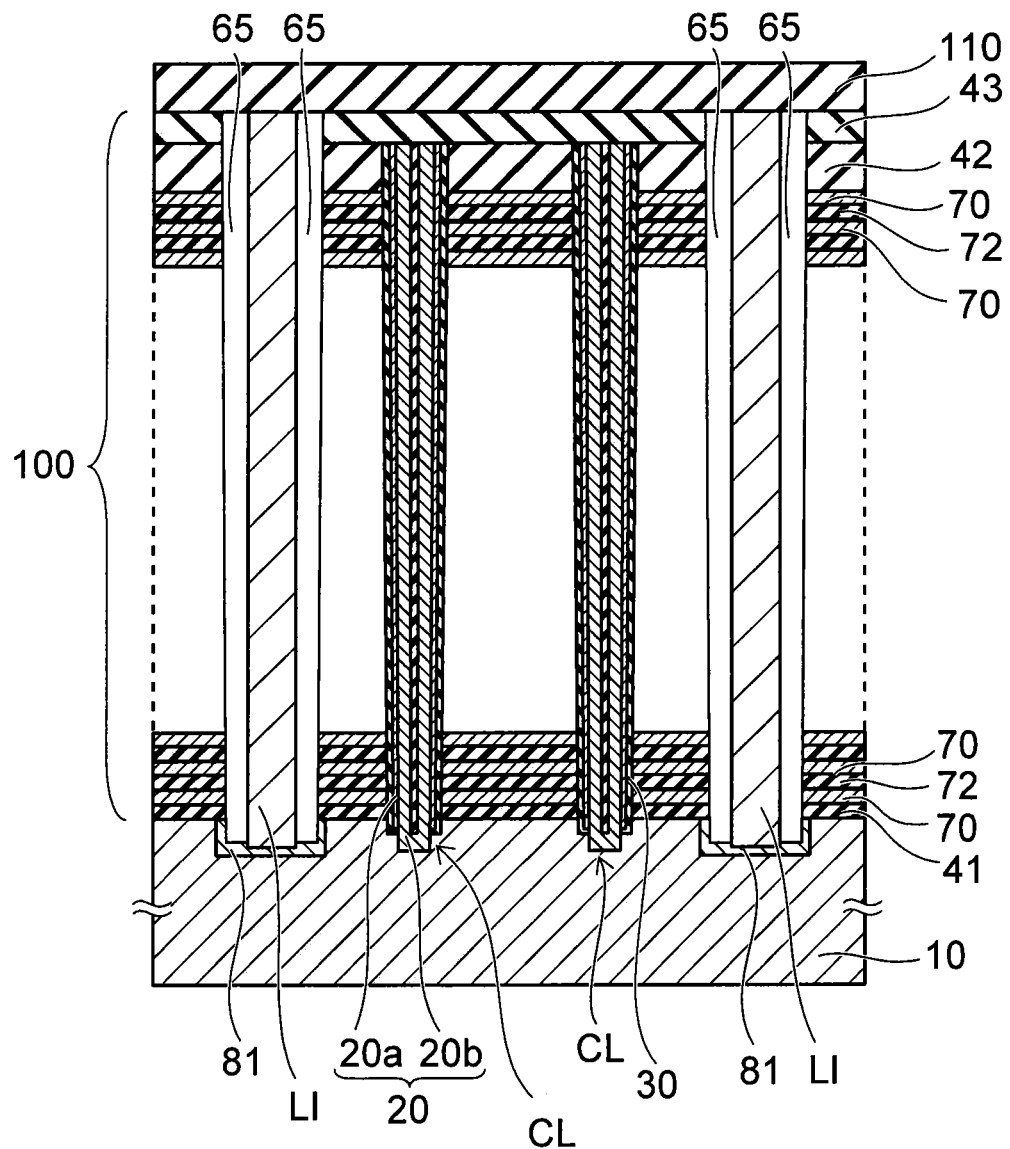

FIG. 24 is a sectional view taken along the line B-B' in FIG. 23A showing a cross-section of the stacked body 100 in an area covered with the cover film 110

Etching proceeds in the depth direction from a side of the upper end of the sacrifice film 64 exposed in the slit 110a in the cover film 110, and the erosion of the sacrifice film 64 due to an etchant also proceeds in the extending direction (the X-direction) of the interconnect portion LI.

As shown in FIGS. 23A and 24, a portion of the upper surface of the interconnect portion LI is in contact with the cover film 110 that is selectively left. Although the interconnect portion LI loses support from the stacked body 100 due to making the slit 65, the upper end and the lower end of the interconnect portion LI are supported by the cover film 110 and the substrate 10, respectively, and thus the interconnect portion LI does not collapse.

When the insulating film 72 between the electrode films 70 is made of the same material as the sacrifice film 64 on the side surface of the interconnect portion LI, the insulating film 72 can be successively removed in etching of the sacrifice film 64. In this case, there is a concern that the upper portion of the columnar portion CL is exposed to an etchant for a long time and thus etched. By changing the time for etching the sacrifice film 64, the insulating film 72 between the electrode films 70 can be left at least around the columnar portion CL.

The insulating film 72 between the insulating films 70 can be removed with an etchant supplied through the slit 65 after the slit 65 is made. By etching the insulating film 72, as shown in FIG. 25B, for example, the gap 40 in communication with the slit 65 is made between the electrode films 70 in a region on a lateral side of the interconnect portion LI while leaving the insulating film 72 between the electrode films 70 in a region surrounding the columnar portion CL.

Figure 25A:
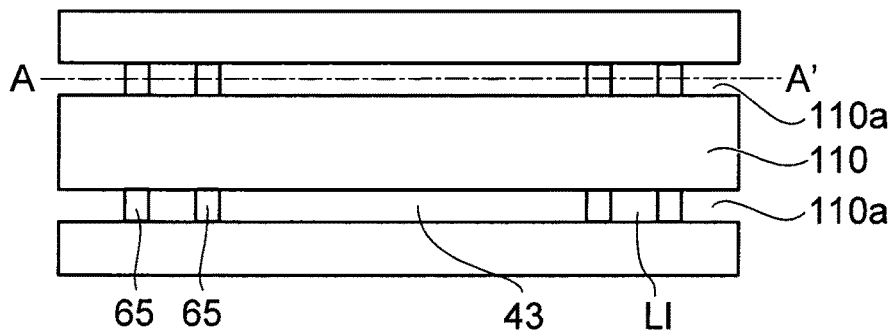
Figure 25B:
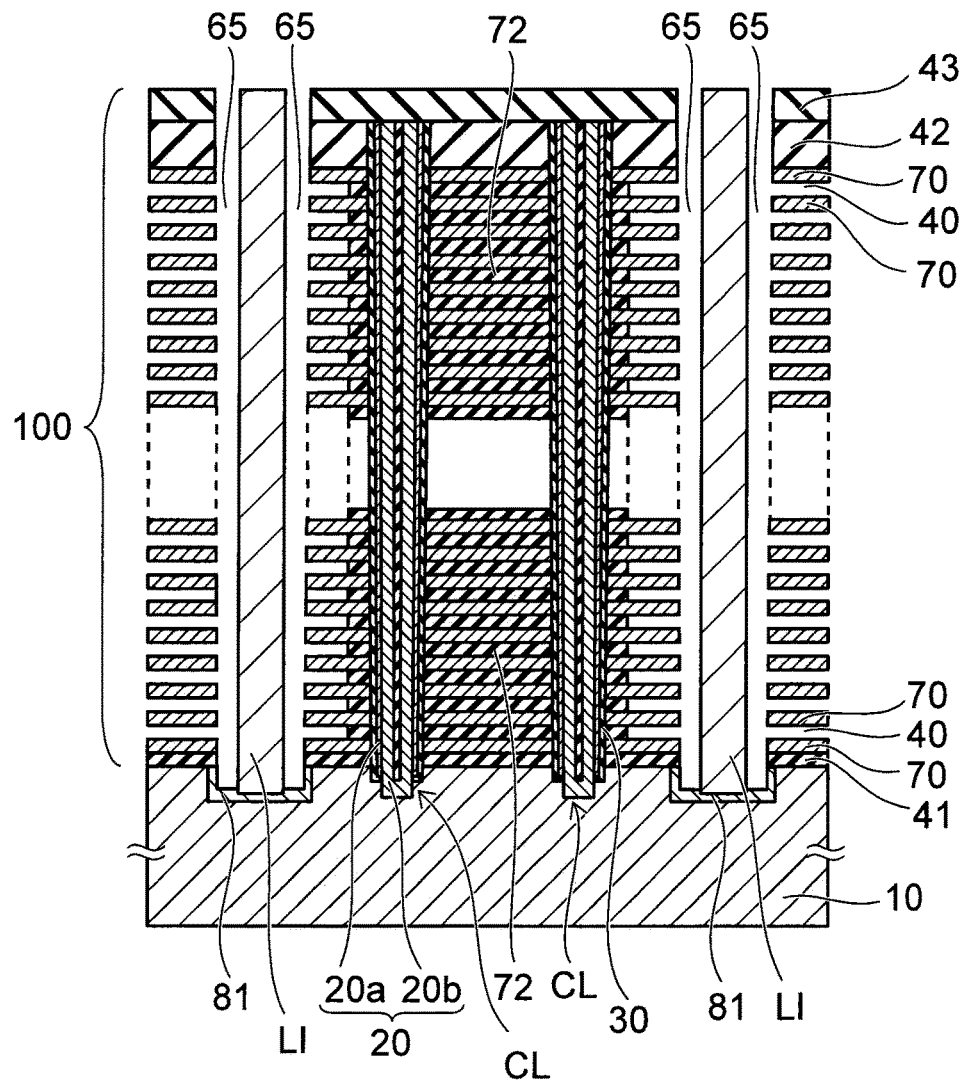

FIG. 25B is a sectional view taken along the line A-A' in FIG. 25A.

For example, the insulating film 72, which is a silicon oxide film, is removed with an etchant containing hydrofluoric acid. The cover film 110, the electrode film 70, the insulating films 41, 42, and 43, and the substrate 10 are left without being etched.

After the gap 40 is made, the insulating film 47 with low coverage is formed on the cover film 110 and on the insulating film 43 as shown in FIG. 18, and the upper end of the slit 65 is closed by a portion of the insulating film 47.

Figure 26:
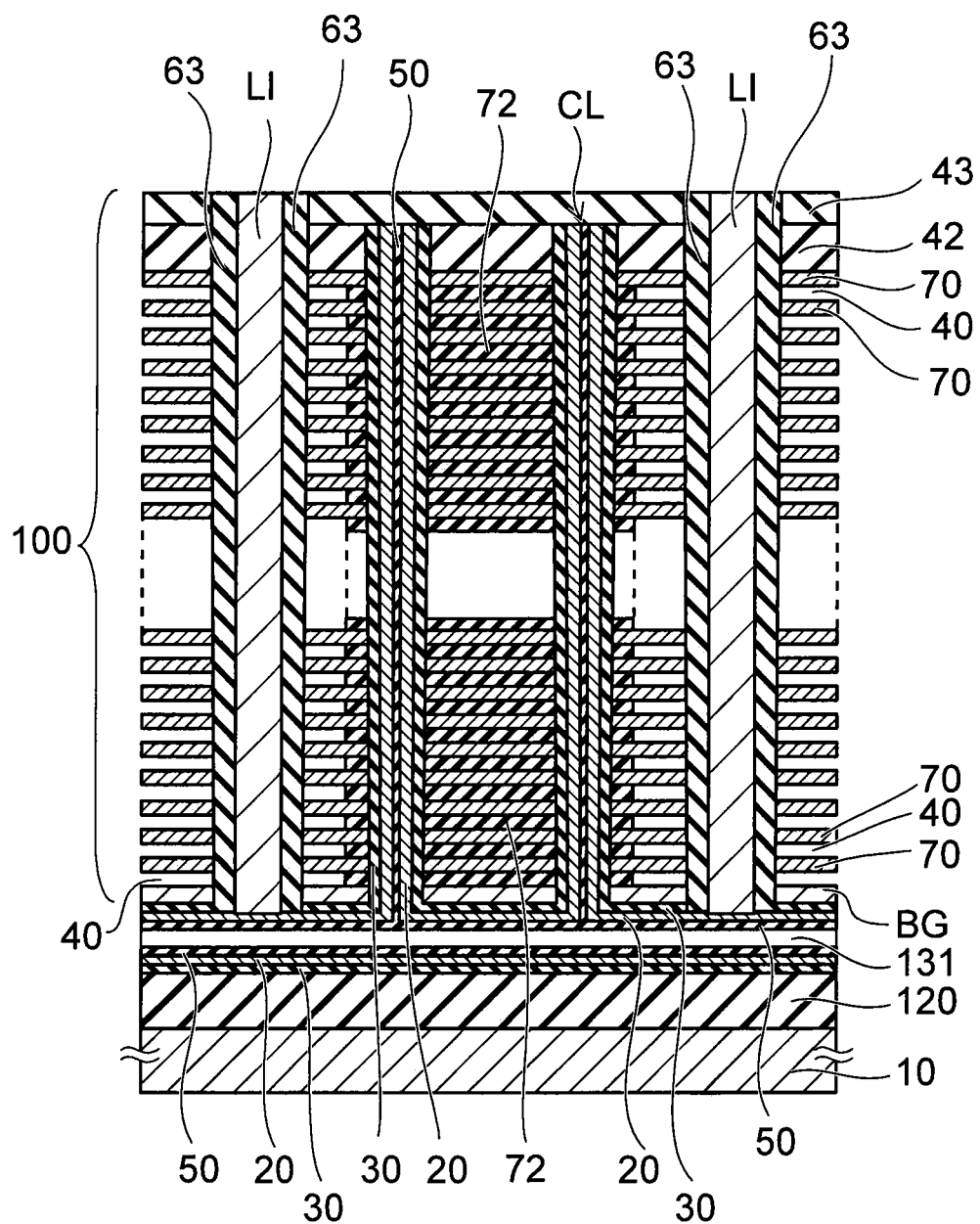
FIG. 26 is a schematic sectional view of a memory cell array of a semiconductor device of a still another embodiment.

Next, FIG. 26 is a schematic sectional view of a still another example of a memory cell array.

The memory cell array shown in FIG. 26 also includes, similarly to the embodiment described above, the substrate 10, the plurality of electrode films 70 stacked with the insulating body (the gap 40 and the insulating film 72) therebetween, the plurality of columnar portions CL, and the plurality of interconnect portions LI.

Further, also in this memory cell array, by leaving the insulating film 72 in a portion of area between the electrode films 70 instead of making a gap in the entire area therebetween, mechanical strength can be imparted to the stacked body 100.

A back gate BG is provided below the lowermost electrode film 70. The insulating body (the gap 40 and the insulating film 72) is provided between the lowermost electrode film 70 and the back gate BG. The back gate BG is a conducting or semiconducting film, and is, for example, a silicon film containing silicon as a main component.

The same stacked film as the stacked film of the columnar portion CL is provided also below the back gate BG. The memory film 30 is provided under a lower surface of the back gate BG, the semiconductor film 20 is provided in contact with a lower surface of the memory film 30, and the core film 50 is provided in contact with a lower surface of the semiconductor film 20.

The memory film 30 of the columnar portion CL and the memory film 30 provided under the lower surface of the back gate BG are continuously provided integrally together. The semiconductor film 20 of the columnar portion CL and the semiconductor film 20 provided under the lower surface of the back gate BG are continuously provided integrally together. The core film 50 of the columnar portion CL and the core film 50 provided under the lower surface of the back gate BG are continuously provided integrally together.

An insulating layer 120 is provided on the substrate 10, and the same stacked film as the stacked film of the columnar portion CL is provided also on an upper surface of the insulating layer 120. The memory film 30 is provided on the upper surface of the insulating layer 120, the semiconductor film 20 is provided on the memory film 30, and the core film 50 is provided on the semiconductor film 20.

A cavity portion 131 is provided between the core film 50 on the insulating layer 120 and the core film 50 provided under the lower surface of the back gate BG.

The lower end of the interconnect portion LI is in contact with the semiconductor film 20 provided under the lower surface of the back gate BG. Hence, the semiconductor film (a first semiconductor film) 20 of the columnar portion CL can be electrically connected with the interconnect portion LI through the semiconductor film (a second semiconductor film) 20 provided under the lower surface of the back gate BG.

By controlling a potential applied to the back gate BG, a channel is induced in the semiconductor film (the second semiconductor film) 20 provided under the lower surface of the back gate BG, so that a current can be caused to flow between the semiconductor film (the first semiconductor film) 20 of the columnar portion CL and the interconnect portion LI. The memory film 30 provided between the back gate BG and the second semiconductor film 20 and in contact with the back gate BG and the second semiconductor film 20 functions as a gate insulating film.

Next, with reference to FIG. 27 to FIG. 32, a method for forming the memory cell array shown in FIG. 26 will be described.

Figure 27:
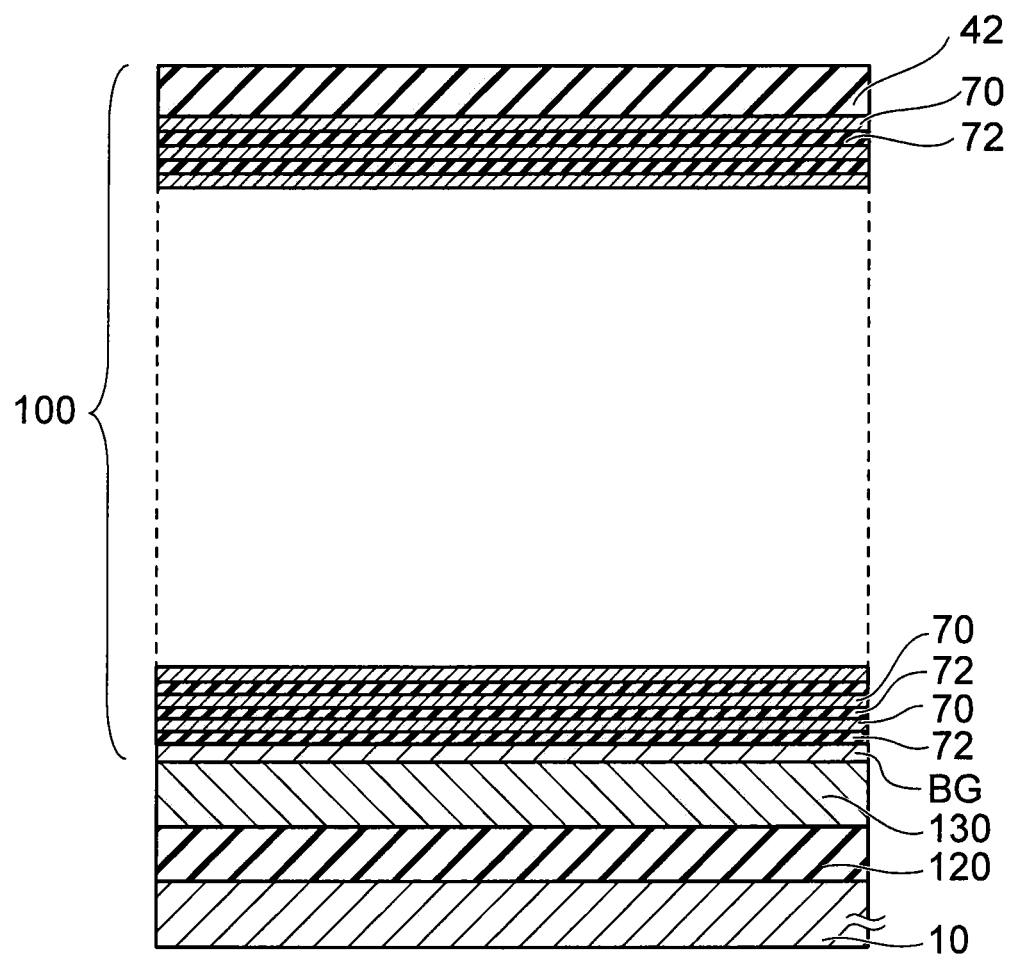
FIGS. 27 to 32 are schematic sectional views showing a method for manufacturing the semiconductor device of the embodiment.

As shown in FIG. 27, the insulating layer 120 is formed on the substrate 10, and a sacrifice layer 130 is formed on the insulating layer 120. For example, the insulating layer 120 is a silicon oxide film, and the sacrifice layer 130 is a silicon nitride film.

The back gate BG is formed on the sacrifice layer 130, and the insulating films 72 and the electrode films 70 are alternately stacked on the back gate BG. The back gate BG is, for example, a silicon film containing silicon as a main component.

The lowermost insulating film 72 is formed on an upper surface of the back gate BG. The process of alternately stacking the insulating film 72 and the electrode film 70 is repeated, so that the plurality of insulating films 72 and the plurality of electrode films 70 are formed on the substrate 10. For example, the insulating film 72 is a silicon oxide film, and the electrode film 70 is a tungsten film.

The insulating film 42 is formed on the uppermost electrode film 70. The uppermost electrode film 70 is formed between the uppermost insulating film 72 and the insulating film 42.

Similarly to the embodiment, the insulating film 42 is a metal oxide film, a silicon carbide film (SiC film), or a silicon carbonitride film (SiCN film).

Figure 28:
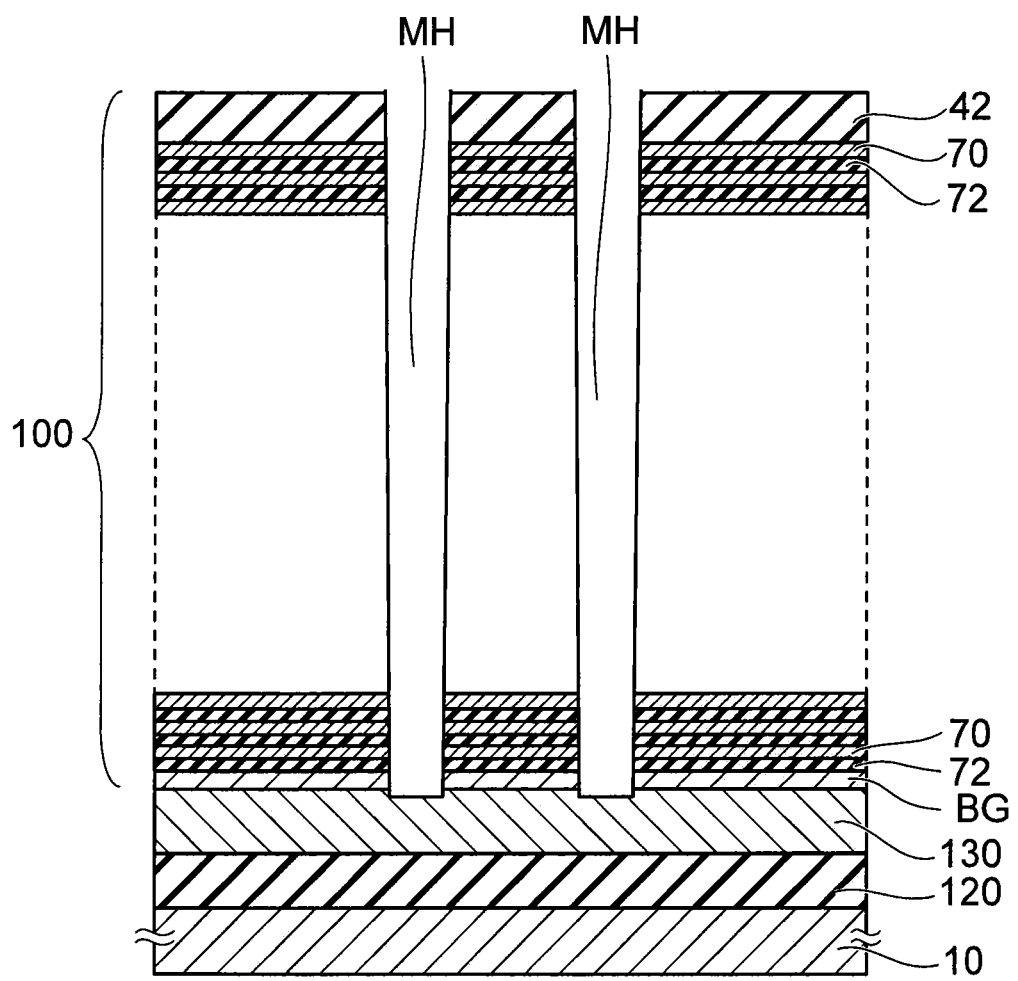

Next, as shown in FIG. 28, the plurality of memory holes MH is made in the stacked body 100 including the back gate BG, the plurality of insulating films 72, the plurality of electrode films 70, and the insulating film 42. The memory hole MH is made by a RIE method using a mask (not shown). The memory hole MH pierces the stacked body 100 to reach the sacrifice layer 130.

Figure 29:
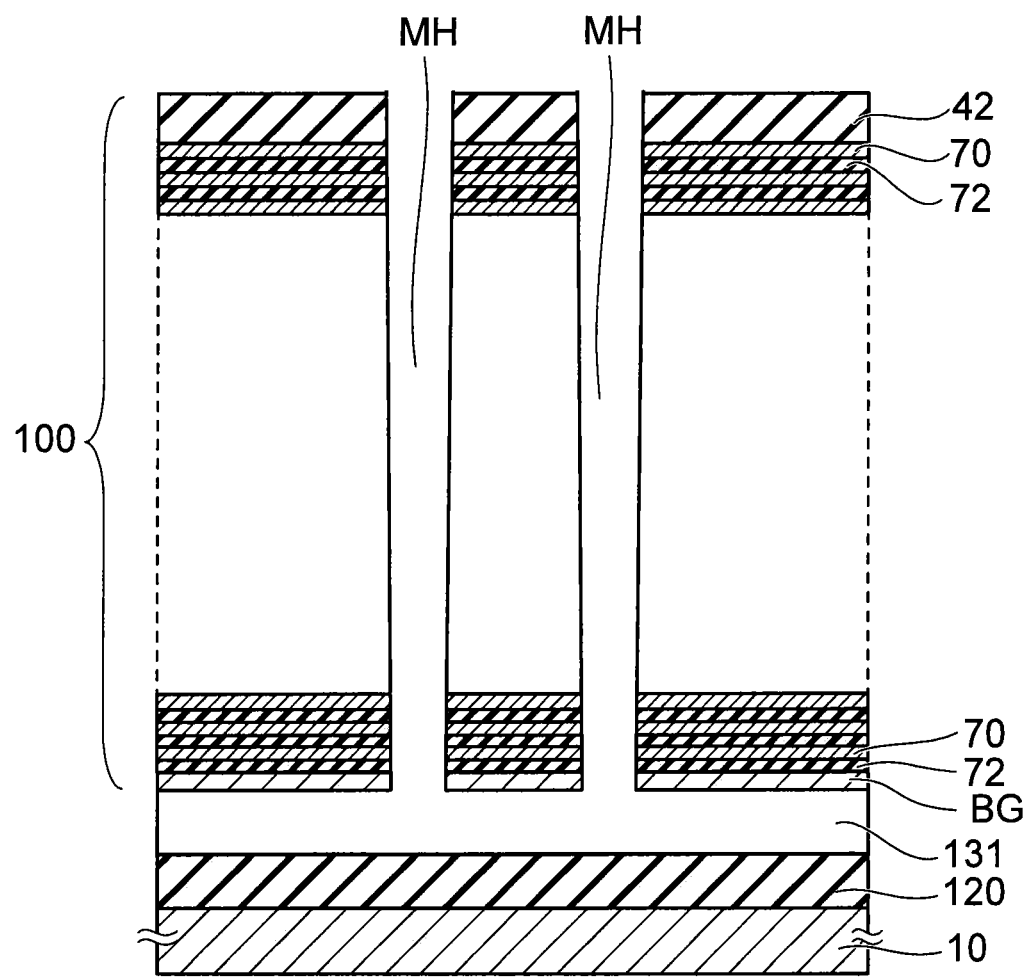

Next, the sacrifice layer 130 is removed with an etchant or etching gas supplied through the memory holes MH. With the removal of the sacrifice layer 130, the cavity 131 is made between the back gate BG and the insulating layer 120 as shown in FIG. 29.

For example, the sacrifice layer 130 which is a silicon nitride film, can be removed with an etchant containing phosphoric acid.

The etching selectivity of the sacrifice layer 130 with respect to the insulating layer 120, the back gate BG, the electrode film 70, the insulating film 72, and the insulating film 42 is sufficiently high. That is, the insulating layer 120, the back gate BG, the electrode film 70, the insulating film 72, and the insulating film 42 have high etching resistance to phosphoric acid, and are left without being etched.

Figure 30:
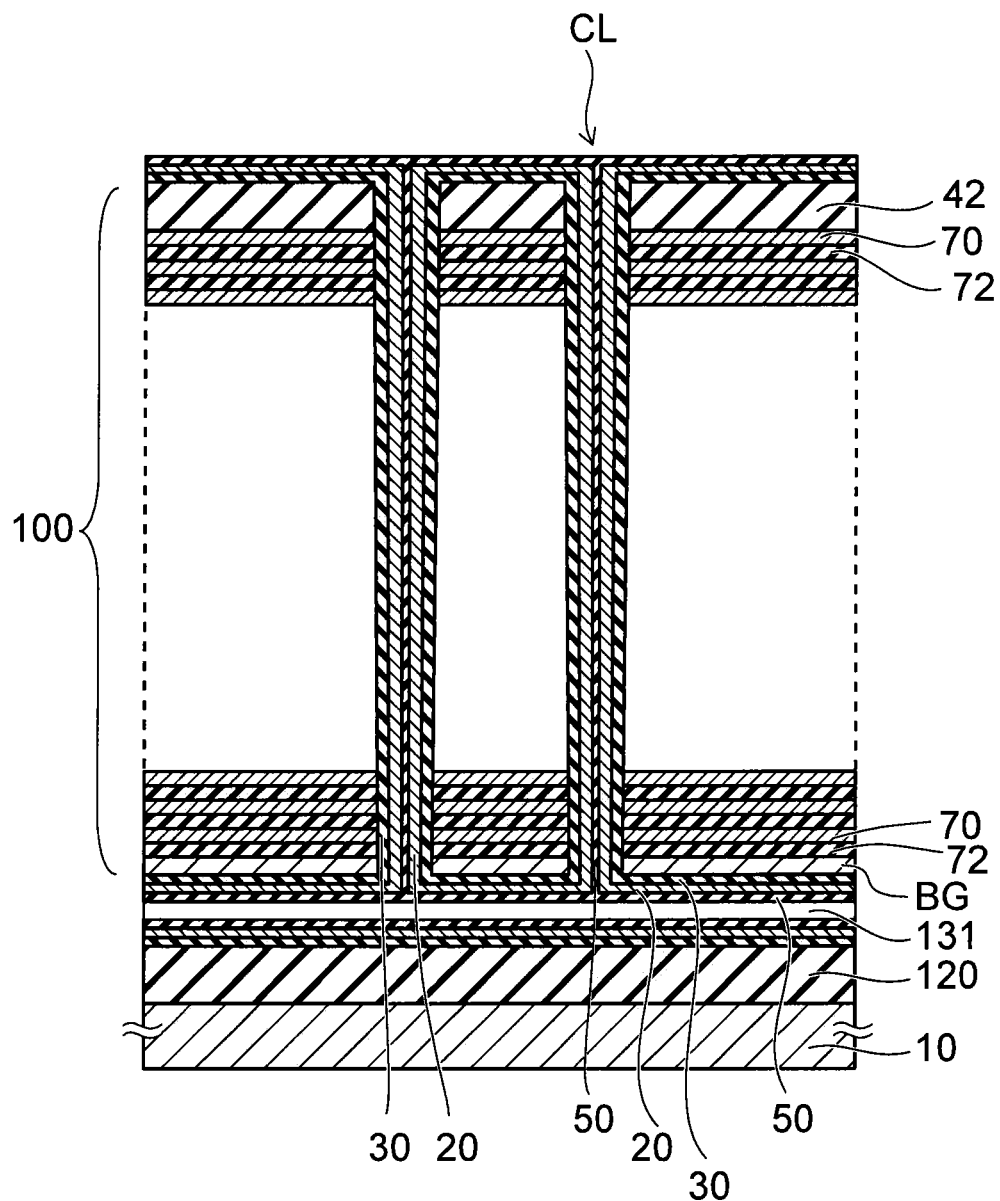

As shown in FIG. 30, the stacked film included in the columnar portion CL is formed on a side surface of the memory hole MH and an upper surface and a lower surface of the cavity 131. The upper surface of the cavity 131 is the lower surface of the back gate BG. The lower surface of the cavity 131 is the upper surface of the insulating layer 120. First, the memory film 30 is continuously formed integrally on the side surface of the memory hole MH and under the lower surface of the back gate BG. At this time, the memory film 30 is also deposited on the upper surface of the insulating layer 120. The semiconductor film 20 and the core film 50 are successively formed inside the memory film 30.

The cavity 131 is left between the stacked film provided under the lower surface of the back gate BG and the stacked film provided on the upper surface of the insulating layer 120. Alternatively, the cavity 131 may be filled with the stacked film.

Figure 31:
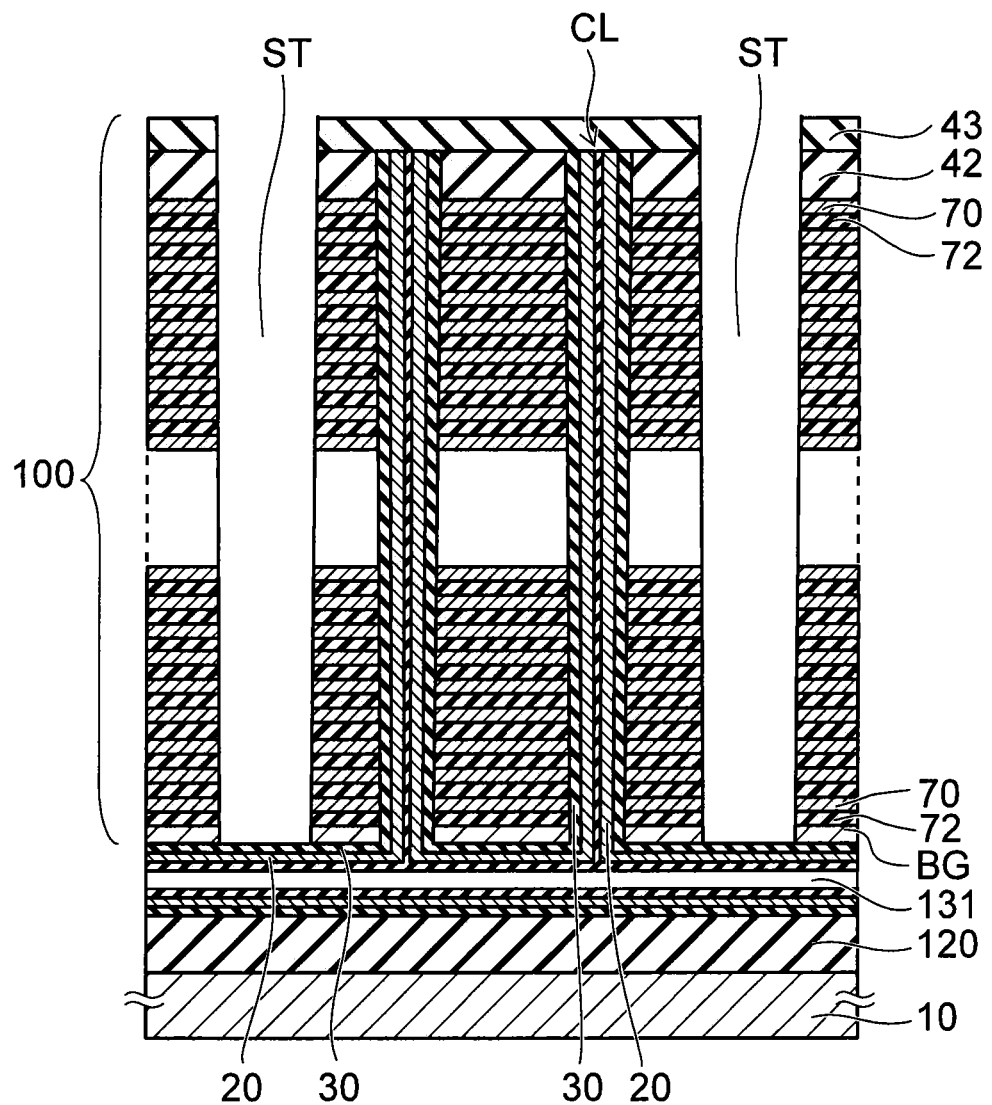

The films deposited on the insulating film 42 shown in FIG. 30 are removed by CMP or etch-back. Thereafter, as shown in FIG. 31, the insulating film 43 is formed on the insulating film 42. The insulating film 43 covers upper ends of the stacked films being included in the columnar portions CL.

Similarly to the above-mentioned embodiments, the insulating film 43 is a metal oxide film, a silicon carbide film (SiC film), or a silicon carbonitride film (SiCN film).

Then, the plurality of slits ST is made by a RIE method using a mask (not shown) in the stacked body 100 including the insulating films 43 and 42, the electrode film 70, the insulating film 72, and the back gate BG. The slit ST pierces the stacked body 100 to reach the memory film 30 provided on the lower surface of the back gate BG.

Figure 32:
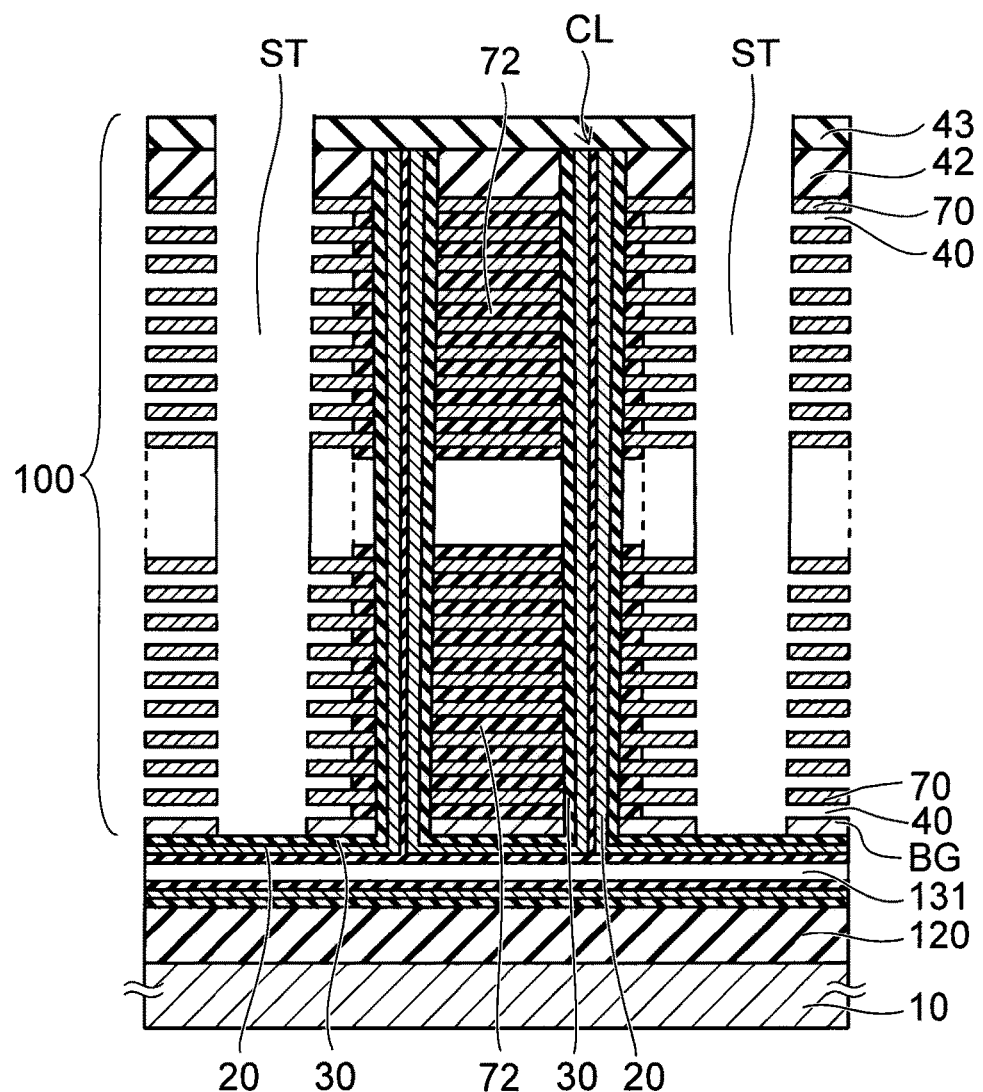

The insulating film 72 is etched with an etchant supplied through the slit ST. As shown in FIG. 32, for example, the gap 40 is made between the electrode films 70 in a region on a lateral side of the slit ST while leaving the insulating film 72 between the electrode films 70 in a region surrounding the columnar portion CL.

For example, the insulating film 72 which is a silicon oxide film is removed with an etchant containing hydrofluoric acid.

The etching selectivity of the insulating film 72 with respect to the electrode film 70, the insulating films 42 and 43, and the back gate BG is sufficiently high. That is, the electrode film 70, the insulating films 42 and 43, and the back gate BG have high etching resistance to hydrofluoric acid, and are left without being etched.

Further, a block film 35 provided at the outermost circumference of the columnar portion CL is covered by the left insulating film 72, and therefore is protected from hydrofluoric acid.

The uppermost surface of the memory film 30 on the bottom of the slit ST is the block film 35 (metal oxide film), and therefore, etching of the memory film 30 on the bottom of the slit ST due to hydrofluoric acid is suppressed.

The plurality of electrode films 70 stacked with the gaps 40 therebetween is supported by the columnar portion CL and the insulating films 72 therearound.

After the gaps 40 are made, the insulating film 63 shown in FIG. 26 is formed on the side surface and the bottom of the slit ST. The insulating film 63 with low coverage closes openings of the gaps 40 on the slit ST side. The gaps 40 are not filled with the insulating film 63.

The insulating film 63 and the memory film 30 deposited on the bottom of the slit ST are removed by a RIE method to expose the semiconductor film 20 at the bottom of the slit ST. Then, the interconnect portion LI is buried in the slit ST. The lower end of the interconnect portion LI is in contact with the semiconductor film 20 below the back gate BG.

Figure 33:
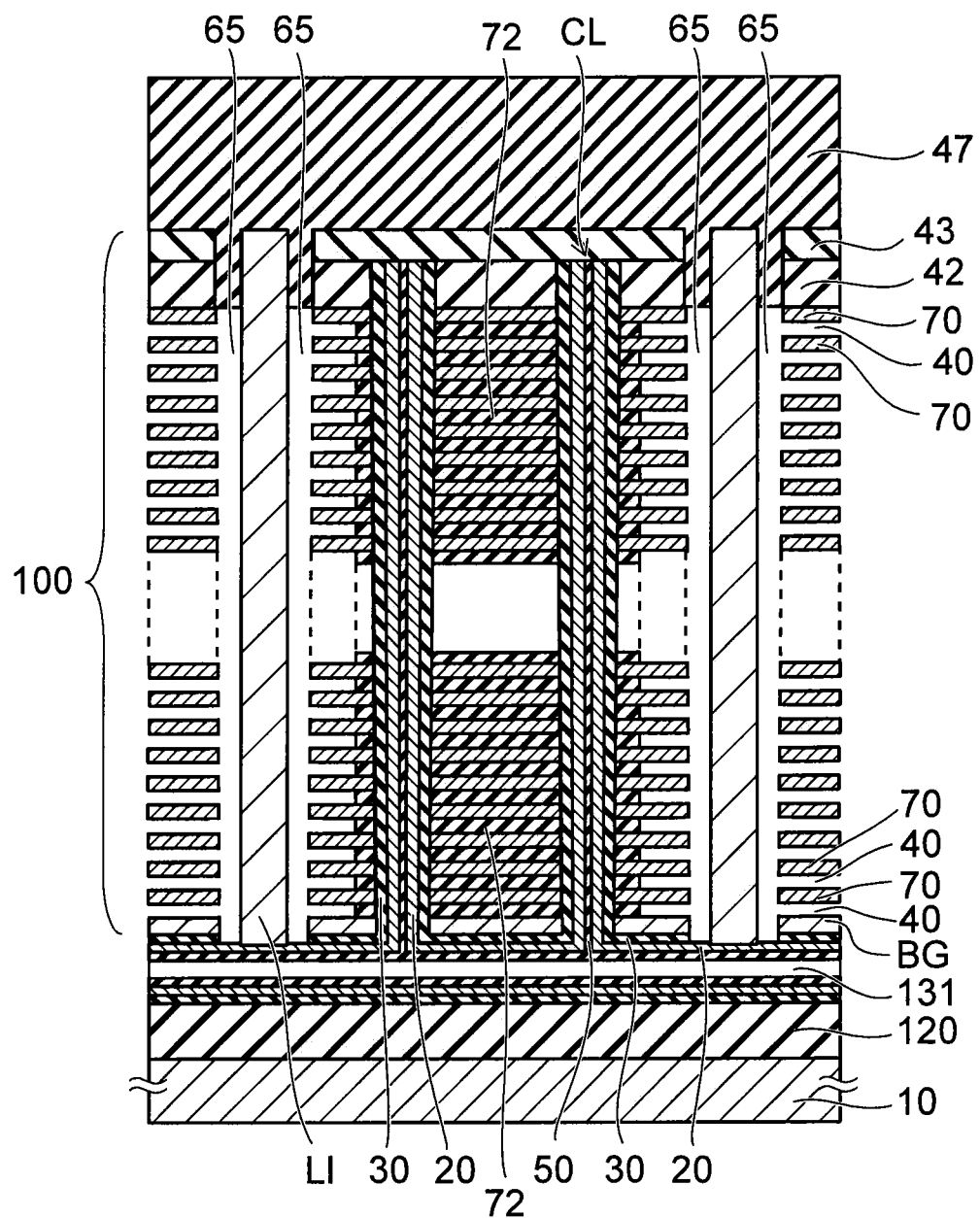
FIG. 33 is a schematic cross-sectional view of a memory cell array of a semiconductor device of a still another embodiment.

FIG. 33 is a schematic sectional view showing still another example of a memory cell array of the embodiment.

In the memory cell array shown in FIG. 33, gaps are each provided also between the side surface of the interconnect portion LI and the stacked body 100. The slits 65 extending in the stacking direction and in a depth direction of this paper (the X-direction in FIG. 1) are each formed between the side surface of the interconnect portion LI and the stacked body 100. The slit 65 is in communication with the gaps 40.

Further, also in this memory cell array, by leaving the insulating film 72 in a portion of area between the electrode film 70 instead of making a gap in the entire area therebetween, mechanical strength can be imparted to the stacked body 100.

The insulating film 47 is provided on the insulating film 43, and a portion of the insulating film 47 closes the upper end of the slit 65. By forming, for example, a silicon oxide film with low coverage as the insulating film 47, the slits 65 are prevented from being filled with the insulating film 47.

The edge portions of the electrode films 70 vertically adjacent to each other on the interconnect portion LI side are not connected to each other through the surface of the insulating film. Therefore, it is possible to prevent a short circuit between the electrode films 70 due to migration occurring on the surface of the insulating film.

The other elements are the same as those of the above-described memory cell array shown in FIG. 26, and therefore, the detailed description thereof is omitted.

Next, with reference to FIG. 34A to FIG. 38B, a method for forming the memory cell array shown in FIG. 33 will be described.

The processes shown in FIGS. 27 to 31 are carried out similarly to the embodiment described above. After the process in FIG. 31, the sacrifice film 64 shown in FIG. 34B is formed on the side surface and the bottom of the slit ST.

The sacrifice film 64 and the memory film 30 deposited on the bottom of the slit ST are removed by a RIE method to expose the semiconductor film 20 at the bottom of the slit ST. Then, the interconnect portion LI is buried in the slit ST. The lower end of the interconnect portion LI is in contact with the semiconductor film 20 below the back gate BG. The sacrifice film 64 is formed on the side surface of the interconnect portion LI.

The sacrifice film 64 is, for example, a BSG film or a silicon nitride film. Alternatively, the sacrifice film 64 is a stacked film of a silicon oxide film formed on the side surface of the interconnect portion LI and a silicon nitride film formed on a side surface of the silicon oxide film.

Figure 34A:
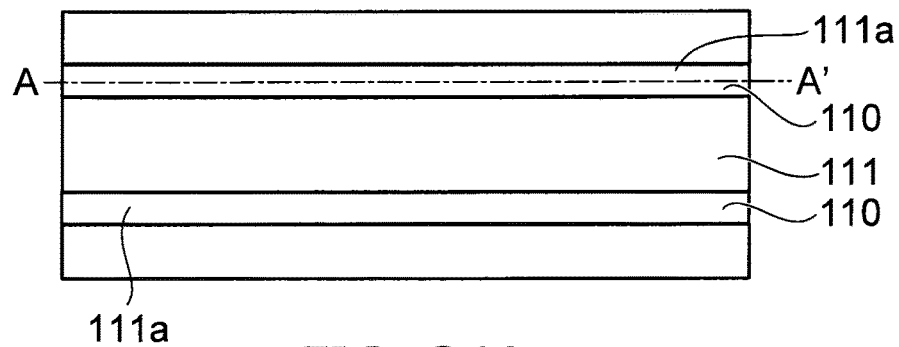
FIGS. 34A to 38B are schematic sectional views showing a method for manufacturing the semiconductor device of the embodiment.
Figure 34B:
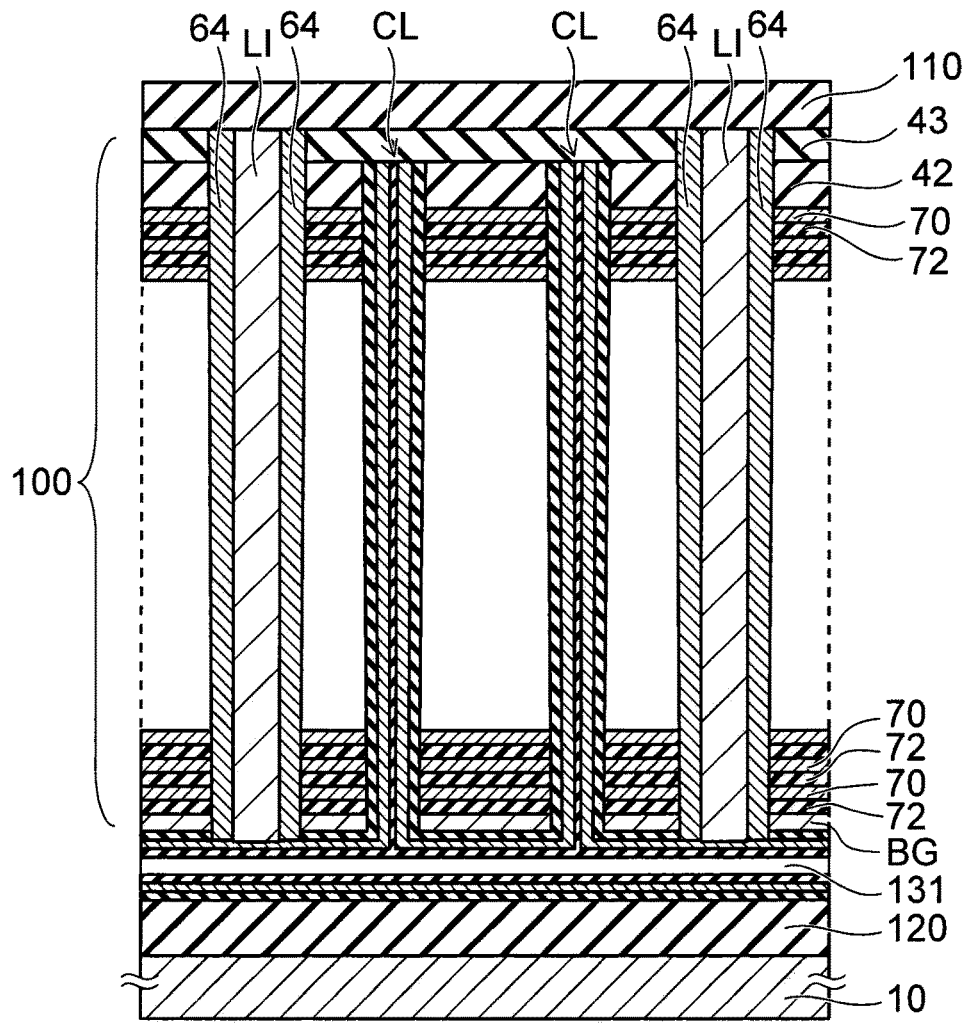

As shown in FIG. 34B, the cover film 110 is formed on the upper surface of the stacked body 100. The cover film 110 covers the upper ends of the interconnect portions LI and the upper ends of the sacrifice films 64. The upper ends of the interconnect portions LI and the upper ends of the sacrifice films 64 are in contact with the cover film 110.

The cover film 110 is a metal oxide film, a silicon carbide film (SiC film), or a silicon carbonitride film (SiCN film). The metal oxide film used for the cover film 110 contains, for example, at least any of tantalum oxide (TaO), zirconium oxide (ZrO), and hafnium oxide (HfO).

As shown in FIG. 34A, the resist film 111 is formed on the cover film 110. The slits 111a are selectively formed in the resist film 111, and a portion of the cover film 110 is exposed at the bottom of the slit 111a.

FIG. 34B is sectional view taken along the line A-A' in FIG. 34A.

The slit 111a extends in the direction (the Y-direction in FIG. 1) crossing the extending direction (the X-direction in FIG. 1) of the interconnect portion LI.

Figure 35A:
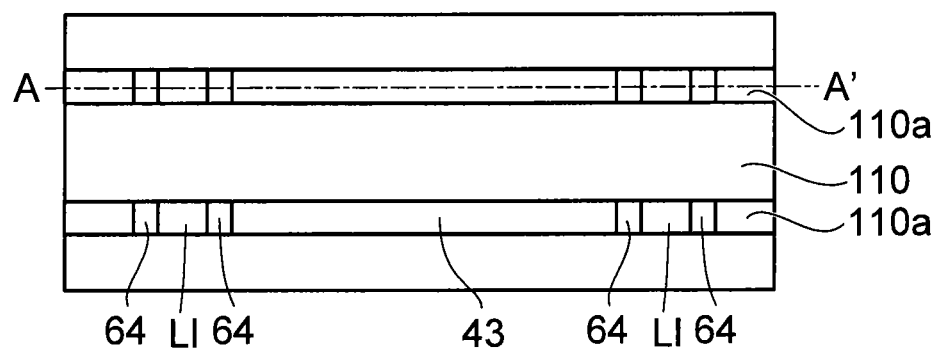

As shown in FIG. 35A, the slits 110a are made in the cover film 110 by etching using the resist film 111 as a mask.

Figure 35B:
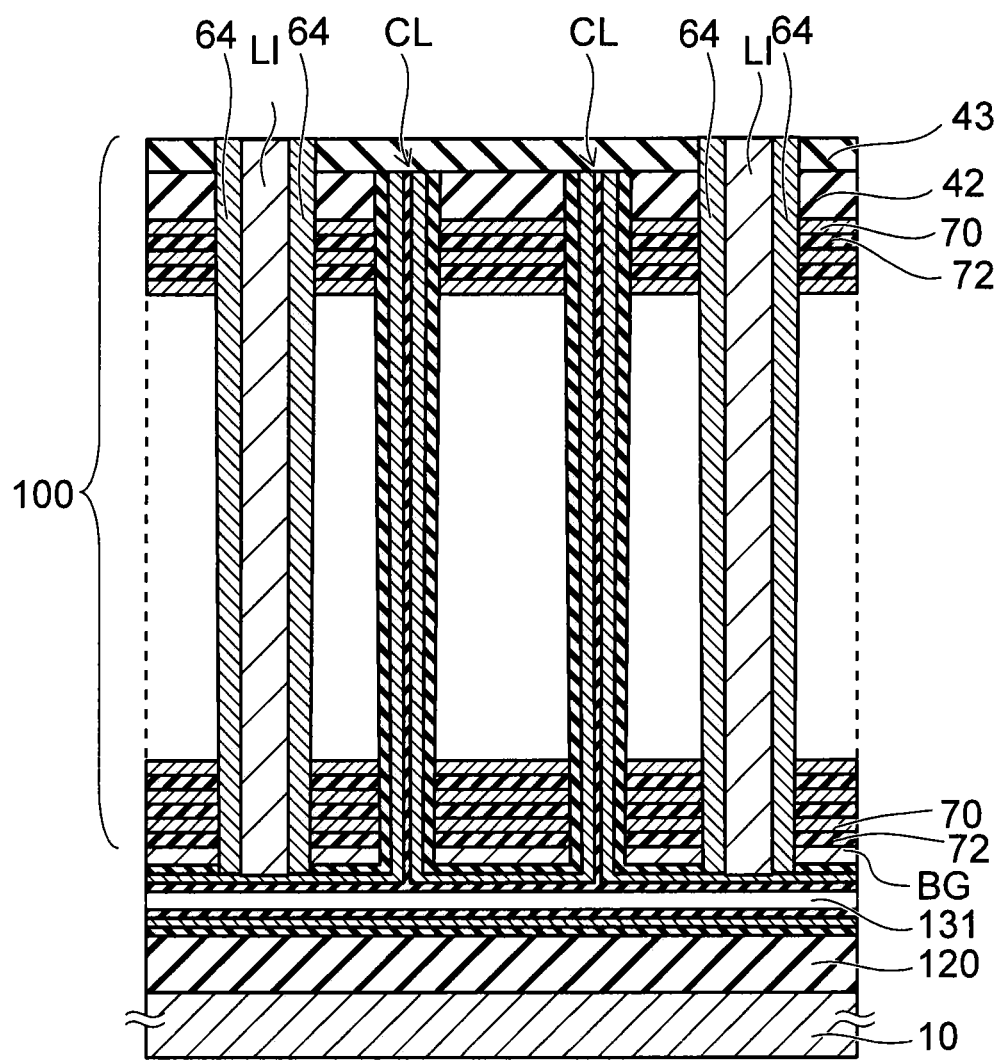

FIG. 35B is a sectional view taken along the line A-A' in FIG. 35A.

The slit 110a extends in the direction (the Y-direction in FIG. 1) crossing the extending direction (the X-direction in FIG. 1) of the interconnect portion LI. The plurality of slits 110a is aligned separately from each other in the extending direction of the interconnect portion LI. Portions of the interconnect portions LI and portions of the sacrifice films 64 are exposed at the bottom of the slit 110a. Then, the sacrifice films 64 are removed by etching. Etching with an etchant proceeds from the upper end of the sacrifice film 64 exposed in the slit 110a.

When the sacrifice film 64 is a silicon nitride film, the silicon nitride film can be removed with an etchant containing phosphoric acid. When the sacrifice film 64 is a silicon oxide film or a BSG film, the film can be removed with an etchant containing hydrofluoric acid.

The etching selectivity of the sacrifice film 64 with respect to the interconnect portion LI, the electrode film 70, the insulating films 42 and 43, the cover film 110, the back gate BG, and the semiconductor film 20 on the bottom of the slit ST is sufficiently high. That is, the interconnect portion LI, the electrode film 70, the insulating films 42 and 43, the cover film 110, the back gate BG, and the semiconductor film 20 on the bottom of the slit ST have high etching resistance to phosphoric acid and hydrofluoric acid, and are left without being etched.

Figure 36A:
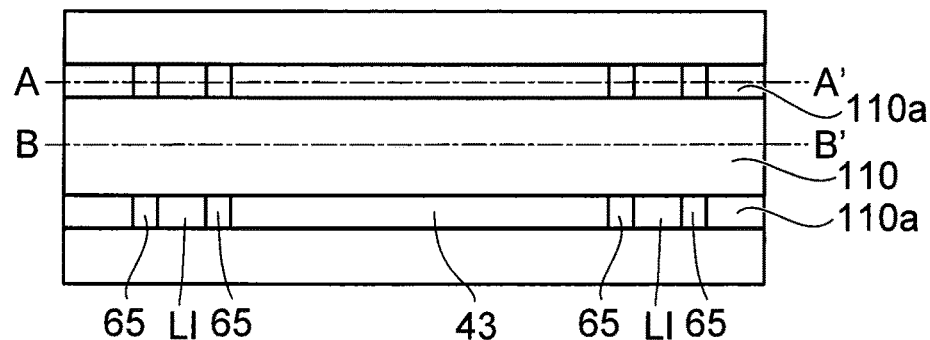
Figure 36B:
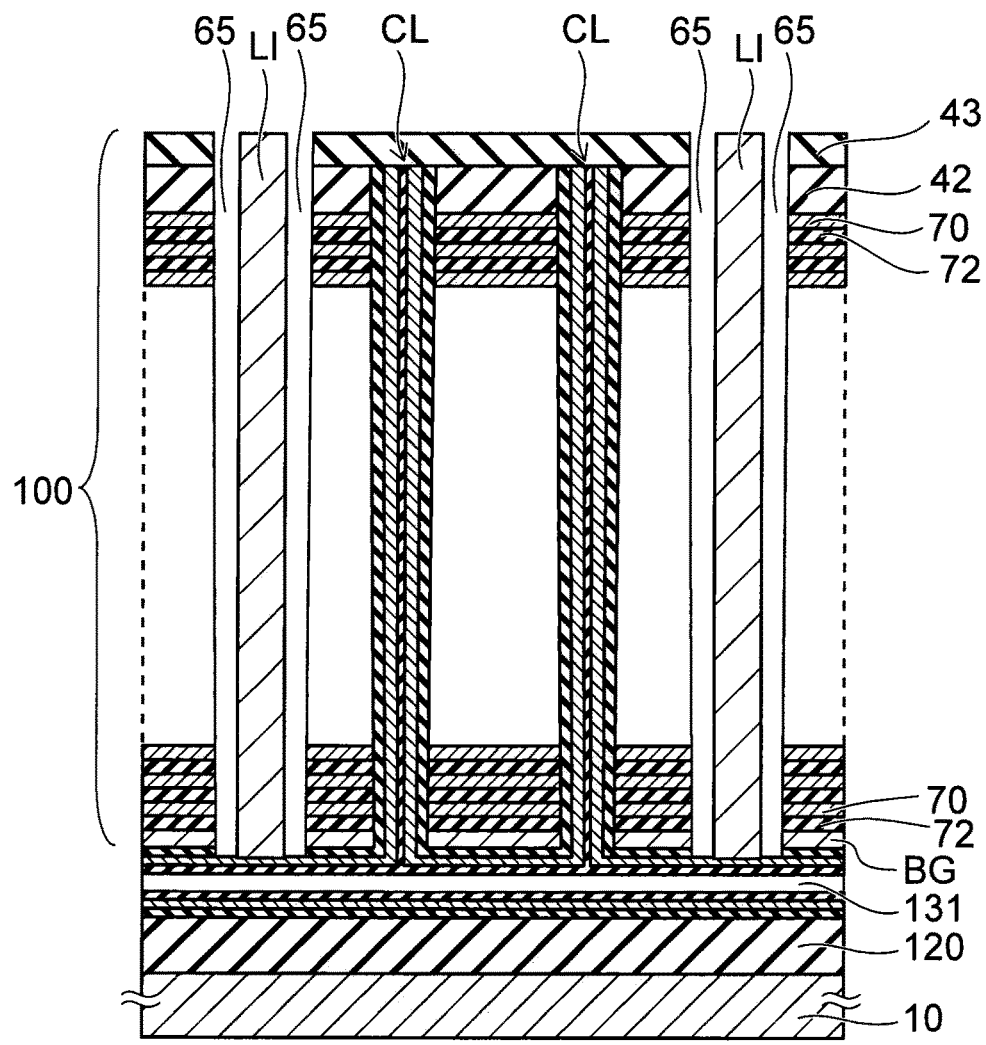

The sacrifice films 64 are removed, so that the slits 65 are each made between the side surface of the interconnect portion LI and the stacked body 100 as shown in FIG. 36B.

FIG. 36B is a sectional view taken along the line A-A' in FIG. 36A, showing a cross-section of the stacked body 100 below the slit 110a where the cover film 110 is absent.

Figure 37:
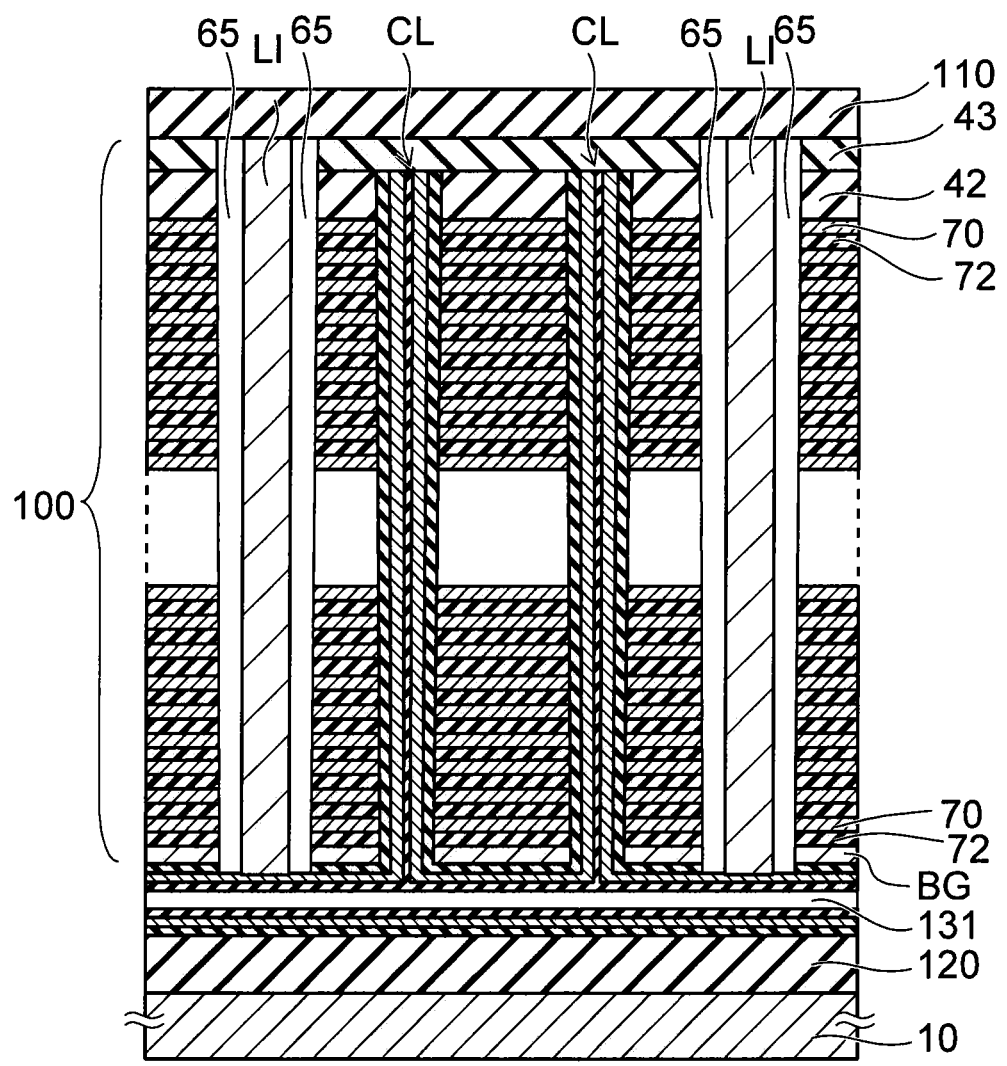

FIG. 37 is a sectional view taken along the line B-B' in FIG. 36A, showing a cross-section of the stacked body 100 in the area covered with the cover film 110.

Etching proceeds in the depth direction from the side of the upper end of the sacrifice film 64 exposed in the slit 110a in the cover film 110, and at the same time, the erosion of the sacrifice film 64 due to an etchant proceeds also in the extending direction (the X-direction) of the interconnect portion LI.

As shown in FIGS. 36A and 37, a portion of the upper surface of the interconnect portion LI is in contact with the cover film 110 that is selectively left. Although the interconnect portion LI loses support from the stacked body 100 due to making the slit 65, the upper end and the lower end of the interconnect portion LI are supported by the cover film 110 and the stacked film below the back gate BG, respectively, and thus the interconnect portion LI does not collapse.

When the insulating film 72 between the electrode films 70 is made of the same material as the sacrifice film 64 on the side surface of the interconnect portion LI, the insulating film 72 can be successively removed in etching of the sacrifice film 64. In this case, there is a concern that an upper portion of the columnar portion CL is exposed to an etchant for a long time and thus etched. By changing the time for etching the sacrifice film 64, the insulating film 72 between the electrode films 70 can be left around the columnar portion CL.

The insulating film 72 between the electrode films 70 can be etched with an etchant supplied through the slit 65 after the slit 65 is formed. By etching the insulating film 72, as shown in FIG. 38B, the gap 40 communicating with the slit 65 is made between the electrode films 70 in a region on a lateral side of the interconnect portion LI while leaving the insulating film 72 between the electrode films 70 in a region surrounding the columnar portion CL.

Figure 38A:
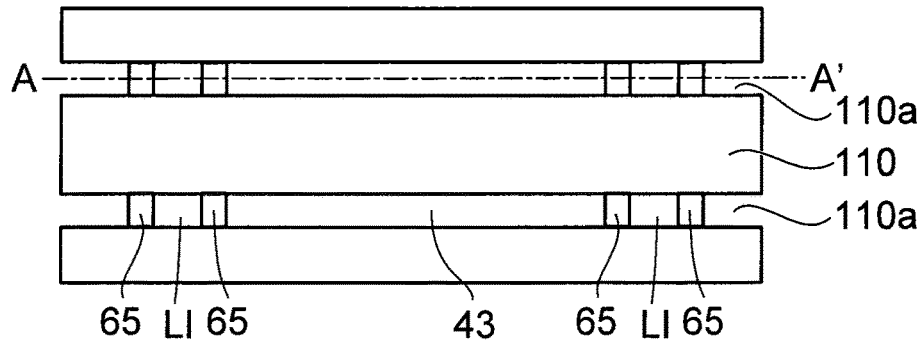
Figure 38B:
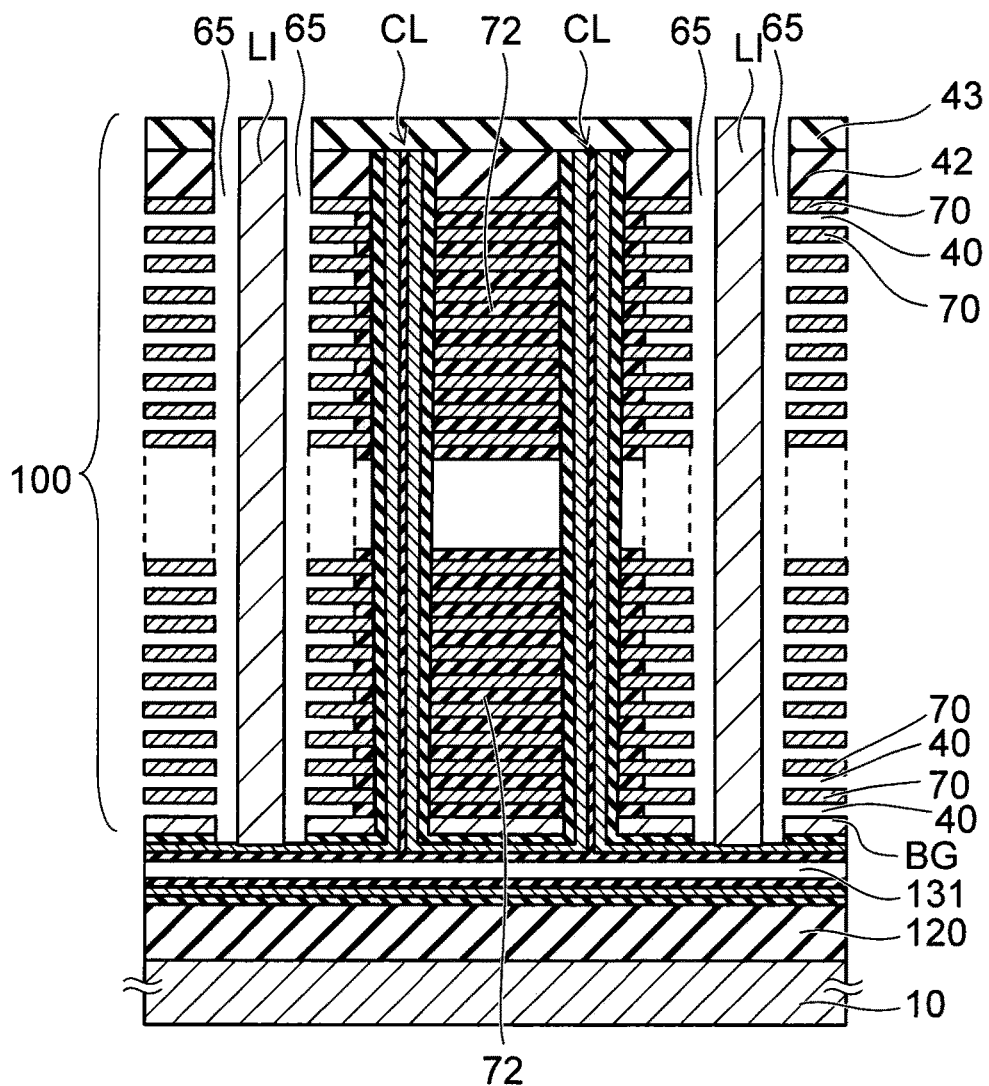

FIG. 38B is a sectional view taken along the line A-A' in FIG. 38A.

For example, the insulating film 72 which is a silicon oxide film is etched with an etchant containing hydrofluoric acid. The cover film 110, the electrode film 70, the insulating films 42 and 43, the back gate BG, and the semiconductor film 20 on the bottom of the slit 65 are left without being etched.

After the gaps 40 are made, the insulating film 47 with low coverage is formed on the cover film 110 and on the insulating film 43 as shown in FIG. 35, and the upper end of the slit 65 is closed by a portion of the insulating film 47.

Figure 39:
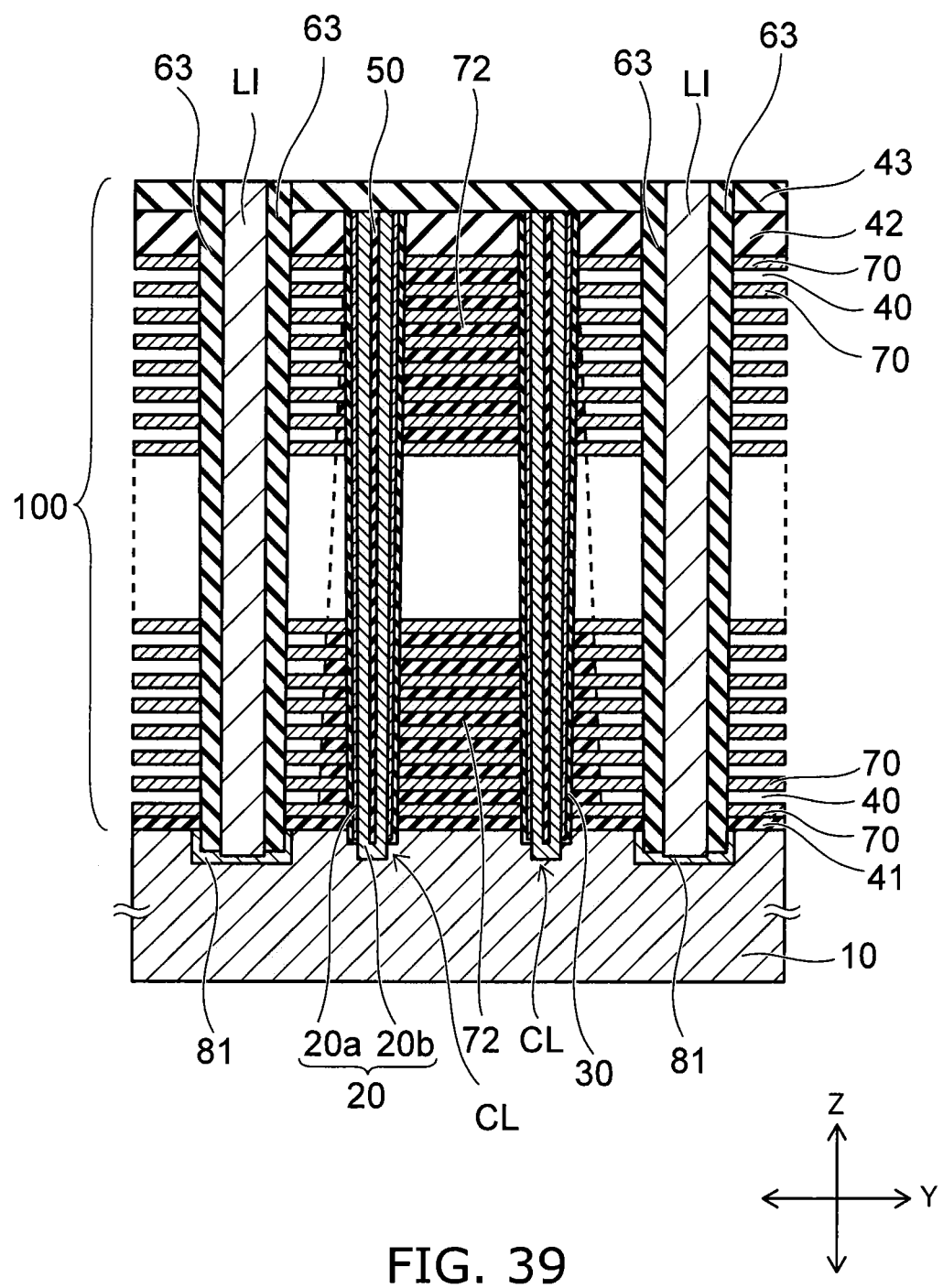
FIGS. 39 to 42 are schematic sectional views of a memory cell array of a semiconductor device of a still another embodiment.

Next, FIG. 39 is a schematic sectional view showing still another example of the memory cell array.

As described above, an insulating film 72 is etched through a slit ST (or 65). An etchant enters into the slit ST (or 65) from an upper end opening of the slit ST (or 65). Due to this, etching is started from the insulating film 72 on an upper layer side, and the insulating film 72 on the upper layer side is exposed to the etchant for a longer time than the insulating film 72 on a lower layer side. Therefore, by appropriately controlling the etching time, a recessing amount in the Y-direction of the insulating film 72 on the upper layer side is larger than a recessing amount in the Y-direction of the insulating film 72 on the lower layer side.

That is, as shown in FIG. 39, a width in the Y-direction of an upper layer portion of the insulating film 72 is smaller than a width in the Y-direction of a lower layer portion of the insulating film 72. In other words, an area ratio (or a volume ratio) of the gap 40 to the insulating film 72 on the upper layer side is higher than an area ratio (a volume ratio) of the gap 40 to the insulating film 72 on the lower layer side.

The upper layer portion of the insulating film 72 is provided adjacent to an upper portion of the columnar portion CL or surrounding the upper portion of the columnar portion CL. The lower layer portion of the insulating film 72 is provided adjacent to a lower portion of the columnar portion CL or surrounding the lower portion of the columnar portion CL.

A diameter of the upper portion of the columnar portion CL is smaller than a diameter of the lower portion of the columnar portion CL. A diameter of the columnar portion CL can also be represented by a width in the Y-direction of the columnar portion CL in a Y-Z cross section shown in FIG. 39.

Figure 43A:
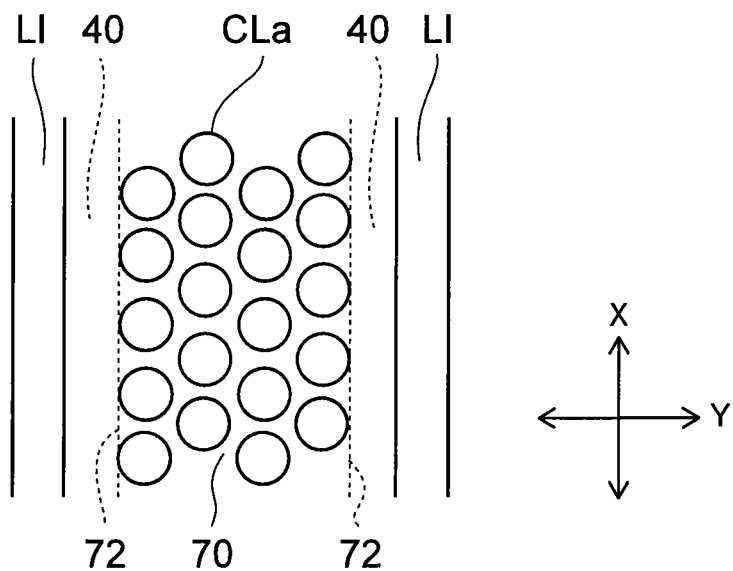
FIG. 43A is a schematic plan view of a stacked body on an upper layer side of the embodiment.

FIG. 43A is a schematic plan view of an upper portion CLa of the columnar portion CL, and an upper layer portion of the electrode film 70 surrounding the upper portion CLa.

Figure 43B:
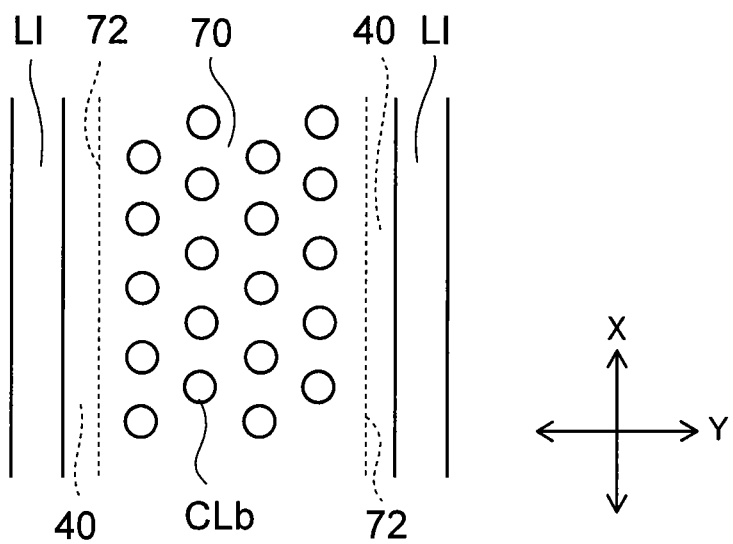
FIG. 43B is a schematic plan view of stacked body on an lower layer side of the embodiment.

FIG. 43B is a schematic plan view of a lower portion CLb of the columnar portion CL, and a lower layer portion of the electrode film 70 surrounding the lower portion CLb.

In FIGS. 43A and 43B, the insulating film 72 between the electrode films 70 is also shown by a broken line.

An area of the electrode film 70 in a region where the plurality of upper portions CLa having a large diameter in the columnar portions CL is disposed is smaller than an area of the electrode film 70 in a region where the plurality of lower portions CLb having a small diameter in the columnar portions CL is disposed. That is, a resistance of the upper layer portion of the electrode film 70 is higher than a resistance of the lower layer portion of the electrode film 70.

On the other hand, a width in the Y-direction of the insulating film 72 on the upper layer side is smaller than a width in the Y-direction of the insulating film 72 on the lower layer side. In other words, an area (volume) of the gap 40 between the electrode films 70 on the upper layer side is larger than an area (volume) of the gap 40 between the electrode films 70 on the lower layer side. Therefore, an interconnect capacitance on the upper layer side is lower than an interconnect capacitance on the lower layer side.

In this manner, an interconnect resistance on the upper layer side is higher than an interconnect resistance on the lower layer side, and an interconnect capacitance on the upper layer side is lower than an interconnect capacitance on the lower layer side. Therefore, the fluctuation of RC characteristics between the upper layer side and the lower layer side can be reduced.

Figure 40:
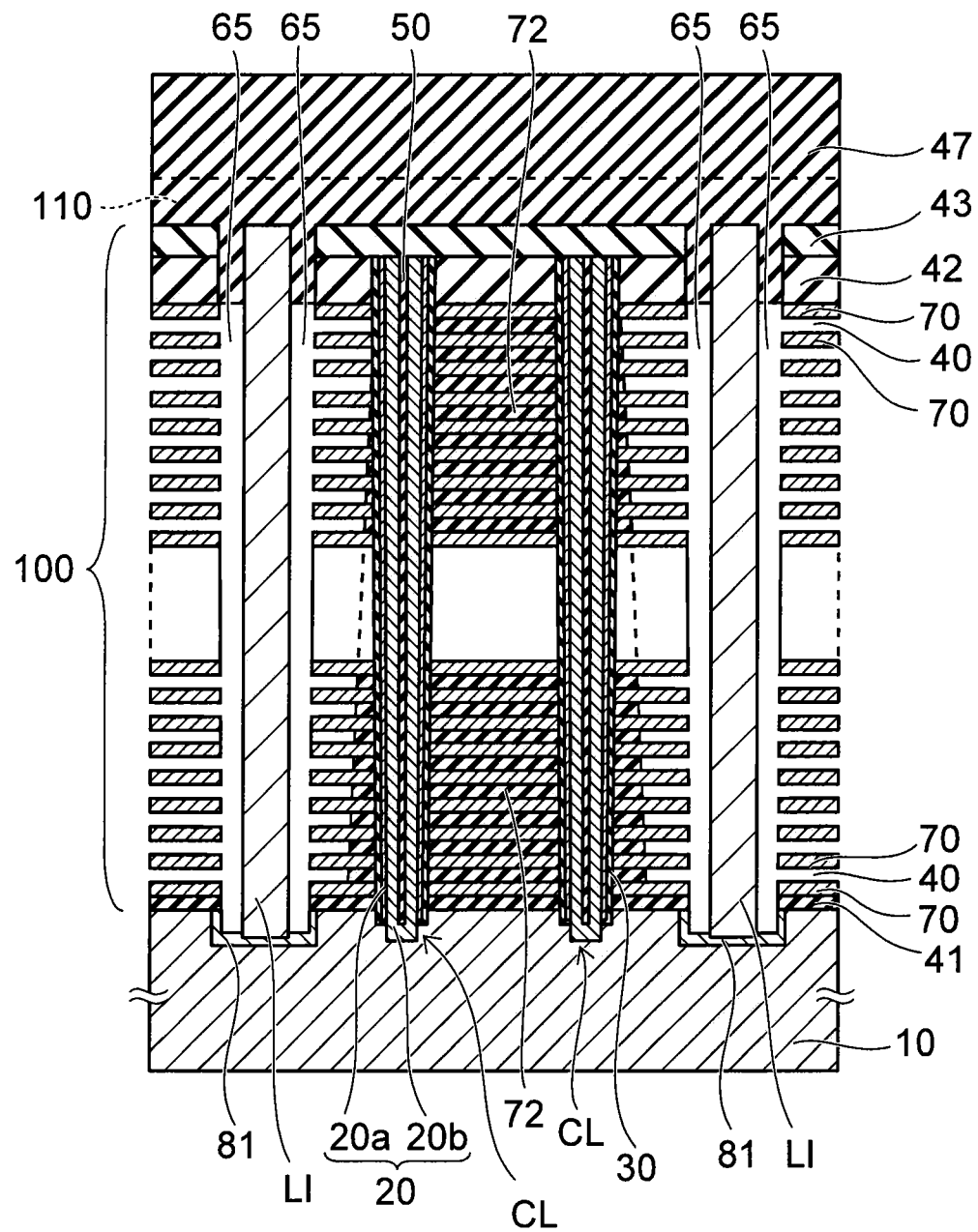

FIG. 40 shows an example in which in the structure shown in FIG. 18 described above, the width in the Y-direction of the upper layer portion of the insulating film 72 is made smaller than the width in the Y-direction of the lower layer portion of the insulating film 72.

Figure 41:
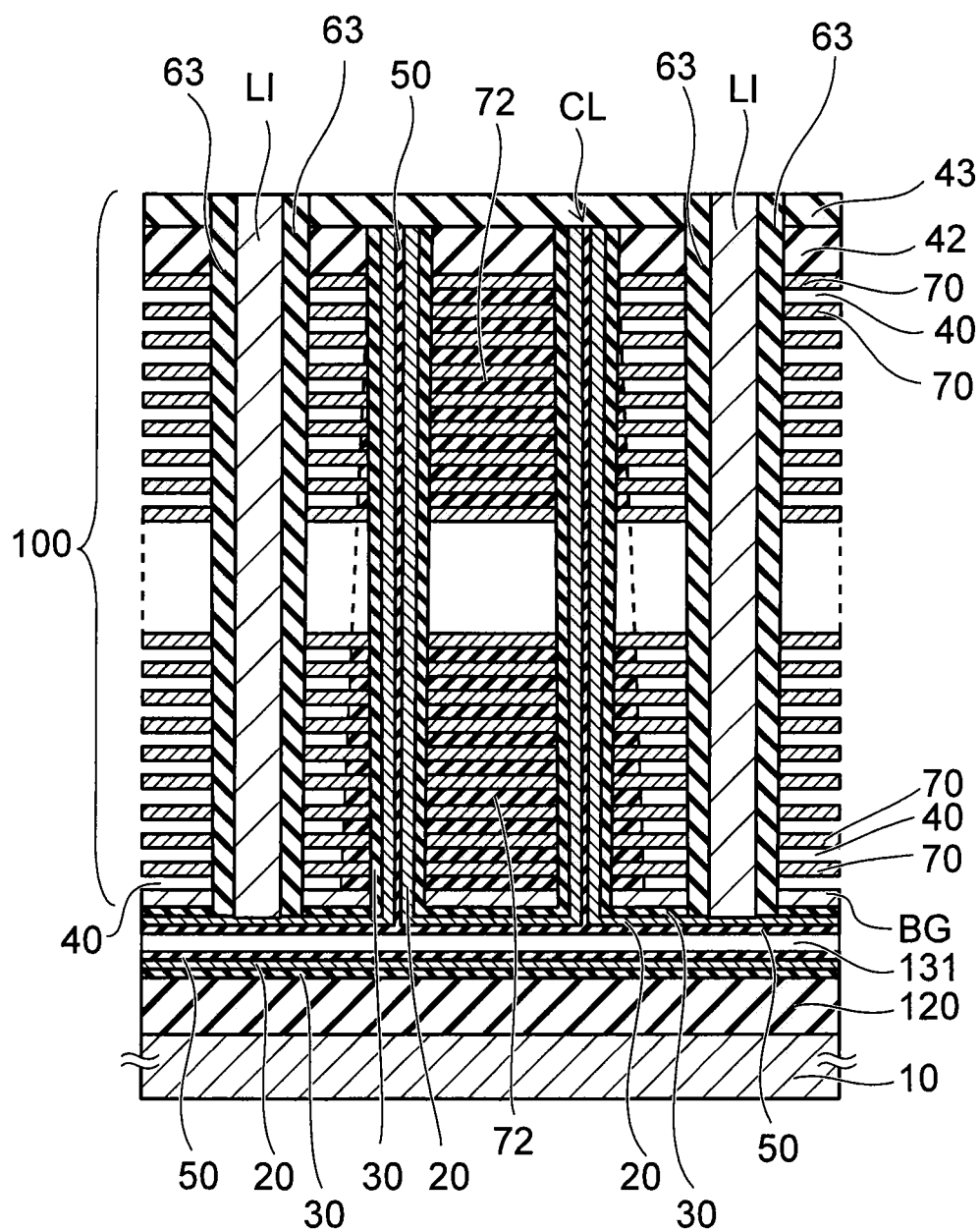

FIG. 41 shows an example in which in the structure shown in FIG. 26 described above, the width in the Y-direction of the upper layer portion of the insulating film 72 is made smaller than the width in the Y-direction of the lower layer portion of the insulating film 72.

Figure 42:
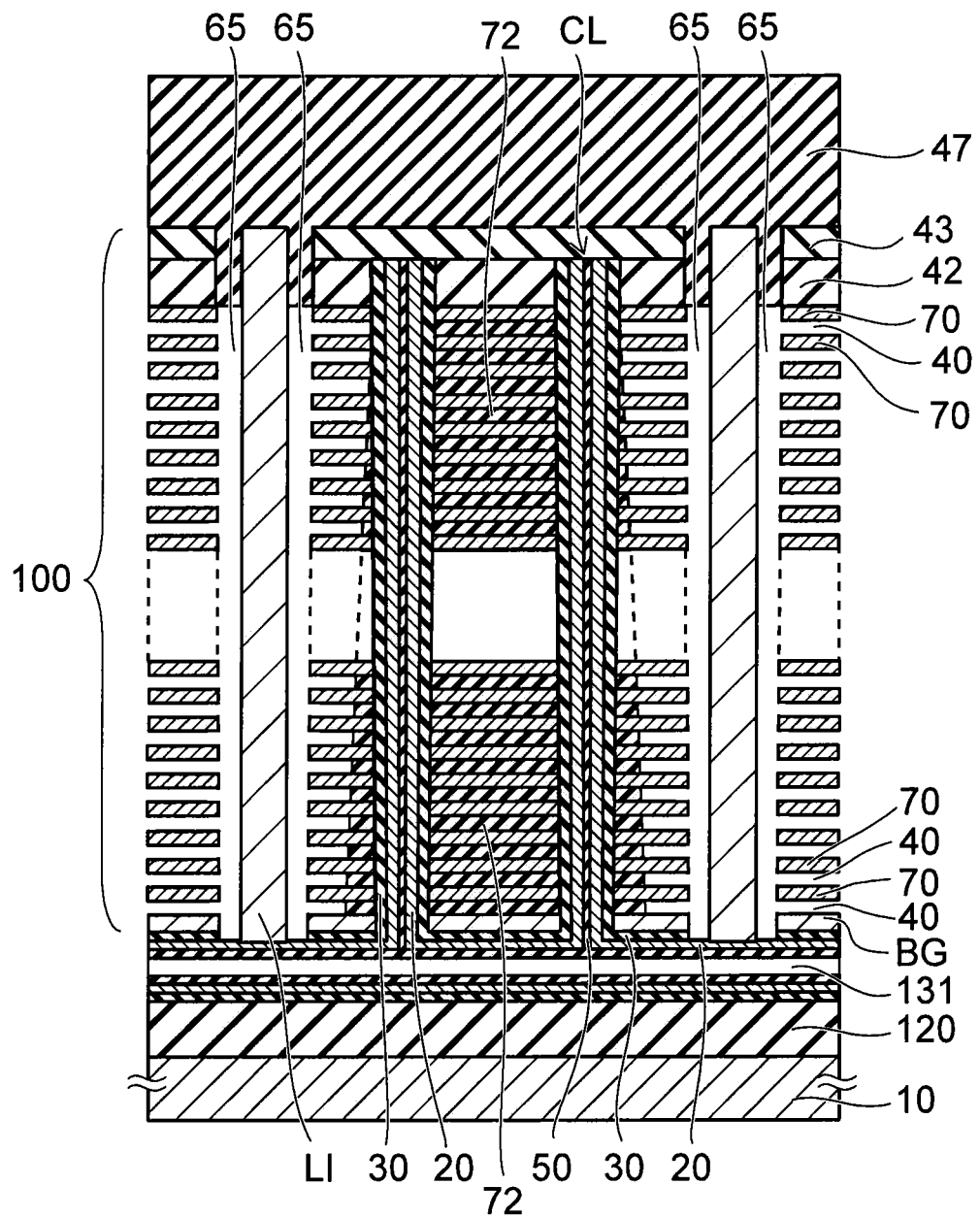

FIG. 42 shows an example in which in the structure shown in FIG. 33 described above, the width in the Y-direction of the upper layer portion of the insulating film 72 is made smaller than the width in the Y-direction of the lower layer portion of the insulating film 72.

Figure 44:
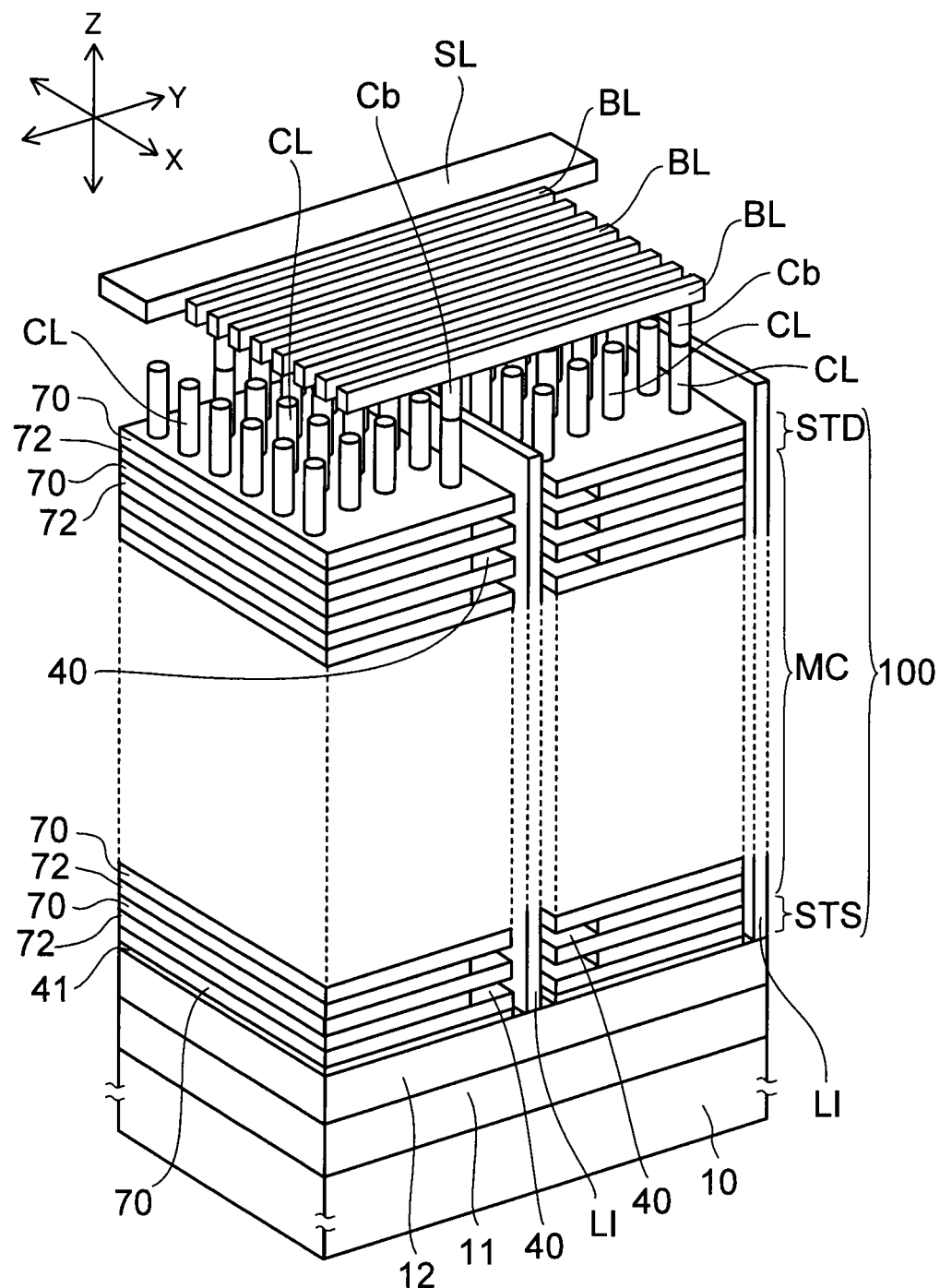
FIG. 44 is a schematic sectional view of a memory cell array of a semiconductor device of another embodiment.

FIG. 44 is a schematic perspective view of a memory cell array of a semiconductor device of another embodiment.

In the memory cell array having the structure shown in FIG. 1 or 18 described above, an intermediate layer may be provided between the substrate 10 and the stacked body 100.

In the example shown in FIG. 44, a first intermediate layer 11 is provided on the substrate 10, and a second intermediate layer 12 is provided on the first intermediate layer 11, and the stacked body 100 is provided on the second intermediate layer 12.

The second intermediate layer 12 is a conductive layer or a semiconductor layer. A lower end of an interconnect portion LI and a lower end of a semiconductor film 20 of the columnar portion CL are connected to the second intermediate layer 12.

The first intermediate layer 11 includes an insulating layer, an interconnect layer, a circuit device such as a transistor which forms a control circuit for controlling a memory cell array, and the like.

In FIG. 44, the source layer SL above the stacked body 100, the interconnect portion LI, and the insulating film 41 may not be formed.

Figure 45:
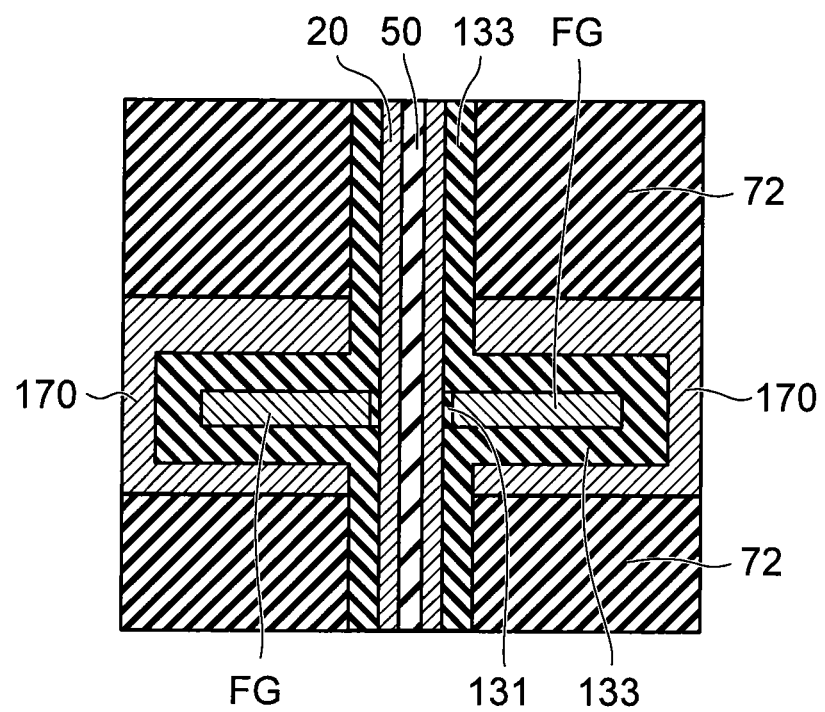
FIG. 45 is a schematic sectional view of a memory cell of a semiconductor device of another embodiment.

FIG. 45 is a schematic cross-sectional view of a memory cell of a semiconductor device of another embodiment.

A charge storage film of the memory cell is not limited to a charge trapping film having an electron trap site in an insulating film, and may be a floating gate. The floating gate is a conductor or semiconductor which is surrounded by an insulating body and is not electrically connected anywhere.

As illustrated in FIG. 45, on a lateral side of a side surface of a semiconductor film 20, a floating gate FG is provided. Between the side surface of the semiconductor film 20 and the floating gate FG, a tunnel insulating film 131 is provided.

One memory cell includes one floating gate FG separated from a floating gate FG of another memory cell in the stacking direction.

An upper surface, a lower surface, and a side surface of the floating gate FG face an electrode film 170 through a block insulating film 133. The electrode film 170 is a component corresponding to the electrode film 70 of the above-mentioned embodiments, and functions as a control gate of the memory cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a substrate;
a stacked body provided on the substrate, the stacked body including a plurality of electrode films stacked with an insulator interposed between the electrode films;
a plurality of dividing portions extending in a stacking direction of the stacked body, dividing the stacked body in a first direction crossing the stacking direction, and separated from each other in the first direction; and
a plurality of columnar portions including a semiconductor film extending in the stacking direction in the stacked body, and a charge storage film provided between the semiconductor film and one of the electrode films, the plurality of columnar portions being disposed between the plurality of dividing portions,
the insulator including a first insulating film provided between the electrode films in a region surrounding the columnar portions, and an air gap provided between the electrode films in a region on a lateral side in the first direction of one of the dividing portions, and the electrode films and the first insulating film provided in the region surrounding the columnar portions and spreading in a second direction crossing the first direction without being separated by an air gap.

2. The device according to claim 1, wherein
the columnar portions include upper portions and lower portions having smaller diameters than diameters of the upper portions, the first insulating film includes an upper layer portion adjacent to the upper portions of the columnar portions and a lower layer portion adjacent to the lower portions of the columnar portions, and a width in the first direction of the upper layer portion of the first insulating film is smaller than a width in the first direction of the lower layer portion of the first insulating film.

3. The device according to claim 1, further comprising:
a second insulating film provided between a lowermost electrode film of the electrode films and the substrate, and being a metal oxide film, a silicon carbide film, or a silicon carbonitride film; and a third insulating film provided on an uppermost electrode film of the electrode films, and being a metal oxide film, a silicon carbide film, or a silicon carbonitride film.

4. The device according to claim 3, wherein the metal oxide film contains at least any of tantalum oxide, zirconium oxide, and hafnium oxide.

5. The device according to claim 3, wherein an etching rate of the second insulating film and the third insulating film with phosphoric acid is $1/30$ or less of an etching rate of a silicon nitride film with phosphoric acid.

6. The device according to claim 3, wherein an etching rate of the second insulating film and the third insulating film with hydrofluoric acid is $1/30$ or less of an etching rate of a silicon oxide film with hydrofluoric acid.

7. The device according to claim 1, wherein
a lower end of the semiconductor film is in contact with the substrate,
the dividing portions include interconnect portions, and lower ends of the interconnect portions are in contact with the substrate.

8. The device according to claim 1, wherein
the dividing portions include interconnect portions, and a slit communicating with the air gap and extending in the stacking direction is provided between side surfaces of the interconnect portions and the stacked body.

9. The device according to claim 1, wherein
the dividing portions include interconnect portions, and a fourth insulating film is provided between one of side surfaces of the interconnect portions and the stacked body.

10. The device according to claim 1, further comprising:
a back gate provided between a lowermost electrode film of the electrode films and the substrate;
a second semiconductor film provided below the back gate; and a fifth insulating film provided between the back gate and the second semiconductor film, wherein
the dividing portions include interconnect portions, and the second semiconductor film is connected to the semiconductor film and the interconnect portions.

11. The device according to claim 1, wherein the first insulating film covers side surfaces of the columnar portions.

12. A semiconductor device, comprising:
a substrate;
a stacked body provided on the substrate, the stacked body including a plurality of electrode films stacked with an insulator interposed between the electrode films; and
a columnar portion including a semiconductor film extending in a stacking direction of the stacked body in the stacked body, and a charge storage film provided between the semiconductor film and one of the electrode films,
the insulator including
a first insulating film provided between the electrode films in a region surrounding the columnar portion, and
an air gap provided between the electrode films in a region adjacent to the first insulating film in a first direction crossing the stacking direction,
the columnar portion including
an upper portion, and
a lower portion having a smaller diameter than a diameter of the upper portion,
the first insulating film including
an upper layer portion adjacent to the upper portion of the columnar portion, and
a lower layer portion adjacent to the lower portion of the columnar portion, the lower layer portion having a larger width in the first direction than a width in the first direction of the upper layer portion, and
the electrode films and the first insulating film provided in the region surrounding the columnar portion and spreading in a second direction crossing the first direction without being separated by an air gap.

13. The device according to claim 12, further comprising:
a second insulating film provided between a lowermost electrode film of the electrode films and the substrate, and being a metal oxide film, a silicon carbide film, or a silicon carbonitride film; and
a third insulating film provided on an uppermost electrode film of the electrode films, and being a metal oxide film, a silicon carbide film, or a silicon carbonitride film.

14. The device according to claim 13, wherein the metal oxide film contains at least any of tantalum oxide, zirconium oxide, and hafnium oxide.

15. The device according to claim 13, wherein an etching rate of the second insulating film and the third insulating film with phosphoric acid is $1/30$ or less of an etching rate of a silicon nitride film with phosphoric acid.

16. The device according to claim 13, wherein an etching rate of the second insulating film and the third insulating film with hydrofluoric acid is $1/30$ or less of an etching rate of a silicon oxide film with hydrofluoric acid.

17. The device according to claim 12, wherein the first insulating film covers a side surface of the columnar portion.

* * * * *